United States Patent
Yamazaki et al.

(10) Patent No.: US 8,525,170 B2
(45) Date of Patent: Sep. 3, 2013

(54) THIN FILM TRANSISTOR AND MANUFACTURING METHOD THEREOF

(75) Inventors: Shunpei Yamazaki, Tokyo (JP); Yuji Egi, Kanagawa (JP); Shinya Sasagawa, Kanagawa (JP); Motomu Kurata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 779 days.

(21) Appl. No.: 12/423,829

(22) Filed: Apr. 15, 2009

(65) Prior Publication Data

US 2010/0096637 A1   Apr. 22, 2010

(30) Foreign Application Priority Data

Apr. 18, 2008   (JP) .................................. 2008-109629

(51) Int. Cl.
*H01L 29/04*   (2006.01)

(52) U.S. Cl.
USPC ................... 257/57; 257/59; 257/66; 257/72

(58) Field of Classification Search
USPC .......................................... 257/57, 59, 66, 72
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |
| 5,221,631 A | 6/1993 | Ikeda et al. | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,648,662 A | 7/1997 | Zhang et al. | |
| 5,677,236 A | 10/1997 | Saitoh et al. | |
| 5,701,167 A | 12/1997 | Yamazaki | |
| 5,766,989 A | 6/1998 | Maegawa et al. | |

(Continued)

FOREIGN PATENT DOCUMENTS

| EP | 0 535 979 A2 | 4/1993 |
|---|---|---|
| EP | 1 505 174 A1 | 2/2005 |

(Continued)

OTHER PUBLICATIONS

Czang-Ho Lee et al., "High-Mobility Nanocrystalline Silicon Thin-Film Transistors Fabricated by Plasma-Enhanced Chemical Vapor Deposition", Applied Physics Letters, May 24, 2005, vol. 86, pp. 222106-1-222106-3.

(Continued)

*Primary Examiner* — Long Pham

(74) *Attorney, Agent, or Firm* — Nixon Peabody LLP; Jeffrey L. Costellia

(57) ABSTRACT

Off current of a thin film transistor is reduced, and on current of the thin film transistor is increased, and variation in electric characteristics is reduced. As a structure of semiconductor layers which form a channel formation region of a thin film transistor, a first semiconductor layer including a plurality of crystalline regions is provided on a gate insulating layer side; a second semiconductor layer having an amorphous structure is provided on a source region and drain region side; an insulating layer with a thickness small enough to allow carrier travel is provided between the first semiconductor layer and the second semiconductor layer. The first semiconductor layer is in contact with the gate insulating layer. The second semiconductor layer is provided on an opposite side to a face of the first semiconductor layer which is in contact with the gate insulating layer.

14 Claims, 31 Drawing Sheets

(56) References Cited

U.S. PATENT DOCUMENTS

| | | | |
|---|---|---|---|
| 5,849,601 | A | 12/1998 | Yamazaki |
| 5,859,445 | A | 1/1999 | Yamazaki |
| 5,864,150 | A | 1/1999 | Lin |
| 5,932,302 | A | 8/1999 | Yamazaki et al. |
| 6,011,277 | A | 1/2000 | Yamazaki |
| 6,023,075 | A | 2/2000 | Yamazaki |
| 6,153,893 | A | 11/2000 | Inoue et al. |
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,468,617 | B1 | 10/2002 | Yamazaki et al. |
| 6,468,839 | B2 | 10/2002 | Inoue et al. |
| 6,737,676 | B2 | 5/2004 | Yamazaki |
| 6,756,258 | B2 | 6/2004 | Zhang et al. |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,199,846 | B2 | 4/2007 | Lim |
| 2005/0022864 | A1 | 2/2005 | Fujioka et al. |
| 2005/0115930 | A1 | 6/2005 | Tanaka et al. |
| 2007/0181945 | A1 | 8/2007 | Nakamura |
| 2009/0033818 | A1 | 2/2009 | Nakajima et al. |
| 2009/0057683 | A1 | 3/2009 | Nakajima et al. |
| 2009/0061574 | A1 | 3/2009 | Nakajima et al. |

FOREIGN PATENT DOCUMENTS

| | | | |
|---|---|---|---|
| JP | 57-071126 | | 5/1982 |
| JP | 58-092217 | | 6/1983 |
| JP | 59-072781 | | 4/1984 |
| JP | 62-062073 | | 3/1987 |
| JP | 62-062073 | | 12/1987 |
| JP | 02-053941 | | 2/1990 |
| JP | 02-053941 | B2 | 11/1990 |
| JP | 04-242724 | | 8/1992 |
| JP | 04-266019 | | 9/1992 |
| JP | 05-129608 | | 5/1993 |
| JP | 06-326312 | | 11/1994 |
| JP | 07-131030 | | 5/1995 |
| JP | 2000-277439 | | 10/2000 |
| JP | 2001-007024 | | 1/2001 |
| JP | 2001-053283 | | 2/2001 |
| JP | 2004-014958 | | 1/2004 |
| JP | 2005-049832 | | 2/2005 |
| JP | 2005-167051 | | 6/2005 |
| JP | 2005-191546 | | 7/2005 |
| JP | 2008-124392 | | 5/2008 |
| WO | WO 2004/086487 | A1 | 10/2004 |

OTHER PUBLICATIONS

Czang-Ho Lee et al., "High Mobility N-Channel and P-Channel Nanocrystalline Silicon Thin-Film Transistors", IEDM 05: Technical Digest of International Electron Devices Meeting, 2005, pp. 937-940.

Mohammad R. Esmaeili-Rad et al., "High Stability, Low Leakage Nanocrystalline Silicon Bottom Gate Thin Film Tansistors for AMOLED Display", IEEE-IEDM, 2006, pp. 303-306.

Hyun Jung Lee et al., "Leakage Current Mechanisms in Top-Gate Nanocrystalline Silicon Thin-Film Transistors", Applied Physics Letters, Feb. 28, 2008, vol. 92, pp. 083509-1-083509-3.

Czang-Ho Lee et al., "Stability of nc-Si:H TFTs With Silicon Nitride Gate Dielectric", IEEE Transactions on Electron Devices, Jan. 2007, vol. 54, No. 1, pp. 45-51.

Andrei Sazonov et al., "Low-Temperature Materials and Thin Film Transistors for Flexible Electronics", Proceeding of the IEEE, Aug. 1, 2005, vol. 93, No. 8, pp. 1420-1428.

Czang-Ho Lee et al., "Top-Gate TFTs Using 13.56 MHz PECVD Microcrystalline Silicon", IEEE Electron Device letters, Sep. 5, 2005, vol. 26, No. 9, pp. 637-639.

Czang-Ho Lee et al., "Postdeposition Thermal Annealing and Material Stability of 75° C. Hydrogenated Nanocrystalline Silicon Plasma-Enhanced Chemical Vapor Deposition Films", Journal of Applied Physics, Aug. 4, 2005, vol. 98, pp. 034305-1-034305-7.

Invitation to Pay Additional Fees (Application No. PCT/JP2009/061795; PCT11623/12200/12401),International Searching Authority dated Jul. 28, 2009.

Arai et al., 41.2: Micro Silicon Technology for Active Matrix OLED Display, SID Digest '07 : SID International Symposium Digest of Technical Papers, vol. XXXVIII, pp. 1370-1373, 2007.

Kim et al, 42.1: A Novel Four-Mask-Count Process Architecture for TFT-LCDS, SID Digest '00 : SID International Symposium Digest of Technical Papers, pp. 1006-1009, 2000.

Song et al., 34.1: Advanced Four-Mask Process Architecture for the A-SI TFT Array Manufacturing Method, SID Digest '02 : SID International Symposium Digest of Technical Papers, pp. 1038-1041, 2002.

Choi et al., P-16: Novel Four-Mask Process in the FFS TFT-LCD With Optimum Multiple-Slit Design Applied by the Use of a Gray-Tone Mask, SID Digest '05 : SID International Symposium Digest of Technical Papers, pp. 284-287, 2005.

Fujiwara et al., Stress-Induced Nucleation of Microcrystalline Silicon From Amorphous Phase, Jpn. J. Appl. Phys., 41/Part1, 2821-2828, 2002.

Kamei et al., A Significant Reduction of Impurity Contents in Hydrogenated Microcrystalline Silicon Films For Increased Grain Size and Reduced Defect Density, Jpn. J. Appl. Phys., 37/Part2, L265-L268, 1998.

Lee et al., How to Achieve High Mobility Thin Film Transistors by Direct Deposition of Silicon Using 13.56 MHz RF PECVD?, Int. Electron Devices Meeting Tech. Digest, p. 295-298, 2006.

Czhang et al., Directly Deposited Nanocrystalline Silicon Thin-Film Transistors With Ultra High Mobilities, Appl. Phys. Lett., 89, pp. 252101-1-252101-3, 2006.

Fujiwara et al., Real-time spectroscopic ellipsometry studies of the nucleation and grain growth processes in microcrystalline silicon thin films, Phys. Rev. B, 63, pp. 115306-1-115306-9, 2001.

Fujiwara et al., Microcrystalline silicon nucleation sites in the subsurface of hydrogenated amorphous silicon, Sur. Sci., 497, pp. 333-340, 2002.

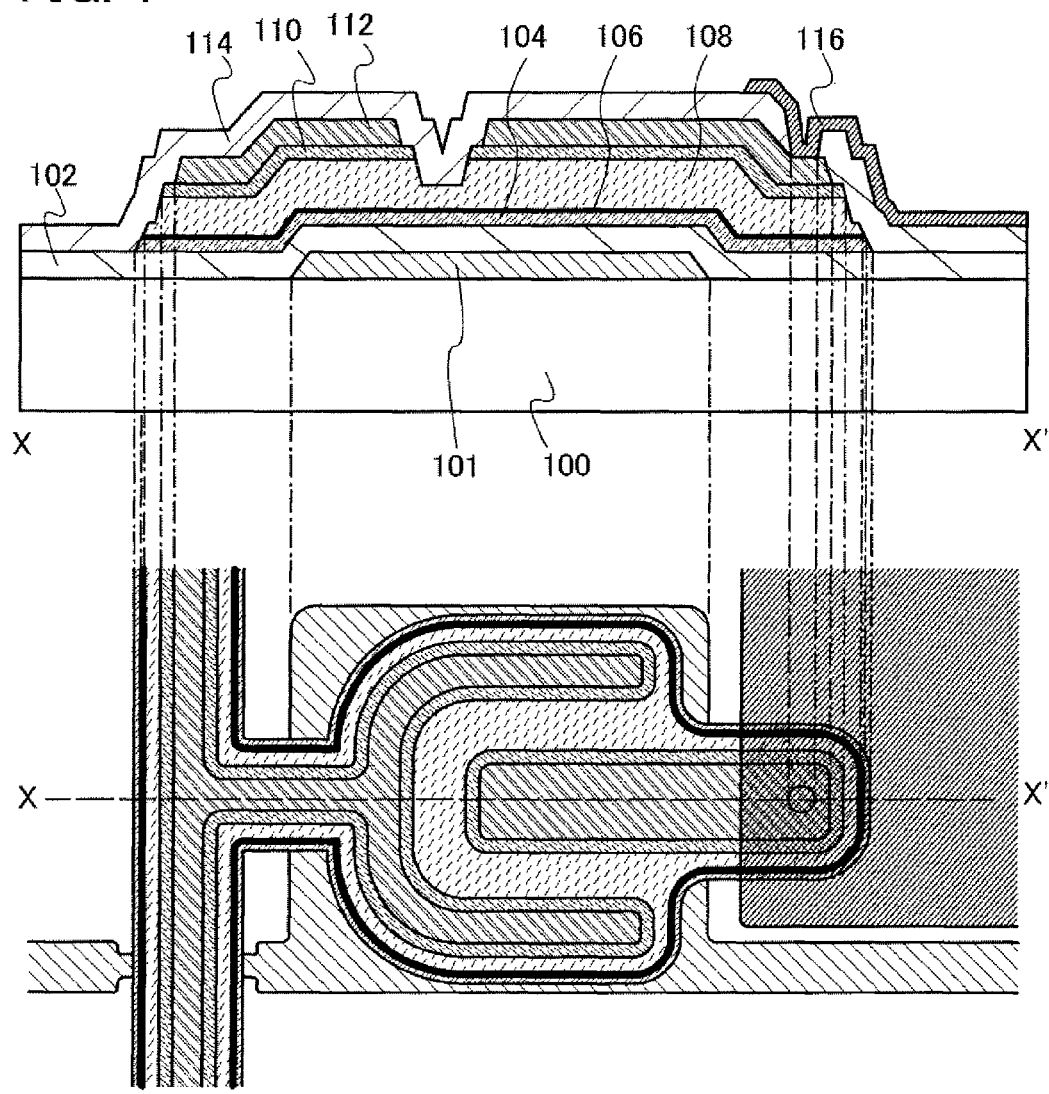

FIG. 5A
(A-1)
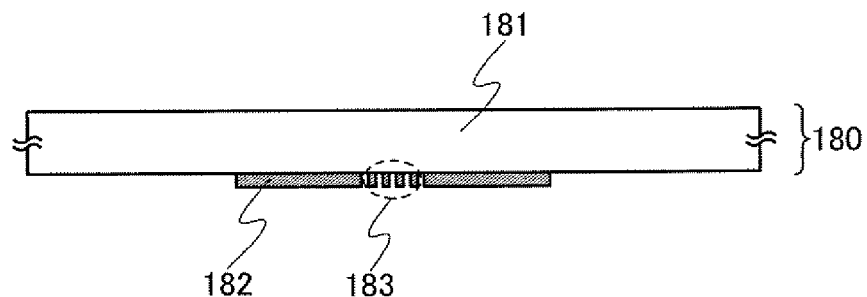
(A-2) Light transmittance
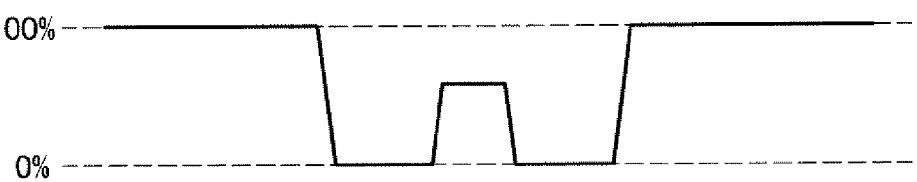
FIG. 5B
(B-1)
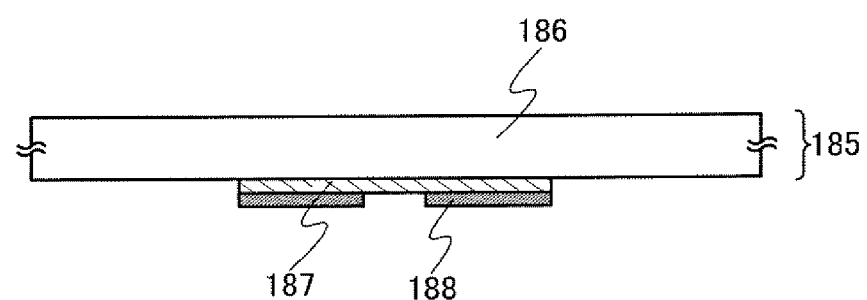
(B-2) Light transmittance
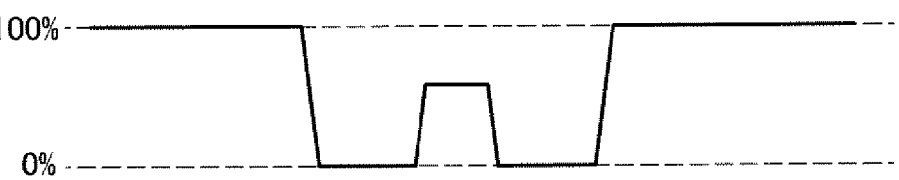

$H_2O*$  $H_2O*$  $H_2O*$  $H_2O*$  $H_2O*$ 3003
3001  3005

3005
3001  3004  3003

THIN FILM TRANSISTOR AND MANUFACTURING METHOD THEREOF

BACKGROUND OF THE INVENTION

1. Field of the Invention

The present invention relates to a thin film transistor, a semiconductor device having the thin film transistor, a display device having the thin film transistor, and a manufacturing method thereof.

2. Description of the Related Art

Thin film transistors (hereinafter also referred to as "TFTs") are widely used already in a technical field of liquid crystal displays. A TFT is a kind of a field effect transistor, and is named after the fact that a semiconductor film for forming a channel formation region is formed with a small thickness. At present, a technique to manufacture a TFT using amorphous silicon or polycrystalline silicon for a thin semiconductor film has already gone into actual use.

A semiconductor material called "microcrystalline silicon" has been familiar for a long time together with amorphous silicon and polycrystalline silicon, and there has been a report on a field effect transistor having microcrystalline silicon (for example, refer to Reference 1: U.S. Pat. No. 5,591,987). Even now, however, TFTs having microcrystalline silicon lag behind amorphous silicon transistors and polycrystalline silicon transistors in actual use, and some reports are made merely at the level of academic conference (for example, refer to Reference 2: Toshiaki Arai et al., "SID 07 DIGEST" 2007, pp. 1370-1373).

A microcrystalline silicon film can be formed over a glass substrate or the like by decomposing a source gas with plasma (weakly-ionized plasma) by a plasma CVD method; however, people think it difficult to control crystal nucleation and crystal growth because reaction proceeds in a nonequilibrium state.

Various researches have been made on microcrystalline silicon. According to a hypothesis, growth mechanism of microcrystalline silicon is as follows: first, a portion of an amorphous phase, in which atoms are distributed randomly, grows over a substrate, and then nuclei of crystals start to grow (refer to Reference 3: Hiroyuki Fujiwara et al., "Japanese Journal of Applied Physics (Jpn. J. Appl. Phys.)" vol. 41, 2002, pp. 2821-2828). In Reference 3, they think that the density of microcrystalline silicon nuclei can be controlled with the concentration of a hydrogen gas in forming a film because peculiar silicon-hydrogen bonds are observed on a surface of an amorphous portion when nuclei of microcrystalline silicon start to grow.

SUMMARY OF THE INVENTION

A thin film transistor in which amorphous silicon is used for a thin semiconductor film for forming a channel formation region can achieve field effect mobility as low as 0.4 cm$^2$/V·sec to 0.8 cm$^2$/V·sec approximately and has a problem of low on current. On the other hand, a thin film transistor in which microcrystalline silicon is used for a thin semiconductor film for forming a channel formation region has a problem of higher off current than a thin film transistor including amorphous silicon although it has improved field effect mobility.

A thin film transistor in which polycrystalline silicon is used for a thin semiconductor film for forming a channel formation region has much higher field effect mobility than a thin film transistor including amorphous silicon or microcrystalline silicon, and has a characteristic of high on current. Because of such a characteristic, a thin film transistor including polycrystalline silicon can be applied not only to a switching transistor provided in a pixel portion but also to an element in a driver circuit, which needs to operate at high speed. However, a thin film transistor including polycrystalline silicon requires a step of crystallizing a semiconductor film, which is different from a process of manufacturing a thin film transistor including amorphous silicon. Therefore, a thin film transistor including polycrystalline silicon has a problem of increase in manufacturing cost. For example, a laser annealing technique, which is necessary for forming polycrystalline silicon, has a problem of difficulty in producing a display panel of a large screen efficiently because an irradiation area of a laser beam is small.

Further, as is described in Reference 2, crystallinity and field effect mobility can be improved by a method in which after forming an amorphous silicon film, a photothermal conversion layer of a metal material is provided and laser beam irradiation is performed to form a microcrystalline silicon film. In terms of productivity, however, it can hardly be said that the microcrystalline silicon film is superior to a polycrystalline silicon film formed using a laser annealing technique.

Thus, a mode of the present invention has an object of reducing off current and increasing on current of a thin film transistor. Further, a mode of the present invention has another object of reducing variation in electric characteristics among semiconductor elements (e.g. TFTs), substrates, or lots. Furthermore, a mode of the present invention has another object of improving image quality of a display device.

According to a mode of the present invention, as a structure of semiconductor layers for forming a channel formation region of a thin film transistor, a first semiconductor layer including a plurality of crystalline regions is provided on a gate insulating layer side; a second semiconductor layer having an amorphous structure is provided on a source region and drain region side; an insulating layer with a thickness small enough to allow carrier travel is provided between the first semiconductor layer and the second semiconductor layer. The first semiconductor layer, which is provided on the gate insulating layer side and includes crystalline regions, serves to improve on current of the thin film transistor. The insulating layer over the first semiconductor layer serves to inhibit crystals from growing into the second semiconductor layer under influence of the crystalline regions in the first semiconductor layer. The second semiconductor layer having an amorphous structure, together with the insulating layer, is present between the source and drain regions and the first semiconductor layer, thereby reducing off current.

The first semiconductor layer is formed using a reaction gas in which a semiconductor source gas and a dilution gas are mixed at a ratio that allows forming a semiconductor including a plurality of crystalline regions, typically a microcrystalline semiconductor. The reaction gas is introduced into a reaction space, and a predetermined pressure is kept to produce plasma, typically glow discharge plasma. Thus, a film is formed over a substrate in the reaction space.

According to a mode of the present invention, further, a semiconductor layer including a plurality of crystalline regions in an amorphous structure is used as the first semiconductor layer, and nucleation site and nucleation density of crystals in the semiconductor layer are controlled, thereby controlling the film quality. In the semiconductor layer which includes the plurality of crystalline regions in the amorphous structure and forms the channel formation region of the thin film transistor, nucleation site and nucleation density of crystals are controlled in accordance with a region where carriers travel.

The semiconductor layer including the plurality of crystalline regions in the amorphous structure, i.e. the first semiconductor layer, is formed using a reaction gas in which a semiconductor source gas and a dilution gas are mixed at a ratio that allows forming a semiconductor including a plurality of crystalline regions. The reaction gas is introduced into an ultrahigh vacuum treatment chamber in which an oxygen concentration is reduced, and a predetermined pressure is kept to produce plasma, typically glow discharge plasma. Thus, a film is formed over a substrate in the treatment chamber. In an early stage of film formation, the film starts to be deposited with an impurity element which inhibits crystal nucleation contained in the treatment chamber. Then, the concentration of the impurity element is reduced, thereby generating crystal nuclei, and the crystalline regions are formed from the crystal nuclei.

As an impurity element which inhibits crystal nucleation, it is preferable to use nitrogen or nitride. If nitrogen is to be contained in the semiconductor layer, the nitrogen concentration in the semiconductor layer which is measured by secondary ion mass spectrometry is $1 \times 10^{20}/cm^3$ to $1 \times 10^{21}/cm^3$. The peak of nitrogen concentration which is measured by secondary ion mass spectrometry is $3 \times 10^{20}/cm^3$ to $1 \times 10^{21}/cm^3$ at an interface between the gate insulating layer and the semiconductor layer or a portion near the interface. By reducing the nitrogen concentration in a thickness direction of the semiconductor layer from the interface or the portion near the interface, nucleation site, from which the crystalline regions start to grow, and nucleation density are controlled.

The concentration of an impurity element (e.g. oxygen) which is contained in silicon, reduces the coordination number of silicon, and generates a dangling bond is reduced: it is preferable to limit the oxygen concentration which is measured by secondary ion mass spectrometry to $5 \times 10^{18}/cm^3$ or less.

A thin film transistor according to a mode of the invention includes a first semiconductor layer which includes a plurality of crystalline regions, and a second semiconductor layer which has an amorphous structure and is formed over the first semiconductor layer with an insulating layer interposed therebetween. The insulating layer is provided between and in contact with the first semiconductor layer and the second semiconductor layer so as to cover an interface with the first semiconductor layer. Preferably, a surface of the first semiconductor layer is altered to form the insulating layer. The second semiconductor layer is provided on an opposite side to a face of the first semiconductor layer which is in contact with a gate insulating layer; the second semiconductor layer is provided on a "back channel" side. That is, the second semiconductor layer and the insulating layer are provided between a pair of impurity semiconductor layers of one conductivity type that form a source region and a drain region, so as to cover the crystalline regions of the first semiconductor layer and not to expose the first semiconductor layer on the back channel side.

According to a mode of the present invention, a gate insulating layer which covers a gate electrode, a first semiconductor layer which is in contact with the gate insulating layer and includes a plurality of crystalline regions, impurity semiconductor layers of one conductivity type which form a source region and a drain region, a second semiconductor layer which has an amorphous structure and is present between the first semiconductor layer and the impurity semiconductor layers of one conductivity type, and an insulating layer which covers an interface with the first semiconductor layer and is provided between and in contact with the first semiconductor layer and the second semiconductor layer are provided over a substrate having an insulating surface.

According to a mode of the present invention, a gate insulating layer which covers a gate electrode, a first semiconductor layer which is in contact with the gate insulating layer, a second semiconductor layer which is formed over the first semiconductor layer with an insulating layer interposed therebetween, and impurity semiconductor layers of one conductivity type which form a source region and a drain region are provided over a substrate having an insulating surface. The insulating layer covers an interface with the first semiconductor layer.

In the above structure, in a region which does not reach the impurity semiconductor layers of one conductivity type, the first semiconductor layer may have inverted conical or inverted pyramidal crystals which have grown substantially radially from a point which is apart from the interface between the gate insulating layer and the first semiconductor layer in a direction of depositing the first semiconductor layer. Further, it is preferable that the first semiconductor layer with such a structure have an oxygen concentration of $5 \times 10^{18}/cm^3$ or less and a nitrogen concentration of $1 \times 10^{20}/cm^3$ to $1 \times 10^{21}/cm^3$ which are measured by secondary ion mass spectrometry. Furthermore, it is preferable that the peak of nitrogen concentration which is measured by secondary ion mass spectrometry be $3 \times 10^{20}/cm^3$ to $1 \times 10^{21}/cm^3$ at the interface between the gate insulating layer and the semiconductor layer or a portion near the interface, and that the nitrogen concentration decrease in a thickness direction of the first semiconductor layer from the interface or the portion near the interface. Still furthermore, in the first semiconductor layer, points from which the crystalline regions start to grow can be present in a region with nitrogen concentrations of higher than or equal to $1 \times 10^{20}/cm^3$ and less than $3 \times 10^{20}/cm^3$. Still furthermore, the crystalline regions can each be either a single crystal or a single crystal including twin crystals.

In the above structure, the insulating layer may be a monatomic layer.

According to a mode of the present invention, a first semiconductor layer which includes a plurality of crystalline regions, a second semiconductor layer which has an amorphous structure, an insulating layer which is in contact with the first semiconductor layer and the second semiconductor layer and covers an interface with the first semiconductor layer, a gate insulating layer which is in contact with the first semiconductor layer on an opposite side to a face of the first semiconductor layer which is in contact with the insulating layer, and a gate electrode which is in contact with the gate insulating layer on an opposite side to a face of the gate insulating layer which is in contact with the first semiconductor layer are included.

According to a mode of the present invention, a gate insulating layer is formed over a substrate having an insulating surface which is provided with a gate electrode; a semiconductor source gas and a dilution gas are introduced into a treatment chamber at a mixture ratio which allows forming a semiconductor including a plurality of crystalline regions, and plasma is produced, so that a first semiconductor layer including a plurality of crystalline regions is formed over the gate insulating layer; a surface of the first semiconductor layer is altered to form an insulating layer; a second semiconductor layer having an amorphous structure is formed over the insulating layer; impurity semiconductor layers of one conductivity type which form a source region and a drain region are formed over the second semiconductor layer; a source electrode and a drain electrode are formed over the impurity semiconductor layers of one conductivity type.

In the above structure, to alter the first semiconductor layer in order to form the insulating layer, it is preferable to perform plasma treatment or oxidation treatment which is performed by exposing the first semiconductor layer to the atmosphere. Further, it is preferable to perform the plasma treatment with $H_2O$ plasma.

In the above structure, the semiconductor source gas can be a silicon hydride gas, a silicon fluoride gas, or a silicon chloride gas, and the dilution gas can be a hydrogen gas.

Further, in the above structure, the semiconductor source gas and the dilution gas may be introduced into a treatment chamber in which an oxygen concentration is reduced; then, plasma may be produced; a film may start to be deposited with an impurity element which inhibits crystal nucleation contained in the treatment chamber in an early stage of forming the film; crystal nuclei are generated after the film is deposited to a thickness of 5 nm to 20 nm, so that the first semiconductor layer including the plurality of crystalline regions in an amorphous structure can be formed.

In the above structure, before introducing the semiconductor source gas and the dilution gas into the treatment chamber, a gas containing the impurity element which inhibits crystal nucleation may be introduced temporarily into the treatment chamber so that the impurity element can remain in the treatment chamber, and then the treatment chamber may be evacuated. Alternatively, as the gate insulating layer, an insulating layer including the impurity element which inhibits crystal nucleation may be formed. Further alternatively, a film including the impurity element which inhibits crystal nucleation may be deposited on the inner wall of the treatment chamber in advance. In the above structure, nitrogen can be used as the impurity element which inhibits crystal nucleation.

According to a mode of the present invention, as a structure of the semiconductor layers for forming a channel formation region of the thin film transistor, the insulating layer with a thickness small enough to allow carrier travel is provided between the first semiconductor layer and the second semiconductor layer, thereby reducing variation in electric characteristics among elements, substrates, or lots. Further, the first semiconductor layer including the plurality of crystalline regions is provided on the gate insulating layer side and the second semiconductor layer having an amorphous structure is provided on the source region and drain region side, thereby reducing off current and improving electric characteristics.

BRIEF DESCRIPTION OF THE DRAWINGS

In the accompanying drawings:

FIG. 1 includes a cross-sectional view and a top view showing a structure of a thin film transistor;

FIGS. 5A-1, 5A-2, 5B-1, and 5B-2 are drawings illustrating multi-tone photomasks applicable to manufacturing a thin film transistor;

DETAILED DESCRIPTION OF THE INVENTION

Figure 2A:
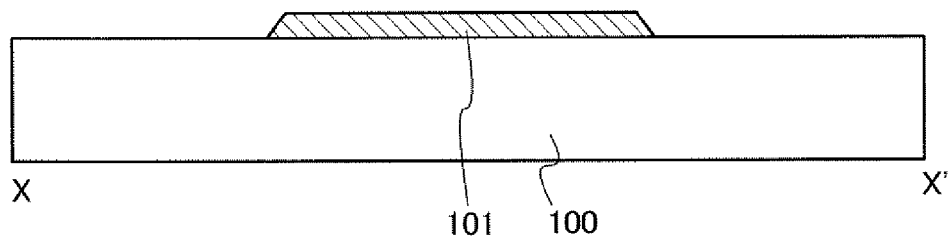
FIGS. 2A to 2E are cross-sectional views illustrating a method for manufacturing a thin film transistor.

Hereinafter, embodiment modes of the present invention are described with reference to the drawings. Note that the present invention is not limited to the description below, for it is easily understood by those skilled in the art that the modes and details disclosed herein can be modified in various ways without departing from the spirit and scope of the present invention. Therefore, the present invention should not be interpreted as being limited to the description of the embodiment modes to be given below. In describing structures of the present invention with reference to the drawings, reference numerals designating the same parts are used in different drawings. Further, the same hatching pattern is given to similar parts, and the similar parts are not especially designated by reference numerals in some cases.

In this specification, "on current" means a current which flows between a source and a drain when a transistor is on. Further, "off current" means a current which flows between a source and a drain when a transistor is off: for example, in a case of an n-channel transistor, "off current" is a leakage current which flows between a source and a drain when the gate voltage is lower than the threshold voltage.

Further, in this specification, a "film" means what is formed over an entire surface and has not been patterned. A "layer" means what has been patterned in a desired form with a resist mask or the like. A "film" and a "layer" are distinguished for sake of convenience, and the terms "film" and "layer" can be used without any distinction in some cases. Further, with regard to each layer in stacked layers, a film and a layer can not be distinguished from each other in some cases.

Furthermore, in this specification, an oxygen concentration and a nitrogen concentration are measured by secondary ion mass spectrometry.

Embodiment Mode 1

In this embodiment mode, a mode of a thin film transistor is described with reference to drawings.

FIG. 1 includes a top view and a cross-sectional view of a thin film transistor according to this embodiment mode. The thin film transistor shown in FIG. 1 is an "inverted staggered thin film transistor" including a gate electrode layer 101 provided over a substrate 100, a gate insulating layer 102 covering the gate electrode layer 101, a first semiconductor layer 104 provided over the gate insulating layer 102, an insulating layer 106 provided over and in contact with the first semiconductor layer 104, a second semiconductor layer 108 provided over and in contact with the insulating layer 106, a pair of impurity semiconductor layers 110 that are provided over and in contact with the second semiconductor layer 108 and are separated from each other, and a pair of wiring layers 112 that are in contact with the pair of impurity semiconductor layers 110 and are separated from each other. The first semiconductor layer 104 includes a plurality of crystalline regions. The second semiconductor layer 108 has an amorphous structure. The pair of impurity semiconductor layers 110 have one conductivity type by adding an impurity element imparting the one conductivity type thereto, and form a source region and a drain region. Further, the pair of wiring layers 112 form a source electrode and a drain electrode. The pair of wiring layers 112 are provided corresponding to the pair of impurity semiconductor layers 110, which are separated from each other. That is, one of the pair of wiring layers 112 (a first portion) is provided over one of the pair of impurity semiconductor layers 110 (a third portion), and the other of the pair of wiring layers 112 (a second portion) is provided over the other of the pair of impurity semiconductor layers 110 (a fourth portion). An insulating layer 114 functioning as a protective layer is provided over the wiring layers 112. Further, each layer has been patterned in a desired form.

When the thin film transistor according to this embodiment mode is on, carriers travel through the first semiconductor layer 104. The first semiconductor layer 104 including the plurality of crystalline regions produces an effect of higher on current than that of a thin film transistor in which a channel formation region is formed using an amorphous semiconductor because the first semiconductor layer 104 including the plurality of crystalline regions has higher electric conductivity than the second semiconductor layer 108 having an amorphous structure. When the thin film transistor according to this embodiment mode is off, leakage current flows through the second semiconductor layer 108. The second semiconductor layer 108 having an amorphous structure produces an effect of lower off current than that of a thin film transistor in which a channel formation region is formed using a microcrystalline semiconductor because the second semiconductor layer 108 having an amorphous structure has lower electric conductivity than the first semiconductor layer 104 including the crystalline regions. In other words, by providing the first semiconductor layer on the gate insulating layer side and providing the second semiconductor layer on the impurity semiconductor layers side that form the source region and the drain region as in the thin film transistor according to this embodiment mode, both reduction in off current and increase in on current can be achieved.

The first semiconductor layer 104, the insulating layer 106, and the second semiconductor layer 108 are stacked in this order from the gate insulating layer 102 side between the gate insulating layer 102, which is formed over the gate electrode layer 101, and the pair of impurity semiconductor layers 110, which are separated from each other. The stacked-layer structure of the first semiconductor layer 104, the insulating layer 106, and the second semiconductor layer 108 has a region overlapping with the gate electrode layer 101 with the gate insulating layer 102 interposed therebetween. Further, the stacked-layer structure of the first semiconductor layer 104, the insulating layer 106, and the second semiconductor layer 108 has regions overlapping with the pair of impurity semiconductor layers 110 and the pair of wiring layers 112. The stacked-layer structure of the first semiconductor layer 104, the insulating layer 106, and the second semiconductor layer 108 extends at least in a channel length direction of the thin film transistor. In this embodiment mode, the stacked-layer structure of the first semiconductor layer 104, the insulating layer 106, and the second semiconductor layer 108 continuously underlies the third portion and the fourth portion of the pair of impurity semiconductor layers 110, which are separated from each other. In other words, the stacked-layer structure of the first semiconductor layer 104, the insulating layer 106, and the second semiconductor layer 108 continuously underlies the first portion and the second portion of the pair of wiring layers 112, which are separated from each other.

A feature of a mode of the present invention is that the first semiconductor layer 104 is provided on the gate insulating layer 102 side, and the second semiconductor layer 108 is provided on the pair of impurity semiconductor layers 110 side, which form the source region and the drain region. Another feature is that the insulating layer 106 with a thickness small enough to allow carrier travel is provided over a surface of the first semiconductor layer 104. The second semiconductor layer 108 is formed over the first semiconductor layer 104 with the insulating layer 106 interposed therebetween. The insulating layer 106 is provided between the first semiconductor layer 104 and the second semiconductor layer 108 at least in a channel formation region and a portion near the channel formation region.

The first semiconductor layer 104 includes the plurality of crystalline regions. Typically, the first semiconductor layer 104 including the plurality of crystalline regions is formed using a microcrystalline semiconductor such as microcrystalline silicon, microcrystalline silicon germanium, or microcrystalline germanium.

A microcrystalline semiconductor layer in this embodiment mode contains a semiconductor having an intermediate structure between amorphous and crystalline (including single crystalline and polycrystalline) structures. A microcrystalline semiconductor is in a third state, in which the semiconductor is stable in free energy. A microcrystalline semiconductor layer includes crystal grains with diameters of 2 nm to 200 nm inclusive, preferably 10 nm to 80 nm inclusive, more preferably 20 nm to 50 nm inclusive, for example. A Raman spectrum of microcrystalline silicon, which is a typical example of a microcrystalline semiconductor, lies in lower wave numbers than 520/cm, which represents a peak value of a Raman spectrum of single crystal silicon. That is to say, the peak of a Raman spectrum of microcrystalline silicon lies between 520/cm and 480/cm, which represent a peak value of a Raman spectrum of single crystal silicon and that of amorphous silicon, respectively. Further, hydrogen or halogen is contained at 1 at. % or more in order to terminate dangling bonds. Furthermore, a rare gas element such as helium, argon, krypton, or neon may be contained to promote lattice distortion further, so that the stability is enhanced and a favorable microcrystalline semiconductor can be obtained. Such description of a microcrystalline semiconductor layer is disclosed in U.S. Pat. No. 4,409,134, for example. However, an idea of a microcrystalline semiconductor is not limited only to that including crystal grains with the above diameters. Further, another semiconductor material may replace a microcrystalline semiconductor if the material has similar physical properties.

Figure 6A:
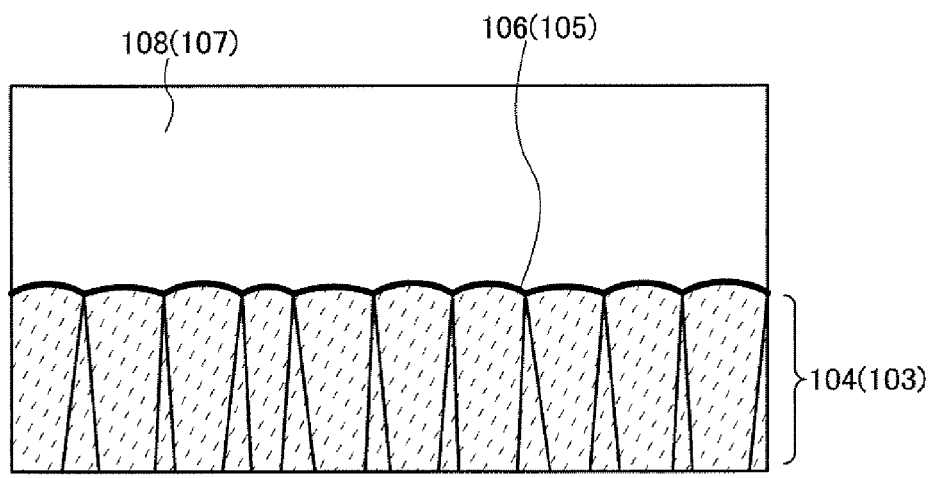
FIGS. 6A and 6B are schematic views illustrating semiconductor layers according to some modes of the present invention.

FIG. 6A schematically shows the first semiconductor layer 104 including the plurality of crystalline regions according to this embodiment mode. The first semiconductor layer 104 includes crystal grains which grow larger from an interface with the gate insulating layer 102 in a direction of depositing the first semiconductor layer 104. The first semiconductor layer 104 is an aggregate of minute crystals. There is an amorphous structure among the crystals.

The insulating layer 106 is provided over and in contact with the first semiconductor layer 104, and the second semiconductor layer 108 having an amorphous structure is provided over and in contact with the insulating layer 106. The insulating layer 106 is provided over a surface of the first semiconductor layer 104, and separates the first semiconductor layer 104 from the second semiconductor layer 108 having an amorphous structure. Further, the insulating layer 106 prevents crystals from growing from the crystal regions in the first semiconductor layer 104 into the second semiconductor layer 108 having an amorphous structure.

The first semiconductor layer 104 has a thickness of 2 nm to 60 nm inclusive, preferably 10 nm to 30 nm inclusive.

The insulating layer 106 is formed with a thickness small enough to allow carrier travel between the first semiconductor layer 104 and the second semiconductor layer 108. Further, the insulating layer 106 is formed by altering the surface of the first semiconductor layer 104 including the plurality of crystalline regions, preferably, by oxidizing the surface of the first semiconductor layer 104. For example, a plasma-treated layer, a native oxide layer, or the like is formed as the insulating layer 106: a silicon oxide layer, a silicon nitride layer, a silicon oxynitride layer, a silicon nitride oxide layer, or the like is formed. Alternatively, it is also preferable that the insulating layer 106 be a monatomic layer. The insulating layer 106 has a thickness of more than 0 nm and less than or equal to 5 nm, preferably more than 0 nm and less than or equal to 3 nm, more preferably more than 0 nm and less than or equal to 2 nm, still more preferably more than 0 nm and less than or equal to 0.5 nm, approximately.

The second semiconductor layer 108 has an amorphous structure. Typically, the second semiconductor layer 108 having an amorphous structure is formed using an amorphous semiconductor such as amorphous silicon or amorphous silicon containing germanium. The second semiconductor layer 108 has a thickness of 30 nm to 200 nm inclusive, preferably 50 nm to 150 nm inclusive.

In a thin film transistor, carriers (electrons or holes) that travel between a source region and a drain region are controlled with a voltage applied to a gate electrode. In this embodiment mode, carriers travel through the first semiconductor layer 104, the insulating layer 106, and the second semiconductor layer 108 in a region overlapping with the gate electrode layer 101 between the pair of impurity semiconductor layers 110 that form the source region and the drain region (under a space between the pair of impurity semiconductor layers 110).

A large number of carriers are generated at the interface between the gate insulating layer 102 and the first semiconductor layer 104 and a portion near the interface. When the thin film transistor according to this embodiment mode is turned on, the carriers generated in the first semiconductor layer 104 travel from the first portion to the second portion of the pair of wiring layers 112. When the thin film transistor according to this embodiment mode is off, off current flows through a surface of a layer which connects the source region and the drain region (a back channel).

In the thin film transistor according to this embodiment mode, the insulating layer 106 is provided between the first semiconductor layer 104 and the second semiconductor layer 108. The insulating layer 106 prevents the first semiconductor layer 104 including the plurality of crystalline regions from being in contact with the second semiconductor layer 108 having an amorphous structure. If a semiconductor having an amorphous structure (typically, an amorphous semiconductor) is formed in contact with a semiconductor including a plurality of crystalline regions (typically, a microcrystalline semiconductor), crystals in the semiconductor including the plurality of crystalline regions can grow into the semiconductor having an amorphous structure depending on conditions of forming the semiconductor having an amorphous structure or process conditions after forming the semiconductor having an amorphous structure. With regard to patterns of crystal growth, the semiconductor having an amorphous structure can be microcrystallized or polycrystallized, or crystals in needle-like or column-like shapes in the semiconductor including the plurality of crystalline regions can grow into the semiconductor having an amorphous structure. If crystals grow into the semiconductor having an amorphous structure, electric conductivity is increased, which leads to increase in off current, unfortunately. In view of the above problem, the insulating layer with a thickness small enough to allow carrier travel is formed at an interface between the semiconductor layer including the plurality of crystalline regions and the semiconductor layer having an amorphous structure, whereby the semiconductor layer having an amorphous structure can be separated from the semiconductor layer including the plurality of crystalline regions, which prevents crystals from growing into the semiconductor layer having an amorphous structure. As a result, variation in electric characteristics can be suppressed among thin film transistors. The insulating layer 106 may be formed with an oxide film or a nitride film; it is preferable to form an oxide film (typically, a silicon oxide film), which makes it possible to separate the layers without forming an interface state or the like. By forming the insulating layer 106 by performing plasma treatment or oxidation treatment on the surface of the first semiconductor layer 104, a favorable interface can be formed between the insulating layer 106 and the first semiconductor layer 104. Thus, the second semiconductor layer 108 can be separated from the first semiconductor layer 104 without interrupting carrier travel.

The first semiconductor layer 104 including the plurality of crystalline regions can be formed using a semiconductor (typically, microcrystalline semiconductor) to which a donor, which is an impurity element which supplies electrons as carriers, is added or a semiconductor (typically, microcrystalline semiconductor) to which an acceptor, which is an impurity element which supplies holes as carriers, is added. Typical examples of a donor impurity element include phosphorus, arsenic, antimony, and the like, which are fifteenth group elements in the periodic table. Typical examples of an acceptor impurity element include boron, aluminum, and the like, which are thirteenth group elements in the periodic table.

The thin film transistor shown in FIG. 1 has a depressed portion in the semiconductor layer between the pair of impurity semiconductor layers 110, which form the source region and the drain region. Such a thin film transistor is also called a "channel-etched thin film transistor." The thin film transistor in this embodiment mode has the depressed portion in the second semiconductor layer 108, and the second semiconductor layer 108 is present also in the depressed portion. Needless to say, alternatively, a thin film transistor according to a mode of the present invention may be a channel-protective thin film transistor.

Further, the thin film transistor shown in FIG. 1 can be applied to a pixel transistor provided in a pixel portion of a display device such as a liquid crystal display device or an EL display device. In the example shown in the drawing, therefore, an opening portion is provided in the insulating layer 114; a pixel electrode layer 116 is provided over the insulating layer 114; the pixel electrode layer 116 is connected to one of the pair of wiring layers 112 through the opening portion provided in the insulating layer 114.

One of the source electrode and the drain electrode has a U-shape (or horseshoe shape), and the source or drain electrode in the U-shape surrounds the other of the source electrode and the drain electrode. A distance between the source electrode and the drain electrode is uniform or almost uniform (see FIG. 1).

A thin film transistor with the above structure can have a large channel width, thereby increasing the amount of current. Further, variation in electric characteristics can be reduced. Furthermore, reduction in reliability which is due to misalignment of a mask pattern in a manufacturing process can be suppressed. However, the present invention is not limited to the above, and one of the source electrode and the drain electrode of the thin film transistor does not necessarily have a U-shape.

Next, a method for manufacturing the thin film transistor shown in FIG. 1 is described. With regard to a thin film transistor having a microcrystalline semiconductor, an n-channel thin film transistor has higher carrier mobility than a p-channel thin film transistor. Further, it is preferable that all the thin film transistors formed over one substrate have the same polarity to reduce the number of manufacturing steps. In this embodiment mode, therefore, a method for manufacturing an n-channel thin film transistor is described.

First, the gate electrode layer 101 is formed over the substrate 100 (see FIG. 2A).

As the substrate 100, a glass substrate, a ceramic substrate, a plastic substrate which has high heat resistance enough to withstand a process temperature of this manufacturing process, or the like can be used. If it is not necessary that the substrate have a light transmitting property, a metal (e.g. stainless steel alloy) substrate having a surface provided with an insulating layer may be used. As a glass substrate, it is preferable to use an alkali-free glass substrate such as barium borosilicate glass, aluminoborosilicate glass, or aluminosilicate glass, for example. When the substrate 100 is mother glass, a size of the substrate may be the ninth generation (e.g. 2400 mm×2800 mm) or the tenth generation (e.g. 2950 mm×3400 mm) as well as the first generation (e.g. 320 mm×400 mm) to the seventh generation (e.g. 1870 mm×2200 mm) and the eighth generation (e.g. 2200 mm×2400 mm).

The gate electrode layer 101 can be formed with a single layer or stacked layers using a metal material such as molybdenum, titanium, chromium, tantalum, tungsten, aluminum, copper, neodymium, or scandium, or an alloy material which contains any of these materials as a main component. Further, the gate electrode layer 101 can be formed by forming a conductive film over the substrate 100 by a sputtering method or a vacuum evaporation method, forming a mask over the conductive film by a photolithography method, an inkjet method, or the like, and etching the conductive film with the use of the mask. Alternatively, the gate electrode layer 101 can be formed by discharging a conductive nanopaste of silver, gold, copper, or the like onto the substrate by an inkjet method and baking it. In this embodiment mode, a conductive film is formed over the substrate 100 and is etched using a resist mask formed with the use of a photomask, so that the gate electrode layer 101 is formed.

In a case of using aluminum for the gate electrode layer 101, it is preferable to use an Al—Ta alloy, which is formed by alloying aluminum with tantalum, thereby suppressing hillocks. It is more preferable to use an Al—Nd alloy, which is formed by alloying aluminum with neodymium, thereby forming a wiring with low resistance as well as suppressing hillocks. For the gate electrode layer 101, alternatively, a semiconductor typified by polycrystalline silicon doped with an impurity element such as phosphorus, or an Ag—Pd—Cu alloy may be used. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride layer is stacked over a copper layer is preferable. By stacking a metal layer functioning as a barrier layer over a layer with low electric resistance, electric resistance can be lowered and diffusion of a metal element from the metal layer into the semiconductor layer (an upper layer) can be prevented. Alternatively, a two-layer structure including a titanium nitride layer and a molybdenum layer, or a three-layer structure including a tungsten layer with a thickness of 50 nm, an aluminum-silicon alloy layer with a thickness of 500 nm, and a titanium nitride layer with a thickness of 30 nm may be employed. If a three-layer structure is employed as described above, tungsten nitride may be used instead of tungsten of a first conductive film that constitutes the gate electrode layer 101; aluminum-titanium alloy may be used instead of aluminum-silicon alloy of a second conductive film that constitutes the gate electrode layer 101; or titanium may be used instead of titanium nitride of a third conductive film that constitutes the gate electrode layer 101. For example, if a molybdenum layer is stacked over an Al—Nd alloy layer, a conductive film with excellent heat resistance and low electric resistance can be formed. A nitride layer of any of the above metal materials may be provided between the substrate 100 and the gate electrode layer 101.

It is preferable that the gate electrode layer 101 have a tapered side face in order to prevent a wiring from being disconnected at a portion with a difference in height, for the insulating layers, the semiconductor layers, and the wiring layers are formed over the gate electrode layer 101 in the following steps. To make the gate electrode layer 101 have a tapered side face, etching is performed with a resist mask receding. For example, by mixing an oxygen gas into an etching gas, etching can be performed with a resist mask receding.

In the step of forming the gate electrode layer 101, further, a gate wiring (a scanning line) can also be formed at the same time. Furthermore, a capacitor line in a pixel portion can also be formed at the same time. A scanning line means a wiring for selecting a pixel, and a capacitor line means a wiring connected to one electrode of a storage capacitor in a pixel. However, a formation method is not limited to the above, and a gate wiring and/or a capacitor wiring may be formed separately from the gate electrode layer 101.

Figure 2B:
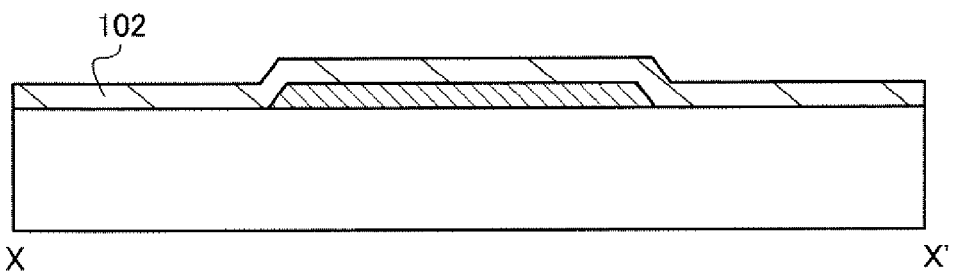

Subsequently, the gate insulating layer 102 is formed to cover the gate electrode layer 101 (see FIG. 2B). The gate insulating layer 102 can be formed with a single layer or stacked layers using a silicon oxide film, a silicon nitride film, a silicon oxynitride film, or a silicon nitride oxide film by a CVD method, a sputtering method, or the like. Further, the gate insulating layer 102 may be formed using a high frequency (about 1 GHz) microwave plasma CVD apparatus. If the gate insulating layer 102 is formed at a high frequency using a microwave plasma CVD apparatus, a dense layer can be formed. If the gate insulating layer 102 is dense, the dielectric strength between the gate electrode and the drain and source electrodes can be improved, so that a thin film transistor with high reliability can be obtained. Further, by forming the gate insulating layer 102 using silicon oxynitride, variation in threshold voltage in a transistor can be suppressed.

In this specification, note that silicon oxynitride means a substance that contains more oxygen than nitrogen and, in a case where measurements are performed using Rutherford backscattering spectrometry (RBS) and hydrogen forward scattering (HFS), contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide means a substance that contains more nitrogen than oxygen and, in a case where measurements are performed using RBS and HFS, contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in silicon oxynitride or silicon nitride oxide is defined as 100 at %.

Figure 2C:
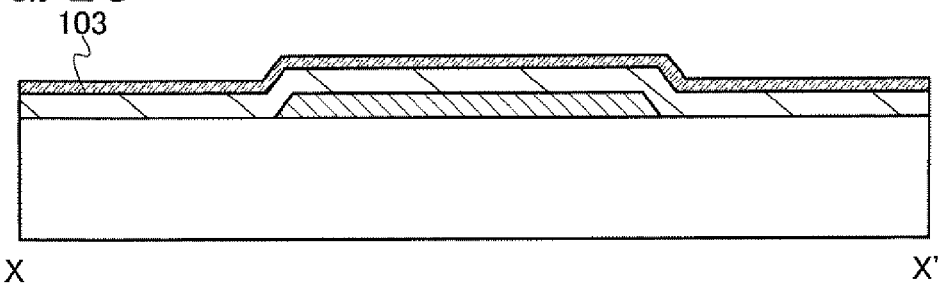

Next, a first semiconductor film 103 including a plurality of crystalline regions is formed over the gate insulating layer 102 (see FIG. 2C). A semiconductor source gas and a dilution gas are used as a reaction gas at a mixture ratio which allows forming a semiconductor including a plurality of crystalline regions (typically, a microcrystalline semiconductor) and plasma is produced, so that the first semiconductor film 103 including the plurality of crystalline regions is formed. Specifically, a reaction gas (also referred as a "source gas") in which a semiconductor source gas typified by silane is diluted with hydrogen or the like is introduced into a reaction space and a predetermined pressure is kept to produce plasma, typically glow discharge plasma, so that a film (a semiconductor film including a plurality of crystalline regions) is formed over a substrate to treat which is in the reaction space. As the semiconductor source gas, silicon hydride, which is typified by silane and disilane, can be used. Hydrogen is a typical example of a dilution gas, and it is also possible to form the first semiconductor film 103 using silicon hydride, hydrogen, and one or plural kinds of rare gas elements selected from helium, argon, krypton, and neon. With regard to the dilution, the flow ratio of silicon hydride to hydrogen is 1:5 to 1:200, preferably 1:50 to 1:150, more preferably 1:100. The first semiconductor film 103 can be formed, for example, in a treatment chamber (also referred to as a chamber, a reaction chamber, a deposition chamber, or a reaction space) of a plasma CVD apparatus by diluting a semiconductor source gas, which is typified by silane, with hydrogen or the like and producing glow discharge plasma. Silicon chloride such as $SiH_2Cl_2$, $SiHCl_3$, or $SiCl_4$, or silicon fluoride such as $SiF_4$ can be used instead of silicon hydride. Glow discharge plasma is produced by applying high frequency power of 1 MHz to 30 MHz (typically, 13.56 MHz or 27.12 MHz), or high frequency power in the VHF band of 30 MHz to 300 MHz approximately (typically, 60 MHz). Alternatively, high frequency power with microwaves, i.e. with a frequency of 1 GHz or more may be applied. A film formed using microwave (with a frequency of 1 GHz or more) plasma has a high electron density, and microwave plasma facilitates dissociation of silicon hydride. Therefore, when a semiconductor film including a plurality of crystalline regions is formed using microwave plasma, it is easier to form the semiconductor film including the plurality of crystalline regions, and the deposition rate can be enhanced, and the productivity can be improved as compared to using a high frequency (with a frequency of several tens of megahertzes to several hundreds of megahertzes inclusive) plasma CVD method.

It is preferable that the first semiconductor film 103 including the plurality of crystalline regions have a thickness of 2 nm to 60 nm inclusive, preferably 10 nm to 30 nm inclusive. Further, if the semiconductor film including the plurality of crystalline regions is a microcrystalline semiconductor film, it is preferable to form the semiconductor film including the plurality of crystalline regions with a small thickness to improve the throughput because the deposition rate of a microcrystalline semiconductor film is low, specifically, 1/10 to 1/100 times that of an amorphous semiconductor film.

Figure 2D:
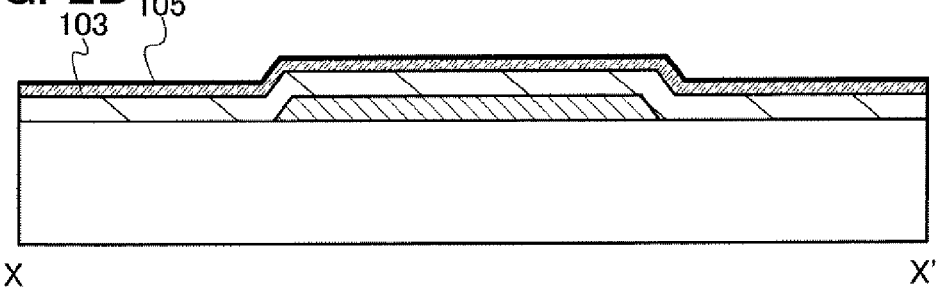

Next, an insulating film 105 is formed over the first semiconductor film 103 (see FIG. 2D). Since the insulating film 105 has a thickness small enough to allow carrier travel in the thin film transistor completed, it is preferable to form the insulating film 105 by altering a surface of the first semiconductor film 103 by plasma treatment, oxidation treatment, or the like. As the insulating film 105, for example, it is preferable to form an ultrathin film of a native oxide film, a plasma-treated film, a monatomic layer, or the like: a silicon oxide film, a silicon nitride film, a silicon oxynitride film, a silicon nitride oxide film, or the like is formed. The insulating film 105 is formed with a thickness of more than 0 nm and less than or equal to 5 nm, preferably more than 0 nm and less than or equal to 3 nm, more preferably more than 0 nm and less than or equal to 2 nm, still more preferably more than 0 nm and less than or equal to 0.5 nm, approximately. Although the insulating film 105 prevents crystals from growing into the second semiconductor layer having an amorphous structure, which is formed over the insulating film 105, it also needs to allow carriers to pass therethrough; therefore, it is preferable to form the insulating film 105 as thin as possible so as not to reduce on current. For the above reason, it is more desirable to form the insulating film by altering the surface of the semiconductor film than to form the insulating film by a physical or chemical growth method such as a CVD method or a sputtering method.

For example, after forming the first semiconductor film 103 including the plurality of crystalline regions, the first semiconductor film 103 including the plurality of crystalline regions is exposed to the atmosphere to form a native oxide film, which is used as the insulating film 105. By taking the substrate provided with the first semiconductor film 103 to an air atmosphere out of an apparatus in which the first semiconductor film 103 has been formed, a native oxide film is formed over the first semiconductor film 103. Alternatively, plasma is produced in an atmosphere containing oxygen or nitrogen, and the insulating film 105 is formed by reaction of oxygen radicals or nitrogen radicals. Further alternatively, it is also possible to form the insulating film 105 by oxidation treatment by performing ozone treatment, forming chemical oxide with an oxidative chemical solution, or the like. Still further alternatively, it is also possible to form the insulating film 105 by producing plasma in an atmosphere containing water or water vapor, i.e. by water plasma ($H_2O$ plasma). Even further alternatively, it is also possible to combine oxidation treatment (or nitridation treatment) and plasma treatment. For example, the first semiconductor film 103 including the plurality of crystalline regions may be exposed to the atmosphere and then undergo water plasma treatment to form the insulating film 105.

As long as an ultrathin insulating film which does not interrupt carrier travel can be formed as described above, a method for forming the insulating film 105 is not limited to a particular one; however, it is preferable to utilize water plasma.

A microcrystalline semiconductor, which is a kind of a semiconductor including a plurality of crystalline regions, has distortion in itself by including a plurality of aggregative minute crystal grains. Because of the distortion, when a microcrystalline semiconductor film formed by heating at 100° C. to 300° C. under a reduced pressure is brought back to room temperature and the air atmosphere, for example, the microcrystalline semiconductor film is subjected to inner stress. Thus, a nanoscale crack (what is called a "nanocrack") is generated between the minute crystal grains, whereby a defect is caused. Since a defect caused in a microcrystalline semiconductor film traps carriers, it has an adverse influence on electric characteristics, such as decrease in on current.

To solve the above problem, after forming the first semiconductor film 103 including the plurality of crystalline regions, plasma treatment is performed using plasma produced in an atmosphere containing water or water vapor, i.e. water plasma ($H_2O$ plasma), to form the insulating film 105. Alternatively, after the first semiconductor film 103 is formed and the substrate provided with the first semiconductor film 103 is taken out of the apparatus to be exposed to the atmosphere, plasma treatment is performed using water plasma. Thus, an insulating film for preventing crystallization of the second semiconductor layer which has an amorphous structure and is formed over the first semiconductor film 103 can be formed, and further, a defect in the first semiconductor film 103 can be compensated. Furthermore, the interface between the first semiconductor film 103 and the insulating film 105 can have good quality. For example, when microcrystalline silicon is used for the first semiconductor film 103, water plasma treatment is performed, or the first semiconductor film 103 is exposed to the atmosphere and then undergoes water plasma treatment, whereby the insulating film 105 can be formed.

Water plasma can be produced by introducing a gas which mainly contains water (typically, water vapor: $H_2O$ vapor) into a reaction space. There is no particular limitation on a method for producing plasma; an inductively-coupled plasma (ICP) method, a capacitively-coupled (parallel plate) plasma (CCP) method, an electron cyclotron resonance (ECR) method, a helicon method, or the like can be employed. By performing plasma treatment using water plasma after forming the first semiconductor film 103, the insulating film 105 is formed on a surface of the first semiconductor film 103, and further, hydroxyl groups (OH groups) can compensate for defects in the microcrystalline semiconductor, at the surface of the microcrystalline semiconductor, or around the microcrystalline semiconductor. Water plasma can separate the microcrystalline layer from the amorphous semiconductor layer and improve the quality of the microcrystalline semiconductor film, which can lead to improvement in electric characteristics of the thin film transistor.

An example of conditions of plasma treatment for forming the insulating film 105 is as follows: the flow rate of $H_2O$ gas is 300 sccm; the pressure in a chamber is 66.5 Pa; RF (13.56 MHz) power of 1800 W is applied to a coiled electrode to produce plasma; electric power is not applied to the substrate side (i.e. 0 W); thus, plasma treatment is performed on the first semiconductor film 103 for 180 seconds. The substrate side of 0 W here means a substrate side on which the first semiconductor film 103 is provided. An $H_2O$ gas may be introduced into the chamber by vaporizing pure water through a vaporizing mechanism typified by a vaporizer, for example.

Subsequently, a second semiconductor film 107 having an amorphous structure is formed over the insulating film 105 (see FIG. 2E). The second semiconductor film 107 having an amorphous structure (typically, an amorphous semiconductor film) is formed using a semiconductor source gas typified by silane, by producing plasma. With regard to the semiconductor source gas, a similar material to that of the first semiconductor film 103 can be used. The second semiconductor film 107 can be formed by a plasma CVD method using silicon hydride (typified by silane and disilane), silicon fluoride, or silicon chloride which is diluted with one or plural kinds of rare gas elements selected from helium, argon, krypton, and neon. Alternatively, if silicon hydride is diluted with hydrogen at a flow ratio of 1:1 to 1:10, preferably 1:1 to 1:5, an amorphous semiconductor containing hydrogen can be formed. Further alternatively, a halogen element such as fluorine or chlorine may be added to the amorphous semiconductor containing hydrogen.

As the second semiconductor film 107 having an amorphous structure, alternatively, an amorphous semiconductor can be formed by sputtering a semiconductor target such as silicon or germanium with hydrogen or a rare gas. That is, the second semiconductor film 107 can be formed by a sputtering method.

Figure 2E:
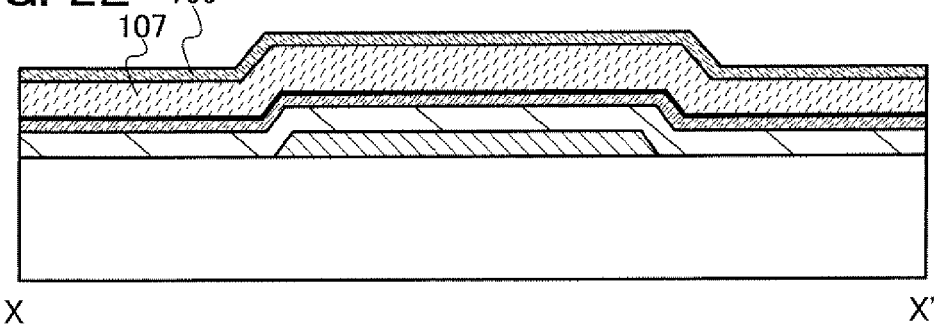

Next, an impurity semiconductor film 109 of one conductivity type, to which an impurity element imparting one conductivity type is added, is formed over the second semiconductor film 107 (see FIG. 2E).

As the impurity semiconductor film 109, a semiconductor film including an impurity element which functions as a donor and imparts one conductivity type (also called an "impurity element imparting n-type conductivity") (an impurity semiconductor film) is formed because an n-channel thin film transistor is formed in this embodiment mode. By etching the impurity semiconductor film 109 later, a pair of impurity semiconductor layers of one conductivity type that form the source region and the drain region are formed. When an n-channel thin film transistor is formed, phosphorus may be added as a donor impurity element to form the impurity semiconductor film 109: the impurity semiconductor film 109 can be formed using a semiconductor source gas (typified by silane) to which a gas containing an impurity element imparting n-type conductivity, such as phosphine ($PH_3$), is added. The impurity semiconductor film 109 can be formed using an amorphous semiconductor. The amorphous semiconductor may contain a crystal grain. Alternatively, a microcrystalline semiconductor may be used for the impurity semiconductor film 109. The impurity semiconductor film 109 may have a thickness of 30 nm to 100 nm, approximately.

If a p-channel thin film transistor is formed, a semiconductor film including an impurity element which functions as an acceptor and imparts one conductivity type (also called an "impurity element imparting p-type conductivity") (an impurity semiconductor film) is formed as the impurity semiconductor film 109. As a typical acceptor impurity element, boron may be added: a gas containing an impurity element imparting p-type conductivity, such as diborane ($B_2H_6$), may be added to a semiconductor source gas typified by silane.

Figure 3A:
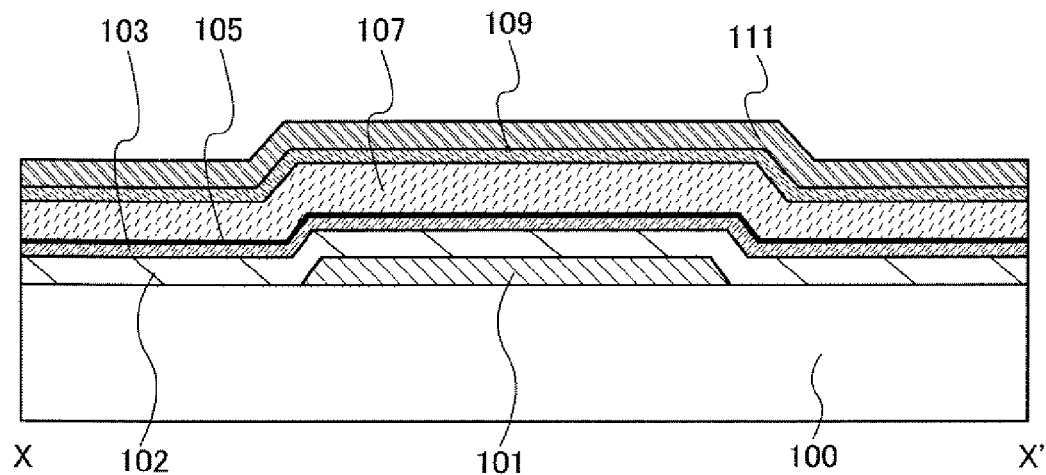
FIGS. 3A to 3C are cross-sectional views illustrating a method for manufacturing a thin film transistor.

Subsequently, a conductive film 111 is formed over the impurity semiconductor film 109 (see FIG. 3A).

The conductive film 111 can be formed with a single layer or stacked layers of aluminum, copper, titanium, neodymium, scandium, molybdenum, chromium, tantalum, tungsten, and the like. Alternatively, the conductive film 111 may be formed using an aluminum alloy to which an element for preventing hillocks is added (e.g. an Al—Nd alloy, which can be used for the gate electrode layer 101). Further alternatively, the conductive film 111 may be formed using crystalline silicon to which an impurity element imparting one conductivity type is added. The conductive film 111 may have a stacked-layer structure in which a layer in contact with the impurity semiconductor film is formed using titanium, tantalum, molybdenum, tungsten, or nitride of any of these elements, and aluminum or an aluminum alloy is formed thereover. Alternatively, the conductive film 111 may have a stacked-layer structure in which a top face and a bottom face of aluminum or an aluminum alloy are sandwiched with titanium, tantalum, molybdenum, tungsten, or nitride of any of these elements. For example, the conductive film 111 preferably has a three-layer structure in which an aluminum film is sandwiched with molybdenum films.

The conductive film 111 is formed by a CVD method, a sputtering method, or a vacuum evaporation method. Alternatively, the conductive film 111 may be formed by discharging a conductive nanopaste of silver, gold, copper, or the like by a screen printing method, an inkjet method, or the like and baking the conductive nanopaste.

Figure 3B:
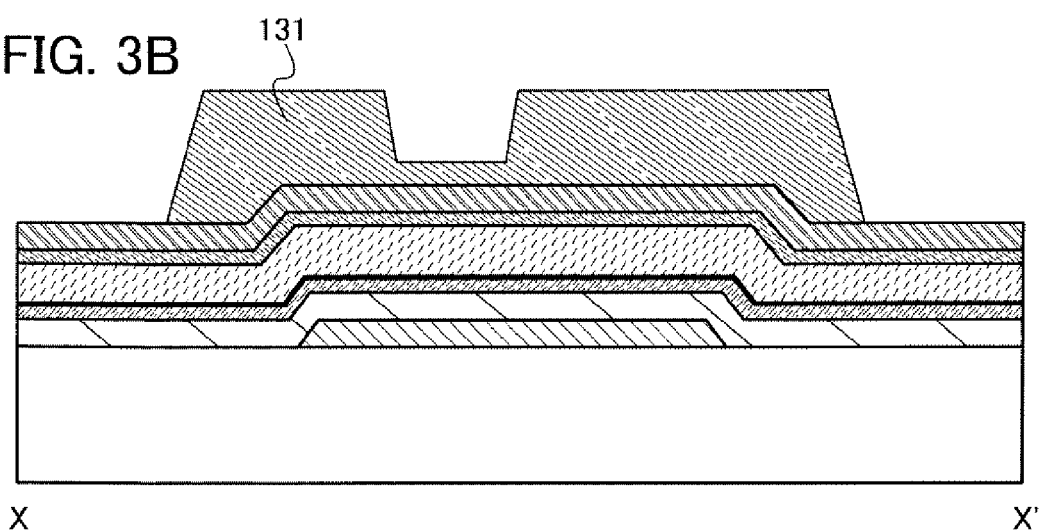

Next, a first resist mask 131 is formed over the conductive film 111 (see FIG. 3B). The first resist mask 131 has two regions with different thicknesses, and can be formed using a multi-tone photomask. It is preferable to use a multi-tone photomask, which reduces the number of photomasks used and the number of manufacturing steps. In this embodiment mode, a multi-tone photomask can be used in a step of forming patterns of the first semiconductor film 103 including the plurality of crystalline regions, the insulating film 105, and the second semiconductor film 107 having an amorphous structure, and in a step of separating the impurity semiconductor film to form the pair of impurity semiconductor layers that form the source region and the drain region.

With a multi-tone photomask, light exposure can be performed with light having plural degrees of intensity, typically, with light having three degrees of intensity, i.e. an exposed region, a semi-exposed region, and an unexposed region. A multi-tone photomask makes it possible to form a resist mask with plural thicknesses (typically, two levels of thicknesses) by one-time exposure and development process. Thus, a multi-tone photomask can reduce the number of photomasks.

FIGS. 5A-1 and 5B-1 are cross-sectional views of typical multi-tone photomasks. The former shows a gray-tone mask 180 and the latter shows a half-tone mask 185.

The gray-tone mask 180 shown in FIG. 5A-1 includes a light-blocking portion 182 formed using a light-blocking layer and a diffraction grating portion 183 formed by a pattern of the light-blocking layer, which are formed on a substrate 181 having a light-transmitting property.

The diffraction grating portion 183 has slits, dots, meshes, or the like provided at intervals which are less than or equal to the resolution limit of light used for the exposure, whereby the light transmittance is controlled. The diffraction grating portion 183 can have slits, dots, or meshes with either regular or irregular intervals.

The substrate 181 having a light-transmitting property can be formed using quartz or the like. The light-blocking layer forming the light-blocking portion 182 and the diffraction grating portion 183 may be formed using a metal film; preferably, chromium, chromium oxide, or the like is used.

When the gray-tone mask 180 is irradiated with light for exposure, a light transmittance of a region overlapping with the light-blocking portion 182 is 0% and that of a region where neither the light-blocking portion 182 nor the diffraction grating portion 183 is provided is 100%, as shown in FIG. 5A-2. The light transmittance of the diffraction grating portion 183 can be controlled with intervals of slits, dots, meshes or the like of the diffraction grating, in a range of approximately 10% to 70%.

The half-tone mask 185 shown in FIG. 5B-1 includes a semi-light-transmitting portion 187 formed using a semi-light-transmitting layer on a substrate 186 having a light-transmitting property, and a light-blocking portion 188 formed using a light-blocking layer.

The semi-light-transmitting portion 187 can be formed using a layer of MoSiN, MoSi, MoSiO, MoSiON, CrSi, or the like. The light-blocking portion 188 may be formed using a similar metal film to the light-blocking layer of the gray-tone mask; preferably, chromium, chromium oxide, or the like is used.

When the half-tone mask 185 is irradiated with light for exposure, a light transmittance of a region overlapping with the light-blocking portion 188 is 0% and that of a region where neither the light-blocking portion 188 nor the semi-light-transmitting portion 187 is provided is 100%, as shown in FIG. 5B-2. The light transmittance of the semi-light-transmitting portion 187 can be controlled with a kind of a material, a thickness, or the like of the semi-light-transmitting portion 187, in a range of approximately 10% to 70%.

By light exposure using a multi-tone photomask and development, a resist mask having regions with different thicknesses can be formed.

Figure 3C:
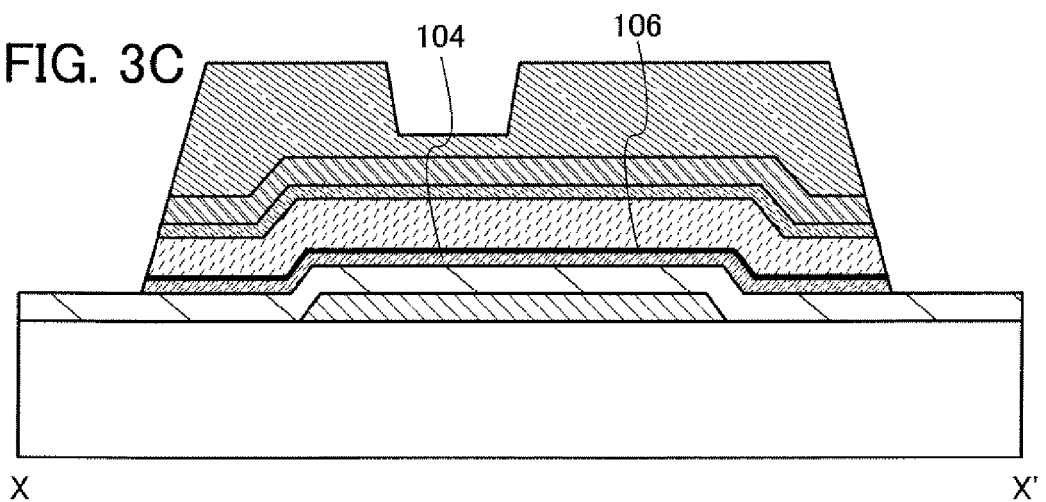

Next, the conductive film 111, the impurity semiconductor film 109, the second semiconductor film 107, the insulating film 105, and the first semiconductor film 103 are etched using the first resist mask 131. Through this step, the first semiconductor film 103, the insulating film 105, the second semiconductor film 107, the impurity semiconductor film 109, and the conductive film 111 are separated into elements (see FIG. 3C). By the element separation, the first semiconductor layer 104 and the insulating layer 106, which have desired patterns, can be obtained.

Then, the first resist mask 131 is made to recede, thereby forming a second resist mask 132. In order to make the resist mask recede, aching by oxygen plasma may be utilized.

Figure 4A:
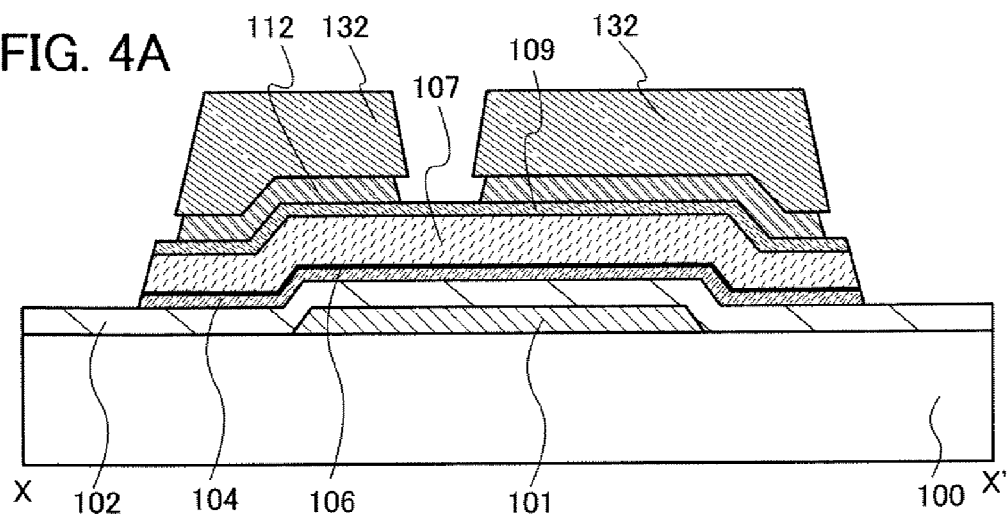
FIGS. 4A to 4C are cross-sectional views illustrating a method for manufacturing a thin film transistor.

Subsequently, the conductive film 111 is etched using the second resist mask 132, whereby the pair of wiring layers 112 that form the source electrode and the drain electrode are formed (see FIG. 4A). It is preferable to employ wet etching for the etching of the conductive film 111. By wet etching, the conductive film 111 is etched selectively; thus, the conductive film 111 recedes inward compared to the second resist mask 132, so that the pair of wiring layers 112, which are separated from each other, are formed. Thus, side faces of the wiring layers 112 are not aligned with those of the impurity semiconductor film 109, which is under the wiring layers 112, and the side faces of the impurity semiconductor film 109 that forms the source region and the drain region are located at outer sides compared to those of the wiring layers 112. The wiring layers 112 function not only as the source electrode and the drain electrode but also as signal lines. However, the present invention is not limited to this mode, and a wiring layer which forms a signal line may be formed separately from a wiring layer which forms a source electrode and a drain electrode.

Figure 4B:
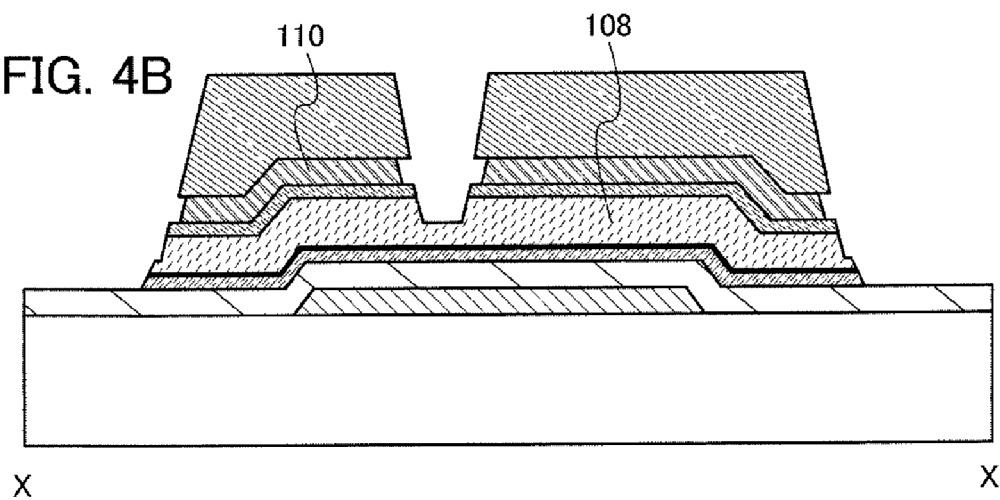

Next, the impurity semiconductor film 109 is etched using the second resist mask 132 (see FIG. 4B). Through this etching, the pair of impurity semiconductor layers 110, which have desired patterns, can be obtained. The pair of impurity semiconductor layers 110 are separated from each other, and form the source region and the drain region.

In the etching for forming the pair of impurity semiconductor layers 110 that form the source region and the drain region, further, a part of the second semiconductor film 107 is etched to have a depressed portion, so that the second semiconductor layer 108 is formed. Here, it is preferable to control the etching of the impurity semiconductor film 109 so that a part of the second semiconductor film 107 can remain in the depressed portion. After etching the impurity semiconductor film 109, it is preferable that a portion of the second semiconductor film 107 which remains in the depressed portion (the depressed portion of the second semiconductor layer 108) have approximately half the thickness of the second semiconductor film 107 before the etching. That is, after forming the pair of impurity semiconductor layers 110 by the etching, there is a difference in thickness of the second semiconductor layer under the impurity semiconductor layers 110, between regions which overlap with the impurity semiconductor layers 110 and a region which does not overlap with the impurity semiconductor layers 110 (a region which overlaps with a space between the separated impurity semiconductor layers 110). The reason is that in a process of forming the impurity semiconductor layers 110 that form the source region and the drain region, regions of the second semiconductor layer which overlap with the impurity semiconductor layers 110 are not etched, whereas a region of the second semiconductor layer which does not overlap with the impurity semiconductor layers 110 is etched.

Figure 4C:
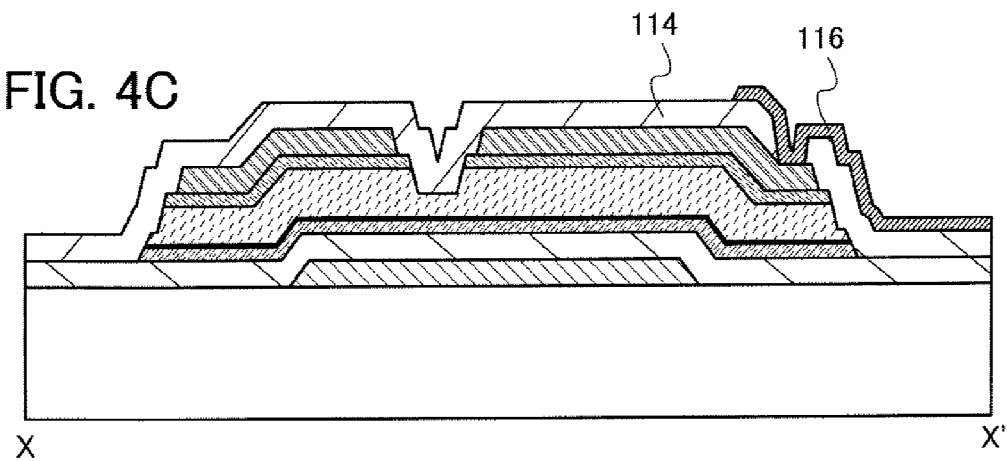

The second resist mask 132 is removed, so that the thin film transistor according to this embodiment mode can be manufactured (see FIG. 4C). In this embodiment mode, an example of forming a channel-etched inverted staggered thin film transistor has been described. A multi-tone photomask can reduce the number of photomasks used. Therefore, the number of manufacturing steps can be reduced.

The thin film transistor according to this embodiment mode can be applied to a switching transistor in a pixel of a display device typified by a liquid crystal display device or a light-emitting display device. Thus, the insulating layer 114 having the opening portion is formed to cover the thin film transistor, and the pixel electrode layer 116 is formed to be connected to the source electrode or the drain electrode that is formed with the pair of wiring layers 112 in the opening portion. This opening portion can be formed by a photolithography method. After forming the opening portion, the pixel electrode layer 116 is provided over the insulating layer 114 so as to be connected to the source electrode or the drain electrode in the opening portion (see FIG. 4C). In the above manner, the switching transistor shown in FIG. 1 in a pixel of a display device can be manufactured.

The insulating layer 114 can be formed in a similar manner to the gate insulating layer 102. It is preferable to provide the insulating layer 114 using dense silicon nitride so as to prevent entrance of contaminant impurity elements such as organic substances, metal substances, and water vapor in the atmosphere.

The pixel electrode layer 116 can be formed using a conductive composition containing a light-transmitting conductive high-molecular compound (also referred to as a "conductive polymer"). It is preferable that the pixel electrode layer 116 have a sheet resistance of 10,000 $\Omega/cm^2$ or less, and a light transmittance of 70% or more at a wavelength of 550 nm. In addition, it is preferable that the resistivity of the conductive high-molecular compound contained in the conductive composition be 0.1 $\Omega \cdot cm$ or less.

As the conductive high-molecular compound, a "$\pi$ electron conjugated conductive high-molecular compound" can be used. Examples thereof include polyaniline and derivatives thereof, polypyrrole and derivatives thereof, polythiophene and derivatives thereof, and copolymers of two or more kinds of them.

The pixel electrode layer 116 can be formed using indium oxide containing tungsten oxide, indium zinc oxide containing tungsten oxide, indium oxide containing titanium oxide, indium tin oxide containing titanium oxide, indium tin oxide (hereinafter also referred to as "ITO"), indium zinc oxide, indium tin oxide to which silicon oxide is added, or the like.

In a similar manner to the wiring layers 112 or the like, a pattern of the pixel electrode layer 116 may be formed by etching by a photolithography method.

Although not shown in the drawings, an insulating layer which is formed using an organic resin by a spin coating method or the like may be provided between the insulating layer 114 and the pixel electrode layer 116.

The thin film transistor according to this embodiment mode achieves favorable on current and off current by stacking the semiconductor layer including the plurality of crystalline regions (typically, a microcrystalline semiconductor layer) and the semiconductor layer having an amorphous structure (typically, an amorphous semiconductor layer). Further, the insulating layer is provided with a thickness small enough to allow carrier travel between the semiconductor layer including the plurality of crystalline regions and the semiconductor layer having an amorphous structure, whereby the layers can be separated from each other appropriately and variation in electric characteristics can be suppressed. Therefore, a thin film transistor having excellent electric characteristics can be obtained.

This embodiment mode can be combined with another embodiment mode as appropriate.

Embodiment Mode 2

In this embodiment mode, an example of a thin film transistor which is different from that in the preceding embodiment mode is described. Specifically, a semiconductor layer which includes a plurality of crystalline regions and has a different feature from that of the first semiconductor layer 104, which has been described in Embodiment Mode 1, is formed.

The semiconductor layer which includes the plurality of crystalline regions and is described in this embodiment mode functions as a channel formation region of the thin film transistor of this embodiment mode. Further, the semiconductor layer including the plurality of crystalline regions corresponds to the first semiconductor layer 104 in the thin film transistor shown in FIG. 1. In the semiconductor layer including the plurality of crystalline regions according to this embodiment mode, crystal grains formed of a crystalline semiconductor are dispersed in a semiconductor layer having an amorphous structure (see FIG. 6B).

A first semiconductor layer 154 includes a plurality of crystalline regions. The first semiconductor layer 154 has a first region 150 and a second region 152. The first region 150 includes an amorphous semiconductor. The second region 152 includes a semiconductor layer having a plurality of dispersed crystal grains 151 and an amorphous structure among the plurality of crystal grains 151. The first region 150 is over and in contact with the gate insulating layer 102, and has a thickness of t1 from the interface with the gate insulating layer 102. The second region 152 is over and in contact with the first region 150, and has a thickness of t2. That is, nucleation sites of the crystal grains 151 are controlled in a thickness direction of the first semiconductor layer 154 so that they can be present at t1 from the interface with the gate insulating layer 102. The nucleation sites of the crystal grains 151 are controlled with the concentration of nitrogen in the first semiconductor layer 154.

The crystal grains 151 have inverted conical or inverted pyramidal shapes. The "inverted conical or inverted pyramidal shape" means a three-dimensional shape that is enclosed by a base which is surrounded by a closed curve or a closed polyline and is formed with a plurality of planes, and one face including a line that connects a point on the closed curve or polyline with a vertex which is away from the base or plural faces including lines that connect points on the closed curve or polyline with a vertex; and the vertex exists on a substrate side. When each of the dispersed crystal nuclei grows along crystal orientation, the crystal grains grow from the crystal nuclei, a face thereof spreading in a direction which is perpendicular to growth directions of the crystals. The crystal grains 151 include single crystals or twin crystals. Here, crystal plane directions of a side surface of a crystal grain 151 having an inverted conical or inverted pyramidal shape are aligned and the line that connects a point on the closed curve or polyline with the vertex is straight (see FIG. 6B). Therefore, it can be considered that the crystal grain 151 is close to a single crystal or a form including twin crystals rather than a form including a plurality of crystals. In the case of including twin crystals, the number of dangling bonds is small; therefore, the number of defects and the amount of on current are small as compared to the case of including a plurality of crystals. Further, the number of grain boundaries and the amount of on current are large in the case of including twin crystals as compared to the case of including a plurality of crystals. Note that the crystal grain 151 may include a plurality of crystals.

Note that the "twin crystals" mean two different crystal grains bonded to each other with highly favorable consistency at a crystal boundary. In other words, the "twin crystals" have a structure in which crystal lattices continue at a crystal boundary so that a trap level due to crystal defects or the like is hardly formed. Thus, it can be considered that a crystal boundary does not exist substantially in a region having such a crystal structure.

Examples of an impurity element which suppresses or inhibits crystal nucleation are oxygen, nitrogen, and the like. The concentration of an impurity element (e.g. oxygen) in a semiconductor (typically, silicon) which does not trap carriers, reduces the coordination number of the semiconductor (typically, silicon), and generates dangling bonds is reduced. Therefore, it is preferable to reduce the oxygen concentration without reducing the nitrogen concentration. Specifically, it is preferable that the oxygen concentration be $5 \times 10^{18}/cm^3$ or less.

In this embodiment mode, further, the first semiconductor layer 154 is formed with nitrogen on a surface of the gate insulating layer 102. The nitrogen concentration is an important point to determine nucleation sites. When the first semiconductor layer 154 is formed over the gate insulating layer 102 on which nitrogen is present, first, the first region 150 is formed, and then, the second region 152 is formed. The position of the interface between the first region 150 and the second region 152 is determined by the nitrogen concentration. Crystal nuclei are generated in a portion having nitrogen concentrations of $1 \times 10^{20}/cm^3$ to $1 \times 10^{21}/cm^3$ inclusive, preferably $2 \times 10^{20}/cm^3$ to $7 \times 10^{20}/cm^3$ inclusive, so that the second region 152 is formed. That is, the nitrogen concentration is $1 \times 10^{20}/cm^3$ to $1 \times 10^{21}/cm^3$ inclusive, preferably $2 \times 10^{20}/cm^3$ to $7 \times 10^{20}/cm^3$ inclusive in generation points of crystal nuclei, from which the crystal grains 151 start to grow. In other words, the nitrogen concentrations at vertexes of the crystal grains 151 having inverted conical or inverted pyramidal shapes are $1 \times 10^{20}/cm^3$ to $1 \times 10^{21}/cm^3$ inclusive, preferably $2 \times 10^{20}/cm^3$ to $7 \times 10^{20}/cm^3$ inclusive.

Further, the nitrogen concentration gradually decreases as a distance from the gate insulating layer 102 becomes longer. It is preferable that the nitrogen concentration decrease by an order of magnitude in a region within 25 nm to 40 nm inclusive from the gate insulating layer 102, preferably, by an order of magnitude in a region within 30 nm to 35 nm inclusive from the gate insulating layer 102.

As described above, if an impurity element which inhibits crystal nucleation is contained at a high concentration (approximately $1 \times 10^{20}/cm^3$ or more), crystal growth is also inhibited; therefore, nitrogen to be contained in the first semiconductor layer 154 is added only to a surface on which the semiconductor layer is formed, or in an early stage of film formation of the semiconductor layer.

The insulating layer 106 is provided over and in contact with the first semiconductor layer 154, and the second semiconductor layer 108 having an amorphous structure is provided over and in contact with the insulating layer 106. The insulating layer 106 is provided for a surface of the first semiconductor layer 154, in which inverted conical or inverted pyramidal crystal grains are dispersed in a semiconductor layer having an amorphous structure, thereby separating the second semiconductor layer 108 having an amorphous structure from the first semiconductor layer 154. Further, the insulating layer 106 prevents the inverted conical or inverted pyramidal crystal grains in the first semiconductor layer 154 from growing into the second semiconductor layer 108 having an amorphous structure.

Figure 6B:
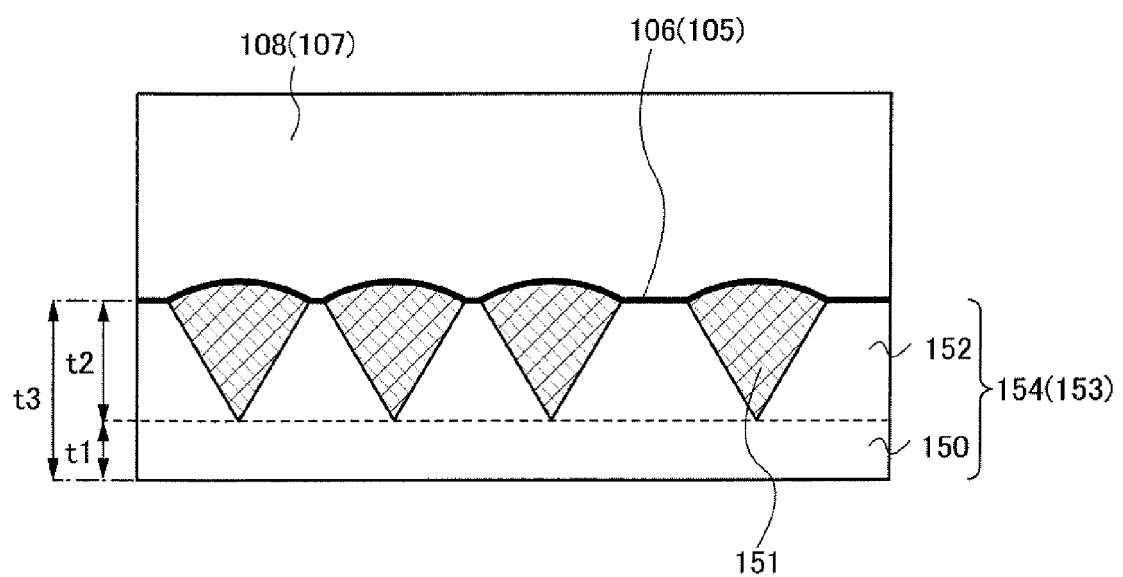

Next, a structure of a thin film transistor including the first semiconductor layer 154 shown in FIG. 6B instead of the first semiconductor layer 104 shown in FIG. 1, and a manufacturing method thereof are described.

Figure 7A:
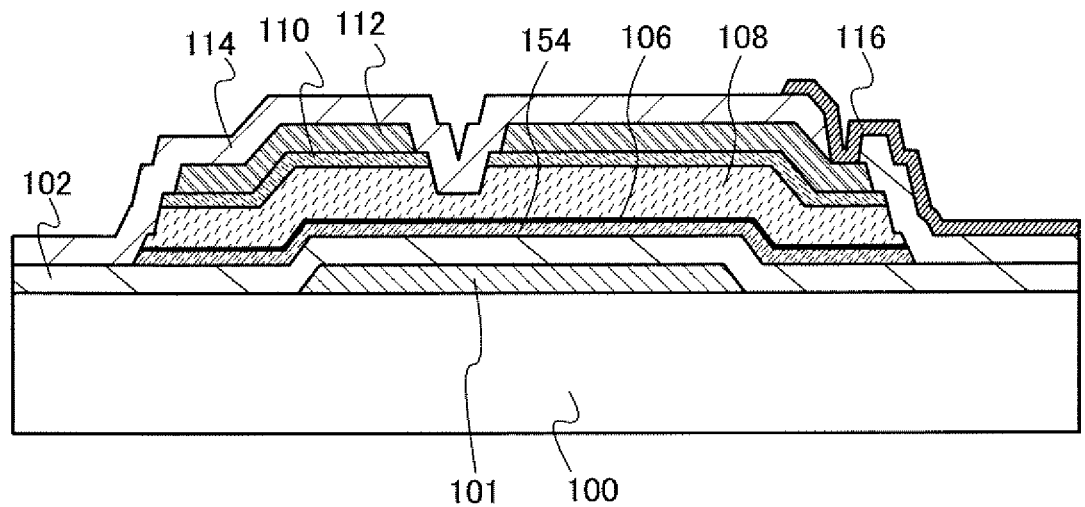
FIGS. 7A and 7B are cross-sectional views showing a structure of a thin film transistor of another mode.

FIG. 7A is a cross-sectional view of the thin film transistor according to this embodiment mode. In the thin film transistor shown in FIG. 7A, the first semiconductor layer 154 is included instead of the first semiconductor layer 104 of the thin film transistor shown in FIG. 1.

In the thin film transistor according to this embodiment mode, a stacked-layer structure of the first semiconductor layer 154, the insulating layer 106, and the second semiconductor layer 108 extends at least in a channel length direction, and continuously underlies the first portion and the second portion of the pair of wiring layers 112. The first semiconductor layer 154 is present on the gate insulating layer 102 side, and the second semiconductor layer 108 is present on the pair of impurity semiconductor layers 110 side that form the source region and the drain region. The insulating layer 106 is provided between the first semiconductor layer 154 and the second semiconductor layer 108.

Also in the thin film transistor of this embodiment mode, carriers travel through the first semiconductor layer 154 when the thin film transistor is on, and leakage current flows through the second semiconductor layer 108 when the thin film transistor is off. The first semiconductor layer 154 includes the crystal grains formed of a crystalline semiconductor, and thus has higher electric conductivity than the second semiconductor layer 108 having an amorphous structure; therefore, the thin film transistor in which a part of the channel formation region is formed using the first semiconductor layer 154 generates a higher on current than a thin film transistor in which a channel formation region is formed using an amorphous semiconductor. Further, the second semiconductor layer 108 having an amorphous structure has lower electric conductivity than the first semiconductor layer 154 including the crystal grains formed of a crystalline semiconductor; therefore, the thin film transistor in which a part of the channel formation region is formed using the second semiconductor layer 108 having an amorphous structure reduces an off current than a thin film transistor in which a channel formation region is formed using a microcrystalline semiconductor. That is, by providing the first semiconductor layer 154 on the gate insulating layer side and the second semiconductor layer 108 on the impurity semiconductor layers side that form the source region and the drain region as in the thin film transistor according to this embodiment mode, off current can be reduced, and further, on current can be increased.

Figure 7B:
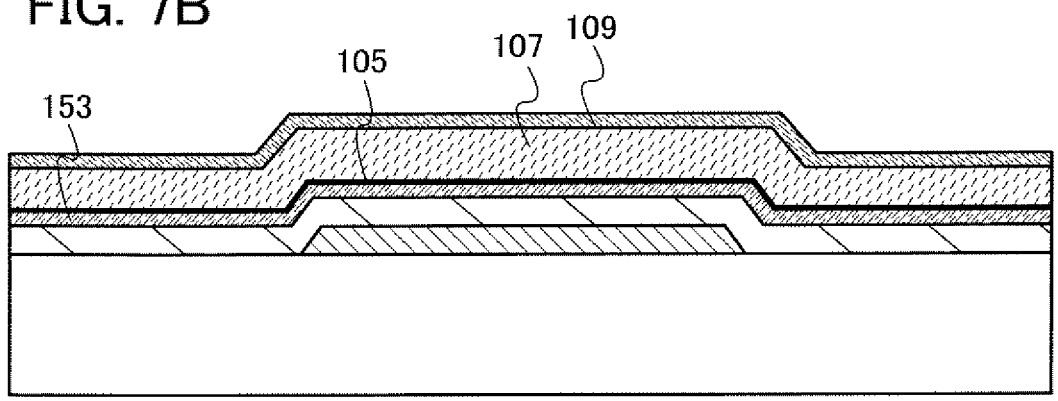

Hereinafter, a method for manufacturing the thin film transistor according to this embodiment mode is described. Here, methods for forming the first semiconductor layer 154, which characterize this mode, are described in detail. Further, methods for forming the gate insulating layer 102, the first semiconductor layer 154 (the first semiconductor film 153), the insulating film 105, the second semiconductor film 107, and the impurity semiconductor film 109 as shown in FIG. 7B are described. Structures of the other parts are formed by the manufacturing steps presented in Embodiment Mode 1.

It is preferable to form the first semiconductor layer 154 including the plurality of crystalline regions with a thickness of 2 nm to 60 nm inclusive, preferably 10 nm to 30 nm inclusive. Further, as described above, the first semiconductor layer 154 has inverted conical or inverted pyramidal crystal grains. The inverted conical or inverted pyramidal crystal grains can be formed, for example, by making the oxygen concentration of the first semiconductor layer 154 low, making the nitrogen concentration higher than the oxygen concentration, and reducing the nitrogen concentration in a direction of crystal grain growth, thereby controlling nucleation of crystal grains. Here, it is preferable that the nitrogen concentration be higher than the oxygen concentration by one or more orders of magnitude. Specifically, the oxygen concentration is $5\times10^{18}/cm^3$ or lower, and the nitrogen concentration is $1\times10^{20}/cm^3$ to $1\times10^{21}/cm^3$ inclusive at the interface between the gate insulating layer 102 and the first semiconductor layer 154. As typical examples of methods for forming a film with a low oxygen concentration and a higher nitrogen concentration than the oxygen concentration, the following (1) to (4) can be given.

A method for making the oxygen concentration low and making the nitrogen concentration higher than the oxygen concentration is (1) to make the gate insulating layer 102, which is in contact with the first semiconductor layer 154, contain nitrogen at a high concentration. Therefore, the gate insulating layer 102 is formed using silicon nitride.

Another method for making the oxygen concentration low and making the nitrogen concentration higher than the oxygen concentration is (2) to make a large amount of nitrogen present on a surface of the gate insulating layer 102 before forming the first semiconductor layer 154. In order to make a large amount of nitrogen present on the surface of the gate insulating layer 192, the surface of the gate insulating layer 102 may undergo treatment with plasma produced with a gas containing nitrogen, after forming the gate insulating layer 102 and before forming the first semiconductor layer 154. As the gas containing nitrogen here, ammonia can be given, for example.

Another method for making the oxygen concentration low and making the nitrogen concentration higher than the oxygen concentration is (3) to cover an inner wall of a treatment chamber for forming the first semiconductor layer 154 with a film containing nitrogen at a high concentration. As a material containing nitrogen at a high concentration, silicon nitride can be given, for example. The film which contains nitrogen at a high concentration and covers the inner wall of the treatment chamber may be formed at the same time as forming the gate insulating layer 102, which is preferable because the simultaneous film formation can simplify the process. Further, in such a case, an apparatus for forming the layers can be small because the gate insulating layer 102 and the first semiconductor layer 154 are formed in the same treatment chamber.

Another method for making the oxygen concentration low and making the nitrogen concentration higher than the oxygen concentration is (4) to make the oxygen concentration low and the nitrogen concentration high in a gas for forming the first semiconductor layer 154. In order to make the oxygen concentration low and the nitrogen concentration high in a gas for forming the first semiconductor layer 154, nitrogen may be introduced only to a gas which is used in an early stage of forming the first semiconductor layer 154, or the amount of nitrogen introduced may be reduced.

In this embodiment mode, any one of the methods (1) to (4) or combination thereof can be employed in forming the first semiconductor layer 154.

Figure 8:
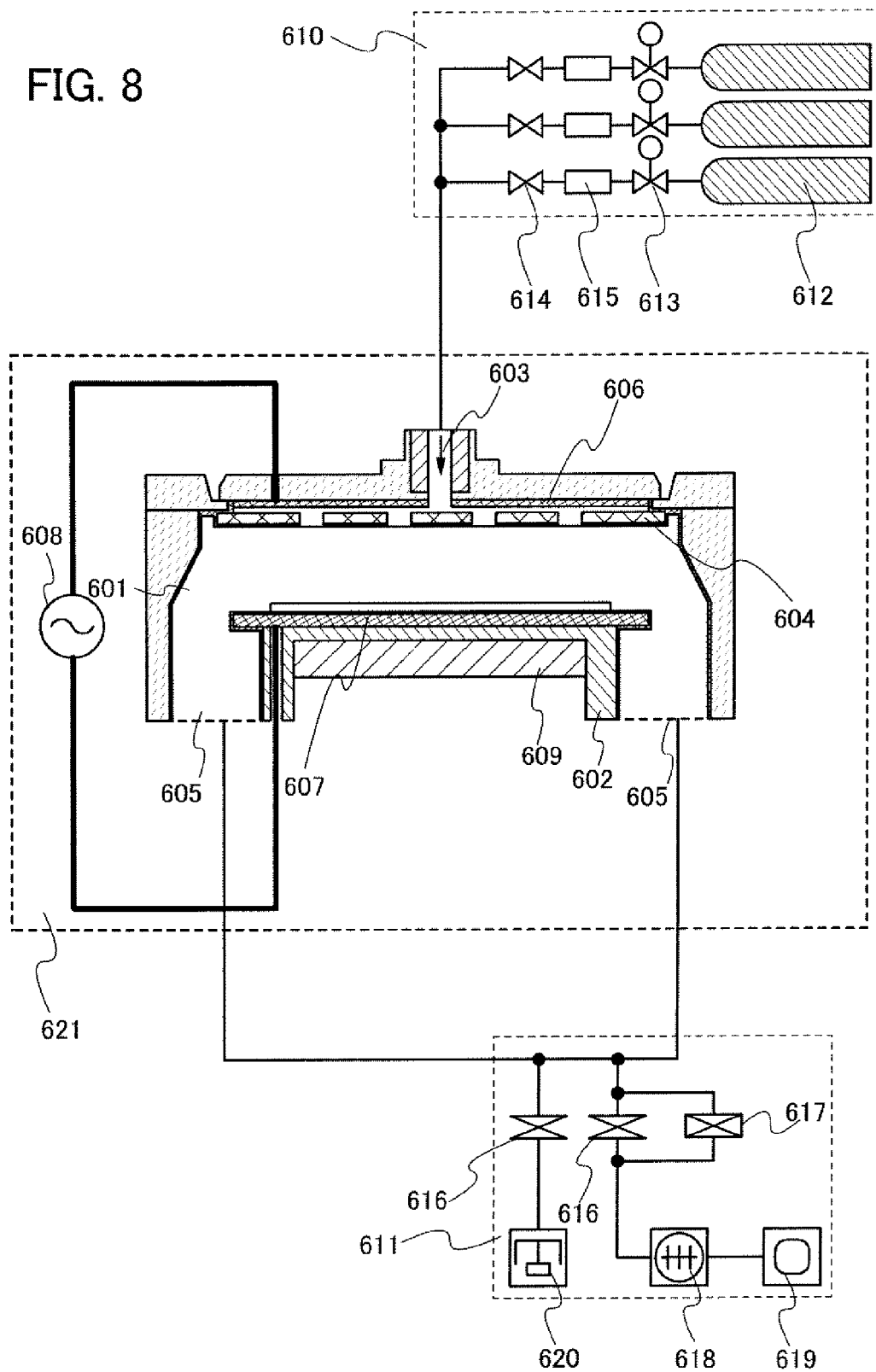
FIG. 8 is a drawing illustrating an apparatus applicable to manufacturing a thin film transistor.

Here, detailed description is made on an example of forming the gate insulating layer 102, the first semiconductor film 153 (the first semiconductor layer 154), the insulating film 105 (the insulating layer 106), the second semiconductor film 107 (the second semiconductor layer 108), and the impurity semiconductor film 109 (the pair of impurity semiconductor layers 110 that form the source region and the drain region) by a CVD method or the like. In this example, the gate insulating layer 102 has a stacked-layer structure in which a silicon oxynitride film is formed over a silicon nitride film. In such a structure, the silicon nitride film can prevent an element which is contained in the substrate and has an adverse influence on electric characteristics (e.g. sodium, when the substrate is a glass substrate) from entering the first semiconductor layer 154 and the like. FIG. 8 is a schematic view of a CVD apparatus which is used in forming these films.

A plasma CVD apparatus 621 shown in FIG. 8 is connected to a gas supply unit 610 and an exhaust unit 611.

The plasma CVD apparatus 621 shown in FIG. 8 is provided with a treatment chamber 601, a stage 602, a gas supply portion 603, a shower plate 604, an exhaust port 605, an upper electrode 606, a lower electrode 607, an alternate-current power source 608, and a temperature controller 609.

The treatment chamber 601 is formed using a stiff material, and the inside thereof can be vacuum-evacuated. The treatment chamber 601 is provided with the upper electrode 606 and the lower electrode 607. Although FIG. 8 shows a capacitive coupling (parallel plate) structure, another structure such as an inductive coupling type can also be employed as long as the structure enables plasma to be produced in the treatment chamber 601 by applying high frequency electric power with two or more frequencies.

When treatment is performed with the plasma CVD apparatus shown in FIG. 8, a predetermined gas is supplied through the gas supply portion 603. The supplied gas is introduced into the treatment chamber 601 through the shower plate 604. High frequency power is applied by the alternate-current power source 608 connected to the upper electrode 606 and the lower electrode 607 to excite the gas in the treatment chamber 601, thereby producing plasma. Further, the gas in the treatment chamber 601 is exhausted through the exhaust port 605 connected to a vacuum pump. Further, with the use of the temperature controller 609, plasma treatment can be performed while an object is being heated.

The gas supply unit 610 includes cylinders 612, which are filled with reaction gases, pressure control valves 613, stop valves 614, mass flow controllers 615, and the like. In the treatment chamber 601, the shower plate 604, which has a plate shape and has a plurality of pores, is provided between the upper electrode 606 and the lower electrode 607. A reaction gas to supply to the upper electrode 606 passes through a hollow portion in the upper electrode 606, and is supplied into the treatment chamber 601 through the pores.

The exhaust unit 611 connected to the treatment chamber 601 has a function of controlling the pressure in the treatment chamber 601 so as to retain a given pressure in the treatment chamber when the treatment chamber 601 is vacuum-evacuated or supplied with a reaction gas. The exhaust unit 611 includes butterfly valves 616, a conductance valve 617, a turbo-molecular pump 618, a dry pump 619, and the like. In a case where the butterfly valve 616 and the conductance valve 617 are disposed in parallel, the butterfly valve 616 is closed and the conductance valve 617 is operated, whereby the pumping speed of a reaction gas is controlled, and thus, the pressure in the treatment chamber 601 can be kept in a predetermined range. Further, when the butterfly valve 616 with large conductance is opened, high vacuum evacuation can be carried out.

When the treatment chamber 601 undergoes ultrahigh vacuum evacuation to a pressure lower than $10^{-5}$ Pa, a cryopump 620 is preferably used in combination with the above pumps. Further, it is effective to process an inner wall of the treatment chamber 601 to form a mirror surface and to provide a heater for baking in order to reduce a gas released from the inner wall, in attaining the degree of ultrahigh vacuum as the ultimate vacuum.

If precoating treatment is performed so as to cover the entire inner wall of the treatment chamber 601 with a film as shown in FIG. 8, entrance of impurity elements on the inner wall of the treatment chamber or of impurity elements that constitute the inner wall of the treatment chamber into an element can be prevented. In this embodiment mode, a film that mainly contains silicon may be formed in precoating treatment. For example, an amorphous silicon film or the like may be formed. Note that it is preferable that this film do not contain oxygen.

Next, a process of forming the gate insulating layer 102, the first semiconductor film 153, the insulating film 105, the second semiconductor film 107, and the impurity semiconductor film 109 by the method (2) is described with reference to FIG. 9. In this example, the gate insulating layer 102 has a stacked-layer structure in which a silicon oxynitride film is formed over a silicon nitride film, and the surface of the gate insulating layer 102 is supplied with nitrogen by exposing the gate insulating layer 102 to ammonia.

Figure 9:
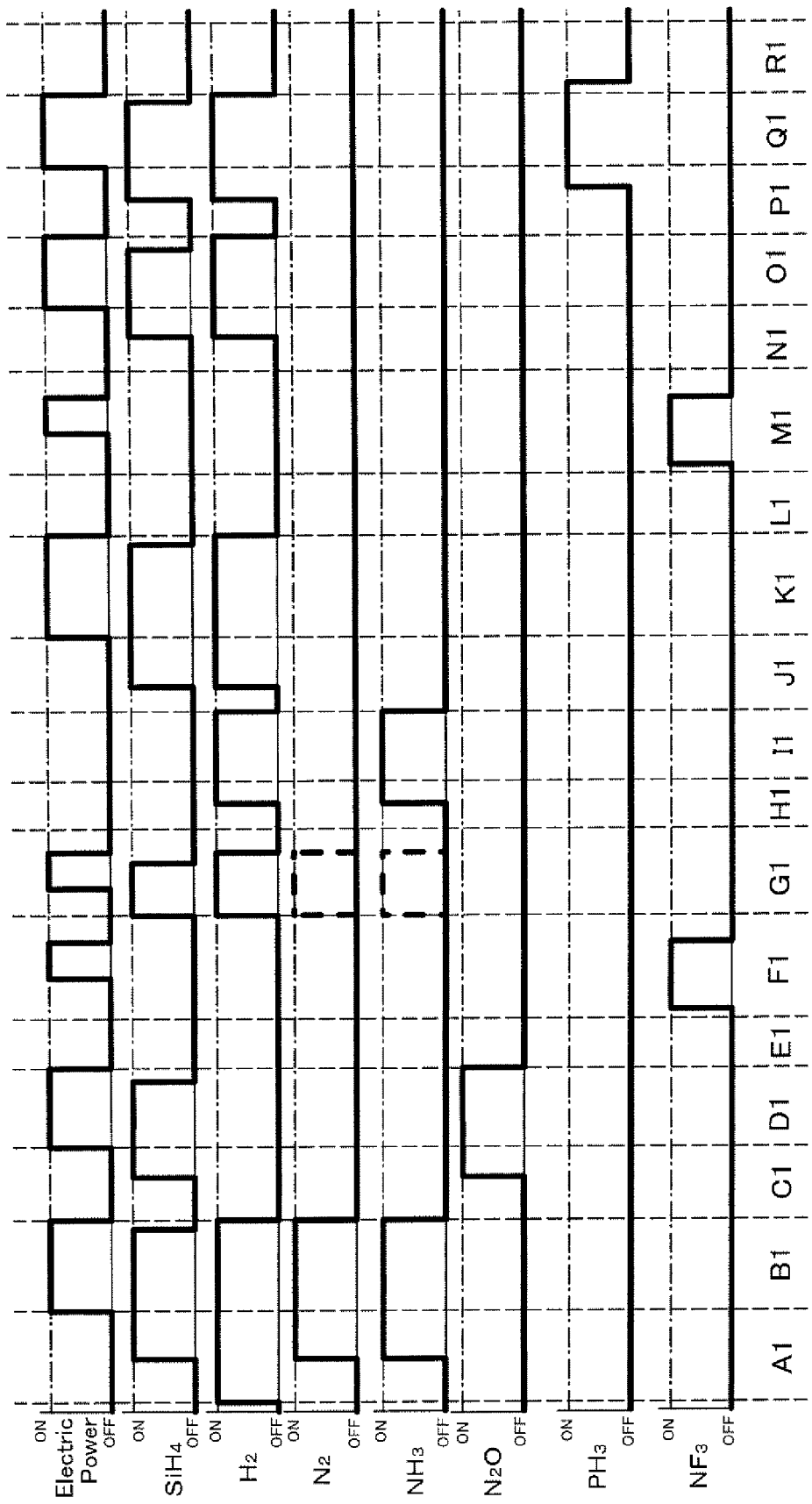
FIG. 9 is a chart illustrating an example of a method for manufacturing a thin film transistor.

First, the substrate 100 provided with the gate electrode layer 101 is heated in the treatment chamber 601 of the CVD apparatus, and source gases for forming a silicon nitride film are introduced into the treatment chamber 601 in order to form the silicon nitride film ("pretreatment A1" in FIG. 9). Here, as an example, $SiH_4$, $H_2$, $N_2$, and $NH_3$ are introduced as source gases at flow rates of 40 sccm, 500 sccm, 550 sccm, and 140 sccm, respectively, and are stabilized; further, the pressure in the treatment chamber is set to be 100 Pa, and the substrate temperature is set to be 280° C., and plasma discharge is performed at 370 W, whereby a silicon nitride film with a thickness of 110 nm approximately is formed. After that, supply of $SiH_4$ only is halted, and several seconds later, plasma discharge is halted ("formation of SiN film B1" in FIG. 9). The reason is that if plasma discharge is halted when $SiH_4$ is present in the treatment chamber, grains or powders that mainly contain silicon are formed, thereby reducing the yield.

Next, introduction of the source gases for forming the silicon nitride film is halted, and source gases for forming a silicon oxynitride film are introduced into the treatment chamber 601 ("replacement of gases C1" in FIG. 9). Here, as an example, $SiH_4$ and $N_2O$ are introduced as source gases at flow rates of 30 sccm and 1200 sccm, respectively, and are stabilized; further, the pressure in the treatment chamber is set to be 40 Pa, and the substrate temperature is set to be 280° C., and plasma discharge is performed at 50 W, whereby a silicon oxynitride film with a thickness of 110 nm approximately is formed. After that, in a similar manner to the silicon nitride film, supply of $SiH_4$ only is halted, and several seconds later, plasma discharge is halted ("formation of SiON film D1" in FIG. 9).

Through the above process, the gate insulating layer 102 can be formed. After forming the gate insulating layer 102, the substrate 100 is taken out of the treatment chamber 601 ("unload E1" in FIG. 9).

After taking the substrate 100 out of the treatment chamber 601, an $NF_3$ gas, for example, is introduced into the treatment chamber 601 to clean the inside of the treatment chamber 601 ("cleaning treatment F1" in FIG. 9). After that, treatment for forming a protective film on the inner wall of the treatment chamber is performed. Here, as an example, $SiH_4$ is introduced as a source gas at a flow rate of 300 sccm and is stabilized; further, the pressure in the treatment chamber is set to be 160 Pa, and the substrate temperature is set to be 280° C., and plasma discharge is performed with output of 120 W, whereby an amorphous silicon film is formed as the protective film. After that, supply of $SiH_4$ is halted, and several seconds later, plasma discharge is halted ("precoating treatment G1" in FIG. 9).

In the precoating treatment, instead of the amorphous silicon film, a silicon nitride film may be formed as the protective film under the same conditions of forming the silicon nitride film as the gate insulating layer, as designated by a dotted line in FIG. 9.

After that, the substrate 100 is taken into the treatment chamber 601, and an ammonia gas is introduced into the treatment chamber 601 ("load H1" in FIG. 9).

Subsequently, nitrogen is supplied to the surface of the gate insulating layer 102. In this example, the surface of the gate insulating layer 102 is exposed to an ammonia gas, thereby supplying nitrogen to the surface of the gate insulating layer 102 ("flushing treatment I1" in FIG. 9). Further, hydrogen may be contained in the ammonia gas. Here, as a preferred example, the pressure in the treatment chamber 601 is set to be 20 Pa to 30 Pa approximately, and the substrate temperature is set to be 280° C., and the treatment time is set to be 60 seconds. Although the substrate 100 provided with the gate insulating layer 102 is only exposed to the ammonia gas in this example, plasma treatment may be performed in this step. After that, introduction of the gas for this treatment is halted, and source gases for forming the first semiconductor film 153, from which the first semiconductor layer 154 is formed, are introduced into the treatment chamber 601 ("replacement of gases J1" in FIG. 9).

Next, the first semiconductor film 153 is formed over the entire surface of the gate insulating layer 102 supplied with nitrogen. In a later step, the first semiconductor film 153 is patterned into the first semiconductor layer 154. First, the source gases for forming the first semiconductor film 153 are introduced into the treatment chamber. Here, as an example, SiH$_4$ and H$_2$ are introduced as semiconductor source gases at flow rates of 10 sccm and 1500 sccm, respectively, and are stabilized; further, the pressure in the treatment chamber is set to be 280 Pa, and the substrate temperature is set to be 280° C., and plasma discharge is performed at 50 W, whereby a semiconductor film with a thickness of 50 nm approximately can be fainted. After that, in a similar manner to the above silicon nitride film and the like, supply of SiH$_4$ only is halted, and several seconds later, plasma discharge is halted ("formation of semiconductor film K1" in FIG. 9).

In the above example, with regard to the source gases for forming the first semiconductor film 153, the flow rate of H$_2$ is 150 times that of SiH$_4$; therefore, silicon is deposited gradually.

The surface of the gate insulating layer 102 in this embodiment mode is supplied with nitrogen. As described above, nitrogen inhibits nucleation of silicon crystals. Therefore, nuclei of silicon crystals are not generated in an early stage of the film formation. The layer formed in an early stage of the film formation is the first region 150 shown in FIG. 6B. Since the first semiconductor film 153 is formed under unvarying conditions, the first region 150 and the second region 152 are formed under the same film formation conditions. Nitrogen is supplied to the surface of the gate insulating layer 102 and the first semiconductor film 153 is formed over the surface as described above, whereby the semiconductor film containing nitrogen (the first region 150 shown in FIG. 6B) is formed. Formation of the first semiconductor film 153 proceeds with the nitrogen concentration reduced, and crystal nuclei are generated when the nitrogen concentration falls below (or reaches) a given value. After that, the crystal nuclei grow, so that the crystal grains 151 are formed.

Subsequently, introduction of the source gases for forming the first semiconductor film 153 is halted, and the substrate 100 is taken out of the treatment chamber 601 to an air atmosphere ("unload and formation of insulating film L1" in FIG. 9). The substrate 100 provided with the first semiconductor film 153 is exposed to the atmosphere, thereby forming a native oxide film over the first semiconductor film 153; thus, the insulating film 105 can be formed.

After taking the substrate 100 out of the treatment chamber 601, an NF$_3$ gas, for example, is introduced into the treatment chamber 601 to clean the inside of the treatment chamber 601 ("cleaning treatment M1" in FIG. 9).

Then, the substrate 100 is taken into the treatment chamber 601 ("load N1" in FIG. 9), and the second semiconductor film 107 is formed over the entire surface of the insulating film 105 formed over the first semiconductor film 153. In a later step, the second semiconductor film 107 is patterned into the second semiconductor layer 108. First, source gases for forming the second semiconductor film 107 are introduced into the treatment chamber. Here, as an example, SiH$_4$ and H$_2$ are introduced as the source gases at flow rates of 280 sccm and 300 sccm, respectively, and are stabilized; further, the pressure in the treatment chamber is set to be 170 Pa, and the substrate temperature is set to be 280° C., and plasma discharge is performed at 60 W, whereby a semiconductor film with a thickness of 150 nm approximately can be formed. After that, in a similar manner to the above silicon nitride film and the like, supply of SiH$_4$ only is halted, and several seconds later, plasma discharge is halted ("formation of a-Si film O1" in FIG. 9). After that, introduction of the gas for this treatment is halted, and gases for forming the impurity semiconductor film 109 are introduced ("replacement of gases P1" in FIG. 9).

The impurity semiconductor film 109 is formed over the entire surface of the second semiconductor film 107. In a later step, the impurity semiconductor film 109 is patterned into the pair of impurity semiconductor layers 110 that form the source region and the drain region. First, the source gases for forming the impurity semiconductor film 109 are introduced into the treatment chamber 601. Here, as an example, SiH$_4$ and 0.5 vol. % PH$_3$ diluted with H$_2$ are introduced as the source gases at flow rates of 100 sccm and 170 sccm, respectively, and are stabilized. The pressure in the treatment chamber 601 is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of SiH$_4$ only is halted, and several seconds later, plasma discharge is halted ("formation of impurity semiconductor film Q1" in FIG. 9). After that, these gases are exhausted ("exhaust R1" in FIG. 9).

In the above manner, films up to the impurity semiconductor film 109, which are similar to those shown in FIG. 2E, can be formed. In this embodiment mode, the first semiconductor film 153 is formed instead of the first semiconductor film 103.

Next, as another method for forming the first semiconductor layer 154 (the first semiconductor film 153) including the inverted conical or inverted pyramidal crystal grains, an example of employing the method (1) is described.

In this method, the gate insulating layer in contact with the semiconductor layer is formed using silicon nitride, thereby controlling the nitrogen concentration in the semiconductor layer; thus, the semiconductor layer including the inverted conical or inverted pyramidal crystal grains is formed. Hereinafter, description is made on formation of the gate insulating layer 102, the first semiconductor film 153, the insulating film 105, the second semiconductor film 107, and the impurity semiconductor film 109 with reference to FIG. 10.

Figure 10:
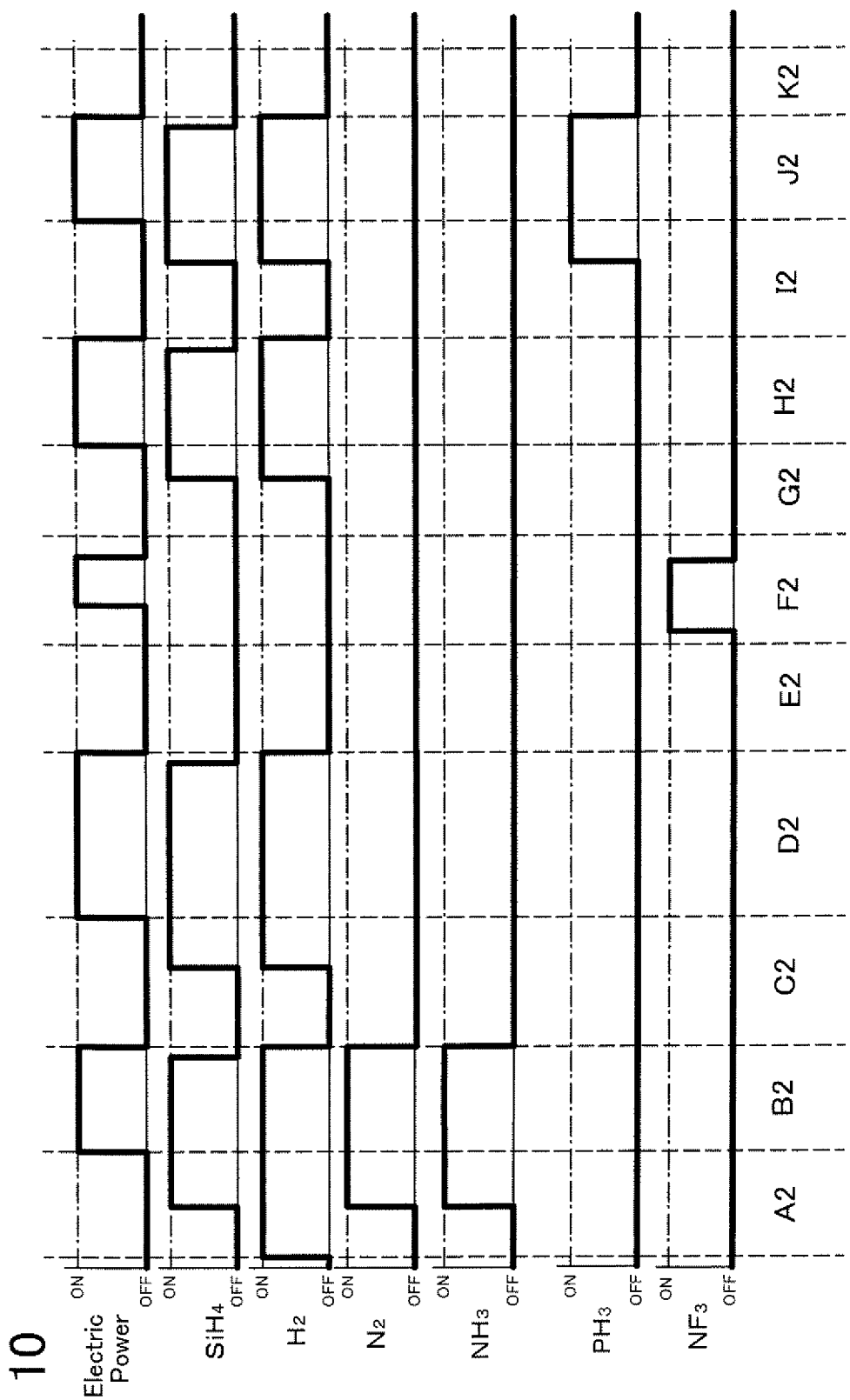
FIG. 10 is a chart illustrating an example of a method for manufacturing a thin film transistor.

First, the substrate 100 provided with the gate electrode layer 101 is heated in the treatment chamber of the CVD apparatus, and source gases for forming a silicon nitride film are introduced into the treatment chamber in order to form the silicon nitride film ("pretreatment A2" in FIG. 10). Here, as an example, SiH$_4$, H$_2$, N$_2$, and NH$_3$ are introduced as the source gases at flow rates of 40 sccm, 500 sccm, 550 sccm, and 140 sccm, respectively, and are stabilized; further, the pressure in the treatment chamber is set to be 100 Pa, the substrate temperature is set to be 280° C., and plasma discharge is performed at 370 W, whereby a silicon nitride film with a thickness of 300 nm approximately is formed. After that, supply of SiH$_4$ only is halted, and several seconds later, plasma discharge is halted ("formation of SiN film B2" in FIG. 10).

Then, introduction of the source gases for forming the silicon nitride film is halted, and source gases for forming the first semiconductor film 153 are introduced into the treatment chamber ("replacement of gases C2" in FIG. 10).

Next, the first semiconductor film 153 is formed over the entire surface of the gate insulating layer 102. In a later step, the first semiconductor film 153 is patterned into the first semiconductor layer 154. First, the source gases for forming the first semiconductor film 153 are introduced into the treatment chamber. Here, as an example, SiH$_4$ and H$_2$ are introduced as the source gases at flow rates of 10 sccm and 1500 sccm, respectively, and are stabilized; further, the pressure in the treatment chamber is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of SiH$_4$ only is halted, and several seconds later, plasma discharge is halted ("formation of semiconductor film D2" in FIG. 10).

In the above example, with regard to the source gases for forming the first semiconductor film 153, the flow rate of H$_2$ is 150 times that of SiH$_4$; therefore, silicon is deposited gradually.

In this example, a large amount of nitrogen is present on the surface of the gate insulating layer 102 because at least the top layer in the gate insulating layer 102 in contact with the first semiconductor film 153 is formed using silicon nitride. As described above, nitrogen inhibits nucleation of silicon crystals. Therefore, crystal nuclei of silicon are not generated in an early stage of the film formation. The layer formed in an early stage of the film formation is the first region 150 shown in FIG. 6B. Since the first semiconductor film 153 is formed under unvarying conditions, the first region 150 and the second region 152 are formed under the same conditions. Nitrogen is supplied to the surface of the gate insulating layer 102 and the first semiconductor film 153 is formed over the surface as described above, whereby the semiconductor film containing nitrogen (the first region 150 shown in FIG. 6B) is formed. Formation of the semiconductor film proceeds with the nitrogen concentration reduced, and crystal nuclei are generated when the nitrogen concentration falls below (or reaches) a given value. After that, the crystal nuclei grow, so that the crystal grains 151 are formed. Note that in generation points of crystal nuclei, from which the crystal grains 151 start to grow, the nitrogen concentrations are 1×10$^{20}$/cm$^3$ to 1×10$^{21}$/cm$^3$ inclusive, preferably 2×10$^{20}$/cm$^3$ to 7×10$^{20}$/cm$^3$ inclusive.

Examples of an impurity element which inhibits crystal nucleation are oxygen, nitrogen, and the like. The concentration of an impurity element (e.g. oxygen) in silicon which does not trap carriers, reduces the coordination number of silicon, and generates dangling bonds is reduced. Therefore, it is preferable to reduce the oxygen concentration without reducing the nitrogen concentration. Specifically, it is preferable that the oxygen concentration be 5×10$^{18}$/cm$^3$ or less.

Subsequently, introduction of the source gases for forming the first semiconductor film 153 is halted, and the substrate 100 is taken out of the treatment chamber 601 to an air atmosphere ("unload and formation of insulating film E2" in FIG. 10). The substrate 100 provided with the first semiconductor film 153 is exposed to the atmosphere, thereby forming a native oxide film over the first semiconductor film 153; thus, the insulating film 105 can be formed.

After taking the substrate 100 out of the treatment chamber 601, an NF$_3$ gas, for example, is introduced into the treatment chamber 601 to clean the inside of the treatment chamber 601 ("cleaning treatment F2" in FIG. 10).

Then, the substrate 100 is taken into the treatment chamber 601 ("load G2" in FIG. 10), and the second semiconductor film 107 is formed over the entire surface of the insulating film 105 formed over the first semiconductor film 153. In a later step, the second semiconductor film 107 is patterned into the second semiconductor layer 108. First, source gases for forming the second semiconductor film 107 are introduced into the treatment chamber. Here, as an example, SiH$_4$ and H$_2$ are introduced as the source gases at flow rates of 280 sccm and 300 sccm, respectively, and are stabilized; further, the pressure in the treatment chamber is set to be 170 Pa, and the substrate temperature is set to be 280° C., and plasma discharge is performed at 60 W, whereby a semiconductor film with a thickness of 150 nm approximately can be formed. After that, in a similar manner to the above silicon nitride film and the like, supply of SiH$_4$ only is halted, and several seconds later, plasma discharge is halted ("formation of a-Si film H2" in FIG. 10). After that, introduction of the gas for this treatment is halted, and gases for forming the impurity semiconductor film 109 are introduced ("replacement of gases I2" in FIG. 10).

The impurity semiconductor film 109 is formed over the entire surface of the second semiconductor film 107. In a later step, the impurity semiconductor film 109 is patterned into the pair of impurity semiconductor layers 110 that form the source region and the drain region. First, the source gases for forming the impurity semiconductor film 109 are introduced into the treatment chamber. Here, as an example, SiH$_4$ and 0.5 vol. % PH$_3$ diluted with H$_2$ are introduced as the source gases at flow rates of 100 sccm and 170 sccm, respectively, and are stabilized; further, the pressure in the treatment chamber is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of SiH$_4$ only is halted, and several seconds later, plasma discharge is halted ("formation of impurity semiconductor film J2" in FIG. 10). After that, these gases are exhausted ("exhaust K2" in FIG. 10).

By forming at least a portion of the gate insulating layer which is in contact with the semiconductor film (the semiconductor layer) using silicon nitride as described above, the oxygen concentration can be low and the nitrogen concentration can be higher than the oxygen concentration; further, the first semiconductor film 153 (the first semiconductor layer 154) including the inverted conical or inverted pyramidal crystal grains can be formed.

Next, as another method for forming the first semiconductor layer 154 (the first semiconductor film 153) including the inverted conical or inverted pyramidal crystal grains, an example of employing the method (3) is described.

In this method, the inside of the treatment chamber is cleaned before forming the semiconductor film (the semiconductor layer), and the inner wall of the chamber is covered with a silicon nitride film to make the semiconductor layer contain nitrogen, thereby making the oxygen concentration low and the nitrogen concentration higher than the oxygen concentration. Hereinafter, description is made on formation of the gate insulating layer 102, the first semiconductor film 153, the insulating film 105, the second semiconductor film 107, and the impurity semiconductor film 109 with reference to FIG. 11.

Figure 11:
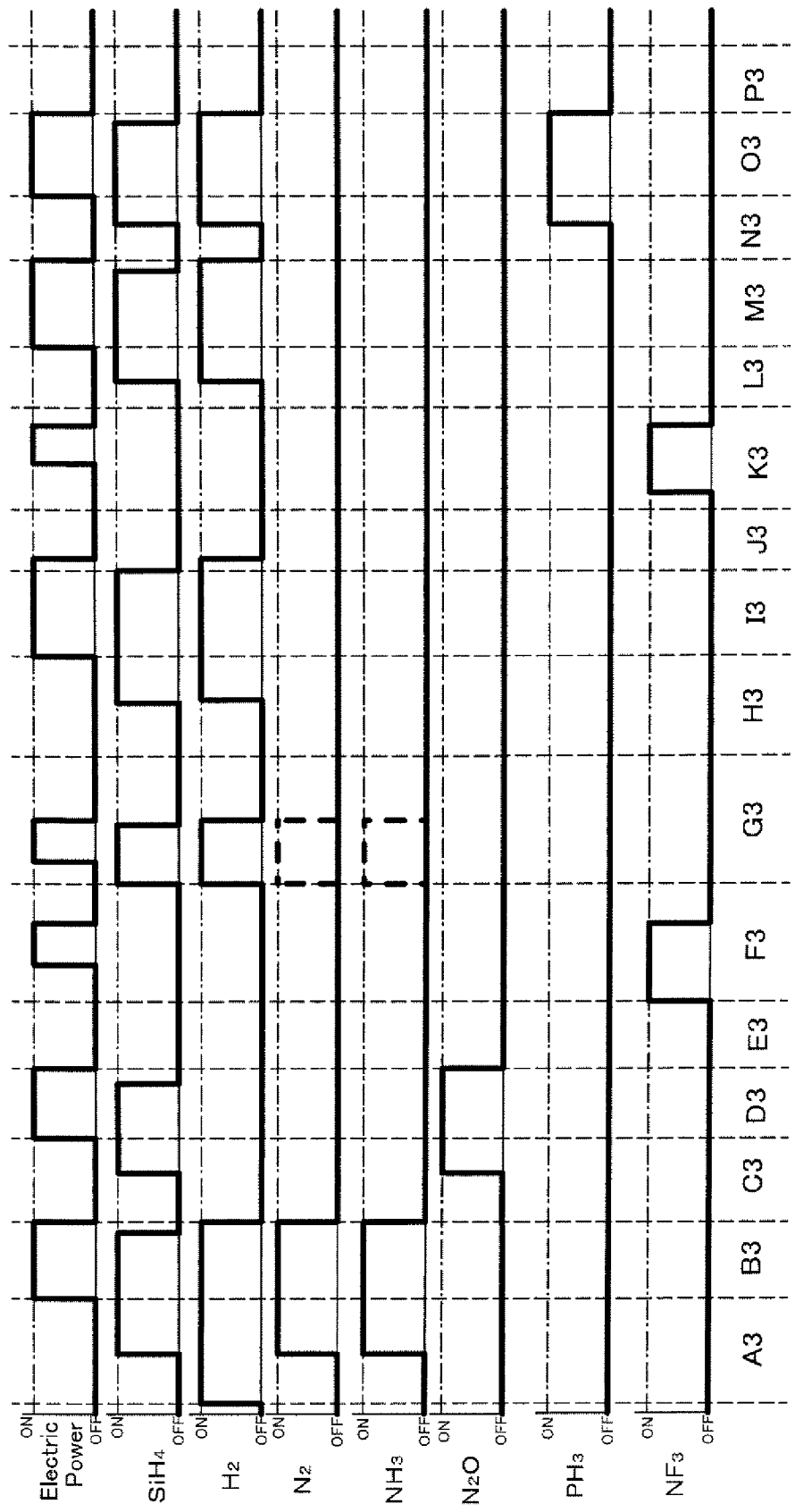
FIG. 11 is a chart illustrating an example of a method for manufacturing a thin film transistor.

First, the substrate 100 provided with the gate electrode layer 101 is heated in the treatment chamber of the CVD apparatus, and source gases for forming a silicon nitride film are introduced into the treatment chamber in order to form the silicon nitride film ("pretreatment A3" in FIG. 11). Here, as an example, $SiH_4$, $H_2$, $N_2$, and $NH_3$ are introduced as the source gases at flow rates of 40 sccm, 500 sccm, 550 sccm, and 140 sccm, respectively, and are stabilized; further, the pressure in the treatment chamber is set to be 100 Pa, and the substrate temperature is set to be 280° C., and plasma discharge is performed at 370 W, whereby a silicon nitride film with a thickness of 110 nm approximately is formed. After that, supply of $SiH_4$ only is halted, and several seconds later, plasma discharge is halted ("formation of SiN film B3" in FIG. 11).

Next, introduction of the source gases for forming the silicon nitride film is halted, and source gases for forming a silicon oxynitride film are introduced into the treatment chamber ("replacement of gases C3" in FIG. 11). Here, as an example, $SiH_4$ and $N_2O$ are introduced as the source gases at flow rates of 30 sccm and 1200 sccm, respectively, and are stabilized; further, the pressure in the treatment chamber is set to be 40 Pa, and the substrate temperature is set to be 280° C., and plasma discharged is performed at 50 W, whereby a silicon oxynitride film with a thickness of 110 nm approximately is formed. After that, in a similar manner to the silicon nitride film and the like, supply of $SiH_4$ only is halted, and several seconds later, plasma discharge is halted ("formation of SiON film D3" in FIG. 11).

Through the above process, the gate insulating layer 102 can be formed. After forming the gate insulating layer 102, the substrate 100 is taken out of the treatment chamber 601 ("unload E3" in FIG. 11).

After taking the substrate 100 provided with the gate insulating layer 102 out of the treatment chamber 601, an $NF_3$ gas is introduced into the treatment chamber 601 to clean the inside of the treatment chamber ("cleaning treatment F3" in FIG. 11). After that, treatment for forming a silicon nitride film is performed in a similar manner to the gate insulating layer 102 ("precoating treatment G3" in FIG. 11). By this treatment, a silicon nitride film is formed on the inner wall of the treatment chamber 601. After that, the substrate 100 is taken into the treatment chamber 601, and source gases for forming the first semiconductor film 153 are introduced into the treatment chamber ("load H3" in FIG. 11).

Next, the first semiconductor film 153 is formed over the entire surface of the gate insulating layer 102. In a later step, the first semiconductor film 153 is patterned into the first semiconductor layer 154. First, the source gases for forming the first semiconductor film 153 are introduced into the treatment chamber. Here, as an example, $SiH_4$ and $H_2$ are introduced as the source gases at flow rates of 10 sccm and 1500 sccm, respectively, and are stabilized; further, the pressure in the treatment chamber is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of $SiH_4$ only is halted, and several seconds later, plasma discharge is halted ("formation of semiconductor film I3" in FIG. 11).

In the above example, with regard to the source gases for forming the first semiconductor film 153, the flow rate of $H_2$ is 150 times that of $SiH_4$; therefore, silicon is deposited gradually.

Nitrogen is present on the surface of the gate insulating layer 102 in this embodiment mode. As described above, nitrogen inhibits nucleation of silicon crystals. Therefore, silicon crystal nuclei are not generated in an early stage of the film formation. The layer formed in an early stage of the film formation is the first region 150 shown in FIG. 6B. Since the first semiconductor film 153 is formed under unvarying conditions, the first region 150 and the second region 152 are formed under the same conditions. Nitrogen is supplied to the surface of the gate insulating layer 102 and the first semiconductor film 153 is formed over the surface as described above, whereby the semiconductor film containing nitrogen (the first region 150 shown in FIG. 6B) is formed. Formation of the semiconductor film proceeds with the nitrogen concentration reduced, and crystal nuclei are generated when the nitrogen concentration falls below (or reaches) a given value. After that, the crystal nuclei grow, so that the crystal grains 151 are formed.

Subsequently, introduction of the source gas for forming the first semiconductor film 153 is halted, and the substrate 100 is taken out of the treatment chamber 601 to an air atmosphere ("unload and formation of insulating film J3" in FIG. 11). The substrate 100 provided with the first semiconductor film 153 is exposed to the atmosphere, thereby forming a native oxide film over the first semiconductor film 153; thus, the insulating film 105 can be formed.

After taking the substrate 100 out of the treatment chamber 601, an $NF_3$ gas, for example, is introduced into the treatment chamber 601 to clean the inside of the treatment chamber 601 ("cleaning treatment K3" in FIG. 11).

Then, the substrate 100 is taken into the treatment chamber 601 ("load L3" in FIG. 11), and the second semiconductor film 107 is formed over the entire surface of the insulating film 105 formed over the first semiconductor film 153. In a later step, the second semiconductor film 107 is patterned into the second semiconductor layer 108. First, source gases for forming the second semiconductor film 107 are introduced into the treatment chamber. Here, as an example, $SiH_4$ and $H_2$ are introduced as the source gases at flow rates of 280 sccm and 300 sccm, respectively, and are stabilized; further, the pressure in the treatment chamber is set to be 170 Pa, and the substrate temperature is set to be 280° C., and plasma discharge is performed at 60 W, whereby a semiconductor film with a thickness of 150 nm approximately can be formed. After that, in a similar manner to the above silicon nitride film and the like, supply of $SiH_4$ only is halted, and several seconds later, plasma discharge is halted ("formation of a-Si film M3" in FIG. 11). After that, introduction of the gas for this treatment is halted, and gases for forming the impurity semiconductor film 109 are introduced ("replacement of gases N3" in FIG. 11).

The impurity semiconductor film 109 is formed over the entire surface of the second semiconductor film 107. In a later step, the impurity semiconductor film 109 is patterned into the pair of impurity semiconductor layers 110 that form the source region and the drain region. First, source gases for fanning the impurity semiconductor film 109 are introduced into the treatment chamber. Here, as an example, $SiH_4$ and 0.5 vol. % $PH_3$ diluted with $H_2$ are introduced at flow rates of 100 sccm and 170 sccm, respectively, to stabilize the source gases; further, the pressure in the treatment chamber is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of $SiH_4$ only is halted, and several seconds later, plasma discharge is halted ("formation of impurity semiconductor film O3" in FIG. 11). After that, these gases are exhausted ("exhaust P3" in FIG. 11).

As described above, by covering the inner wall of the treatment chamber with the silicon nitride film at least just before forming the semiconductor film, the oxygen concentration can be low and the nitrogen concentration can be higher than the oxygen concentration; further, the semiconductor film (the semiconductor layer) including the inverted conical or inverted pyramidal crystal grains can be formed.

Further, covering the inner wall of the treatment chamber with the silicon nitride film can prevent elements that constitute the inner wall of the treatment chamber and the like from entering the semiconductor film (the semiconductor layer).

In the above description, since the silicon oxynitride film is formed over the silicon nitride film as the gate insulating layer 102, the cleaning treatment and the precoating treatment is performed after forming the gate insulating layer 102; however, the method (3) can be combined with the method (1). That is, the gate insulating layer 102 may be formed using silicon nitride, thereby achieving both the formation of the gate insulating layer 102 and the precoating treatment. If the formation of the gate insulating layer 102 also achieves the precoating treatment, the process is simplified, and the throughput can be improved.

Next, as another method for forming the first semiconductor layer 154 (the first semiconductor film 153) including the inverted conical or inverted pyramidal crystal grains, an example of employing the method (4) is described.

In this method, nitrogen is mixed into a gas for forming the semiconductor film (the semiconductor layer) in an early stage of the film formation, thereby making the oxygen concentration low and the nitrogen concentration higher than the oxygen concentration. Hereinafter, description is made on formation of the gate insulating layer 102, the first semiconductor film 153, the insulating film 105, the second semiconductor film 107, and the impurity semiconductor film 109 with reference to FIG. 12.

Figure 12:
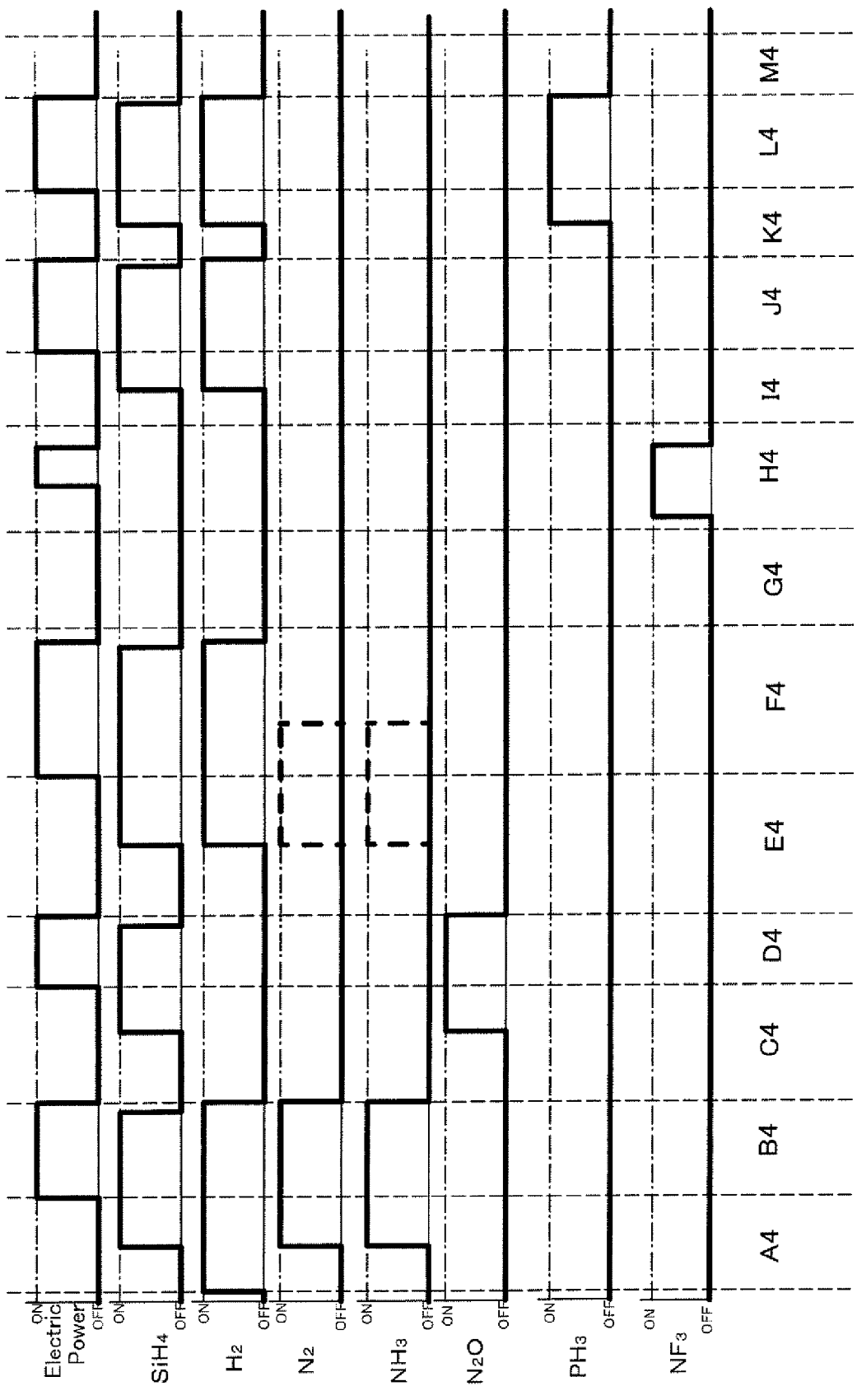
FIG. 12 is a chart illustrating an example of a method for manufacturing a thin film transistor.

First, the substrate 100 provided with the gate electrode layer 101 is heated in the treatment chamber of the CVD apparatus, and source gases for forming a silicon nitride film are introduced into the treatment chamber in order to form the silicon nitride film ("pretreatment A4" in FIG. 12). Here, as an example, $SiH_4$, $H_2$, $N_2$, and $NH_3$ are introduced as the source gases at flow rates of 40 sccm, 500 sccm, 550 sccm, and 140 sccm, respectively, and are stabilized; further, the pressure in the treatment chamber is set to be 100 Pa, and the substrate temperature is set to be 280° C., and plasma discharge is performed at 370 W, whereby a silicon nitride film with a thickness of 110 nm approximately is formed. After that, supply of $SiH_4$ only is halted, and several seconds later, plasma discharge is halted ("formation of SiN film B4" in FIG. 12).

Next, introduction of the source gases for forming the silicon nitride film is halted, and source gases for forming a silicon oxynitride film are introduced into the treatment chamber ("replacement of gases C4" in FIG. 12). Here, as an example, $SiH_4$ and $N_2O$ are introduced as the source gases at flow rates of 30 sccm and 1200 sccm, respectively, and are stabilized; further, the pressure in the treatment chamber is set to be 40 Pa, and the substrate temperature is set to be 280° C., and plasma discharge is performed at 50 W, whereby a silicon oxynitride film with a thickness of 110 nm approximately is formed. After that, in a similar manner to the silicon nitride film, supply of $SiH_4$ only is halted, and several seconds later, plasma discharge is halted ("formation of SiON film D4" in FIG. 12).

Next, the first semiconductor film 153 is formed over the entire surface of the gate insulating layer 102. In a later step, the first semiconductor film 153 is patterned into the first semiconductor layer 154. Introduction of the source gases for forming the silicon oxynitride film is halted ("replacement of gases E4" in FIG. 12), and source gases for forming the first semiconductor film 153 are introduced into the treatment chamber with nitrogen contained in the source gases. Here, as an example, $SiH_4$, $H_2$, and $N_2$ are introduced as the source gases at flow rates of 10 sccm, 1500 sccm, and 1000 sccm, respectively, and are stabilized; further, the pressure in the treatment chamber is set to be 280 Pa, and the substrate temperature is set to be 280° C., and plasma discharge is performed at 50 W. Then, with the flow rate of $N_2$ only reduced to 0, the semiconductor film grows to have a thickness of 50 nm approximately. After that, in a similar manner to the above silicon nitride film and the like, supply of $SiH_4$ only is halted, and several seconds later, plasma discharge is halted ("formation of semiconductor film F4" in FIG. 12).

In the above example, with regard to the source gases for forming the first semiconductor film 153, the flow rate of $H_2$ is 150 times that of $SiH_4$; therefore, silicon is deposited gradually.

In this embodiment mode, the gases for forming the first semiconductor film 153 contain nitrogen in an early stage of the film formation. As described above, nitrogen inhibits nucleation of silicon crystals. Therefore, nuclei of silicon crystals are not generated in an early stage of the film formation. The layer formed in an early stage of the film formation is the first region 150 shown in FIG. 6B. Since the first semiconductor film 153 is formed under unvarying conditions, the first region 150 and the second region 152 are formed under the same conditions. The first semiconductor film 153 is formed with nitrogen contained in the gas in an early stage of the film formation as described above, whereby the semiconductor film containing nitrogen (the first region 150 shown in FIG. 6B) is formed. Formation of the semiconductor film proceeds with the nitrogen concentration reduced, and crystal nuclei are generated when the nitrogen concentration falls below (or reaches) a given value. After that, the crystal nuclei grow, so that the crystal grains 151 are formed.

Subsequently, introduction of the source gases for forming the first semiconductor film 153 is halted, and the substrate 100 is taken out of the treatment chamber 601 to an air atmosphere ("unload and formation of insulating film G4" in FIG. 12). The substrate 100 provided with the first semiconductor film 153 is exposed to the atmosphere, thereby forming a native oxide film over the first semiconductor film 153; thus, the insulating film 105 can be formed.

After taking the substrate 100 out of the treatment chamber 601, an $NF_3$ gas, for example, is introduced into the treatment chamber 601 to clean the inside of the treatment chamber 601 ("cleaning treatment H4" in FIG. 12).

Then, the substrate 100 is taken into the treatment chamber 601 ("load I4" in FIG. 12), and the second semiconductor film 107 is formed over the entire surface of the insulating film 105 formed over the first semiconductor film 153. In a later step, the second semiconductor film 107 is patterned into the second semiconductor layer 108. First, source gases for forming the second semiconductor film 107 are introduced into the treatment chamber. Here, as an example, $SiH_4$ and $H_2$ are introduced as the source gases at flow rates of 280 sccm and 300 sccm, respectively, and are stabilized; further, the pressure in the treatment chamber is set to be 170 Pa, and the substrate temperature is set to be 280° C., and plasma discharge is performed at 60 W, whereby a semiconductor film with a thickness of 150 nm approximately can be formed. After that, in a similar manner to the above silicon nitride film and the like, supply of $SiH_4$ only is halted, and several seconds later, plasma discharge is halted ("formation of a-Si film J4" in FIG. 12). After that, introduction of the gas for this treatment is halted, and gases for forming the impurity semiconductor film 109 are introduced ("replacement of gases K4" in FIG. 12).

The impurity semiconductor film 109 is formed over the entire surface of the second semiconductor film 107. In a later step, the impurity semiconductor film 109 is patterned into the pair of impurity semiconductor layers 110 that form the source region and the drain region. First, source gases for forming the impurity semiconductor film 109 are introduced into the treatment chamber. Here, as an example, $SiH_4$ and 0.5 vol. % $PH_3$ diluted with $H_2$ are introduced as the source gases at flow rates of 100 sccm and 170 sccm, respectively, and are stabilized. The pressure in the treatment chamber is set to be 280 Pa, and the substrate temperature is set to be 280° C., and plasma discharge is performed at 60 W, whereby a semiconductor film with a thickness of 50 nm approximately can be formed. After that, in a similar manner to the above silicon nitride film and the like, supply of $SiH_4$ only is halted, and several seconds later, plasma discharge is halted ("formation of impurity semiconductor film L4" in FIG. 12). After that, these gases are exhausted ("exhaust M4" in FIG. 12).

As described above, by mixing nitrogen into the gases for forming the semiconductor film (the semiconductor layer) in an early stage of the film formation, the oxygen concentration can be low and the nitrogen concentration can be higher than the oxygen concentration; further, the semiconductor film (the semiconductor layer) including the inverted conical or inverted pyramidal crystal grains can be formed.

As described above, one method or combination of plural methods makes it possible to form a semiconductor layer including inverted conical or inverted pyramidal crystal grains. By providing the semiconductor layer including the inverted conical or inverted pyramidal crystal grains on the gate insulating layer side and providing the second semiconductor layer on the source region and drain region side as in this mode, off current can be reduced, and further, on current can be increased. Further, by providing the insulating layer over the semiconductor layer including the inverted conical or inverted pyramidal crystal grains, the second semiconductor layer can be separated from the semiconductor layer including the inverted conical or inverted pyramidal crystal grains, whereby variation in electric characteristics can be reduced.

Although the above description is made on an example in which the insulating layer 106 is formed between the first semiconductor layer 154 and the second semiconductor layer 108 by exposing the first semiconductor layer 154 to the atmosphere, it is also possible to form the insulating layer 106 by plasma treatment (e.g. water plasma treatment), oxidation treatment, or the like that is presented in Embodiment Mode 1, needless to say. Water plasma treatment makes it possible to improve the quality of the first semiconductor layer 154, which is under the insulating layer 106. Further, if the first semiconductor layer 154, in which the inverted conical or inverted pyramidal crystal grains are dispersed, is formed, it is probable that the first semiconductor layer 154 has fewer grain boundaries than a microcrystalline semiconductor; as a result, a defect compensation effect of water plasma can be enhanced.

This embodiment mode can be combined with another embodiment mode as appropriate.

Embodiment Mode 3

In this embodiment mode, a process of manufacturing a thin film transistor which is different from those in the preceding embodiment modes is described.

Figure 13:
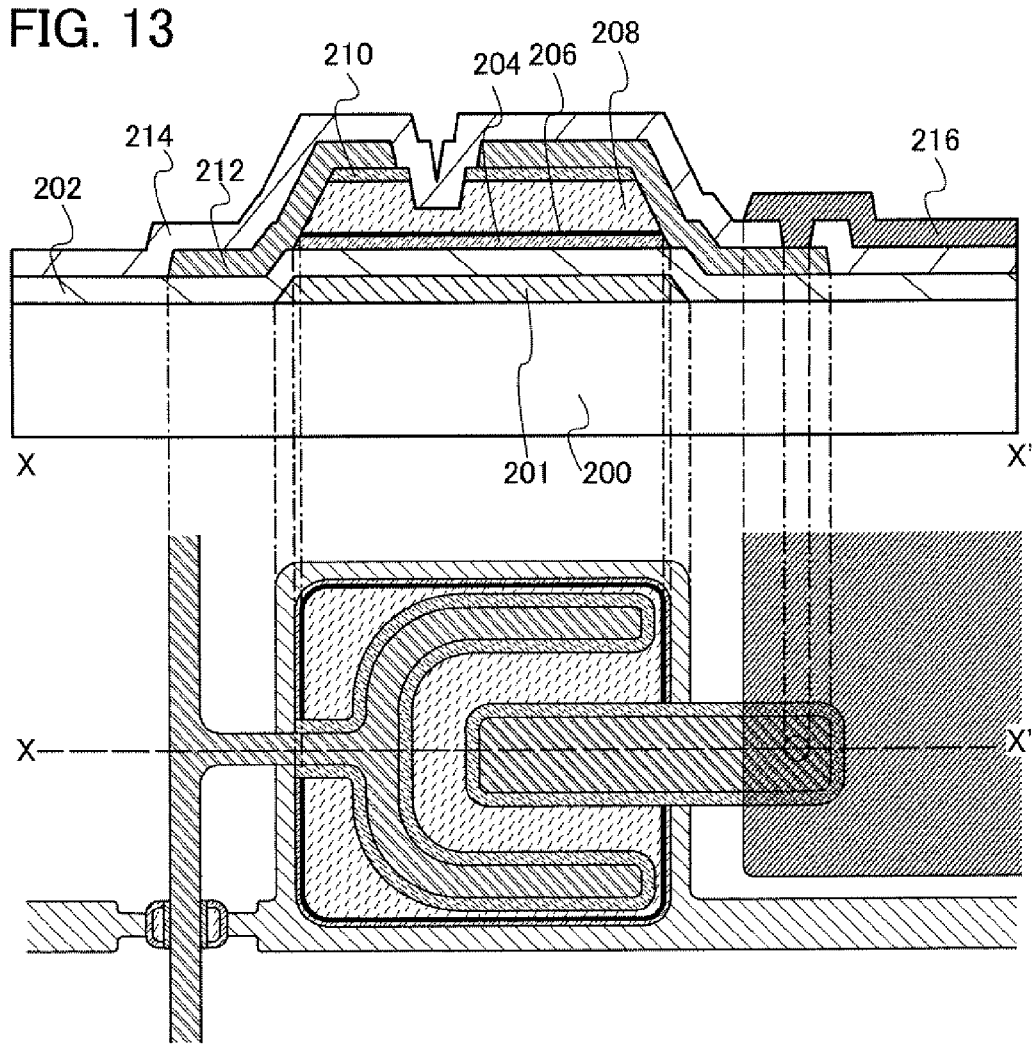
FIG. 13 includes a cross-sectional view and a top view showing a structure of a thin film transistor of another mode.

FIG. 13 includes a top view and a cross-sectional view of a thin film transistor according to this mode. The thin film transistor shown in FIG. 13 has a similar structure to the thin film transistor shown in FIG. 1. In the thin film transistor shown in FIG. 13, wiring layers that form a source electrode and a drain electrode cover side faces of a first semiconductor layer, an insulating layer, a second semiconductor layer, and impurity semiconductor layers that form a source region and a drain region, which is a main difference from the thin film transistor shown in FIG. 1.

The thin film transistor shown in FIG. 13 is an "inverted staggered thin film transistor" including a gate electrode layer 201 provided over a substrate 200, a gate insulating layer 202 covering the gate electrode layer 201, a first semiconductor layer 204 provided over the gate insulating layer 202, an insulating layer 206 provided over and in contact with the first semiconductor layer 204, a second semiconductor layer 208 provided over and in contact with the insulating layer 206, a pair of impurity semiconductor layers 210 that are provided over and in contact with the second semiconductor layer 208 and separated from each other, and a pair of wiring layers 212 that are provided over and in contact with the pair of impurity semiconductor layers 210 and separated from each other. The pair of impurity semiconductor layers 210 form a source region and a drain region. Further, the pair of wiring layers 212 form a source electrode and a drain electrode. The pair of wiring layers 212, which are separated from each other, are formed corresponding to the pair of impurity semiconductor layers 210, which are separated from each other. A protective insulating layer 214 functioning as a protective layer is provided over the wiring layers 212. Further, each layer has a desired pattern.

Also in the thin film transistor according to this mode, a stacked-layer structure of the first semiconductor layer 204, the insulating layer 206, and the second semiconductor layer 208 extends at least in a channel length direction. Further, the stacked-layer structure of the first semiconductor layer 204, the insulating layer 206, and the second semiconductor layer 208 continuously underlies a first portion and a second portion of the pair of wiring layers 212, which form the source electrode and the drain electrode.

The first semiconductor layer 204 includes a plurality of crystalline regions. The second semiconductor layer 208 has an amorphous structure. The insulating layer 206 is formed with a thickness small enough to allow carrier travel between the first semiconductor layer 204 and the second semiconductor layer 208. The first semiconductor layer 204 is present on the gate insulating layer 202 side, and the second semiconductor layer 208 is present on the pair of impurity semiconductor layers 210 side, which form the source region and the drain region. Thus, a thin film transistor can be obtained in which variation in electric characteristics is reduced and favorable off current and favorable on current are achieved, and which has favorable electric characteristics.

Next, a method for manufacturing the thin film transistor shown in FIG. 13 is described. In this embodiment mode, a method for manufacturing an n-channel thin film transistor is described. Description on a method for forming portions which have already been described in the manufacturing method of the thin film transistor shown in FIG. 1 is omitted or made briefly.

Figure 14A:
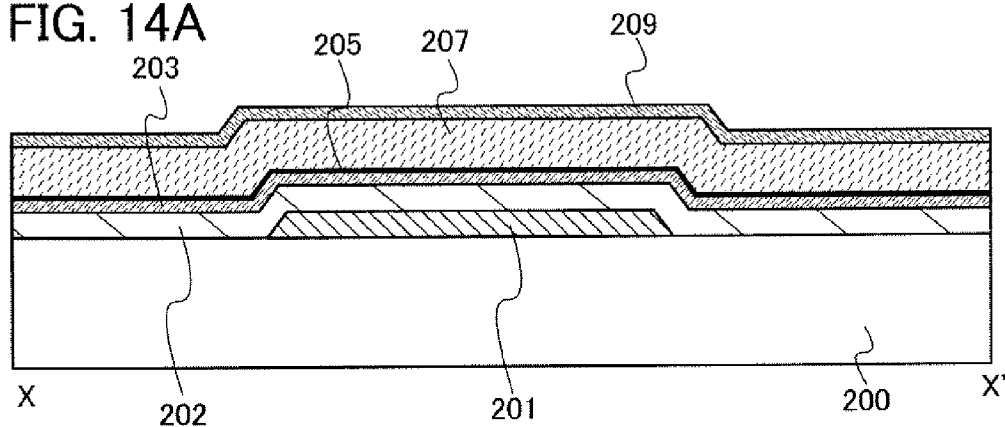
FIGS. 14A to 14C are cross-sectional views illustrating a method for manufacturing a thin film transistor of another mode.

Through a process similar to that shown in FIGS. 2A to 2E in Embodiment Mode 1, the gate insulating layer 202, a first semiconductor film 203, an insulating film 205, a second semiconductor film 207, and an impurity semiconductor film 209 of one conductivity type are formed over the substrate 200 with the gate electrode layer 201 interposed therebetween (see FIG. 14A). Materials and formation methods of the substrate 200, the gate electrode layer 201, the gate insulating layer 202, the first semiconductor film 203, the insulating film 205, the second semiconductor film 207, and the impurity semiconductor film 209 conform to those of the substrate 100, the gate electrode layer 101, the gate insulating layer 102, the first semiconductor film 103, the insulating film 105, the second semiconductor film 107, and the impurity semiconductor film 109, respectively.

For the first semiconductor film 203, the first semiconductor film 153 in Embodiment Mode 2 may be employed.

It is preferable to alter a surface of the first semiconductor film 203 to form the insulating film 205: in a similar manner to the insulating film 105 in Embodiment mode 1, it is preferable to form the insulating film 205 by performing water plasma treatment or by performing water plasma treatment after forming a native oxide film. Water plasma treatment makes it possible to form an oxide film for preventing crystals in the second semiconductor film 207 from growing into the first semiconductor film 203, and further, to compensate for defects in the first semiconductor film 203, which can lead to improvement in electric characteristics of the thin film transistor. Needless to say, it is also possible to form a native oxide film or an insulating film which is formed by other plasma treatment.

Figure 14B:
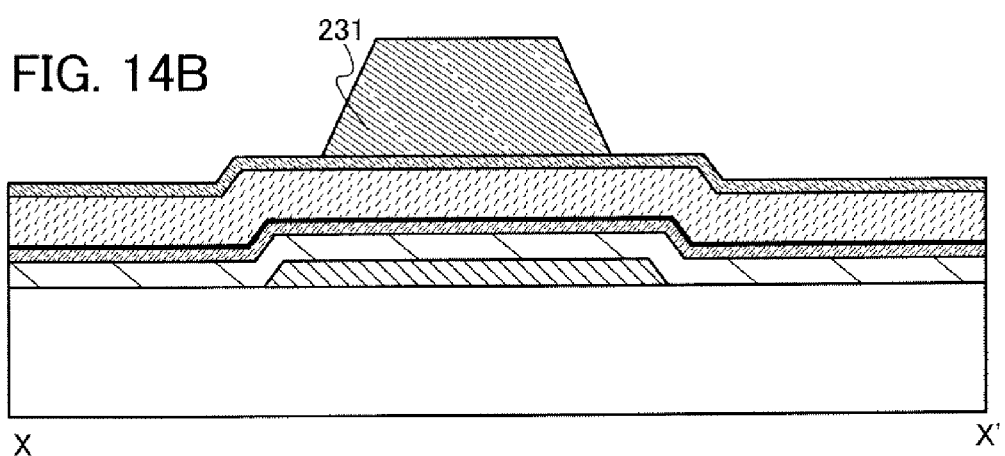

Subsequently, a first resist mask 231 is formed over the impurity semiconductor film 209 (see FIG. 14B). The first resist mask 231 is formed using a photomask.

Figure 14C:
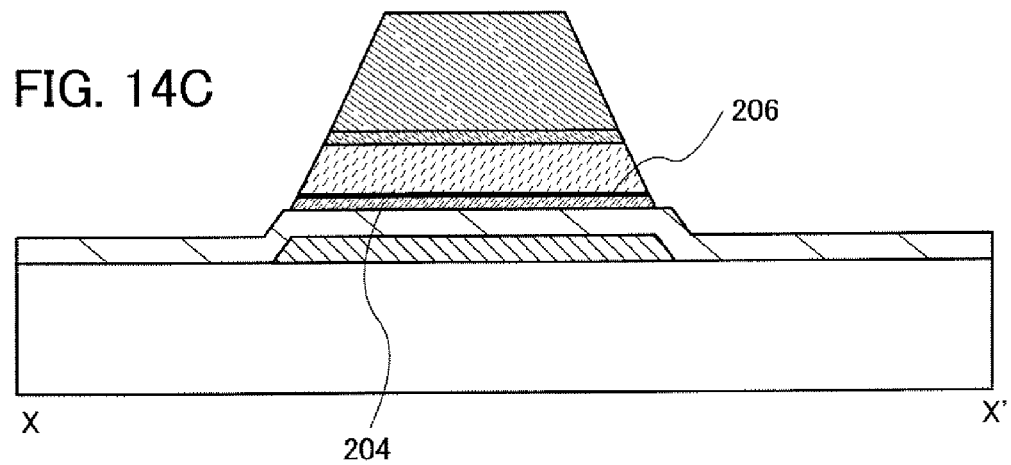
Figure 15A:
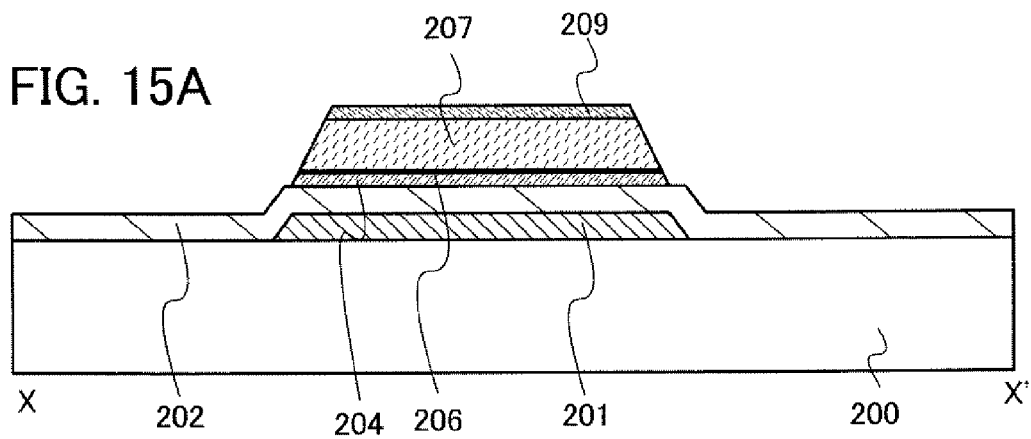
FIGS. 15A to 15C are cross-sectional views illustrating a method for manufacturing a thin film transistor of another mode.

Next, the impurity semiconductor film 209, the second semiconductor film 207, the insulating film 205, and the first semiconductor film 203 are etched using the first resist mask 231. Through this step, the first semiconductor film 203, the insulating film 205, the second semiconductor film 207, and the impurity semiconductor film 209 are separated into elements (see FIG. 14C). By the element separation, the first semiconductor layer 204 and the insulating layer 206, which have desired patterns, can be obtained. After that, the first resist mask 231 is removed (see FIG. 15A).

Figure 15B:
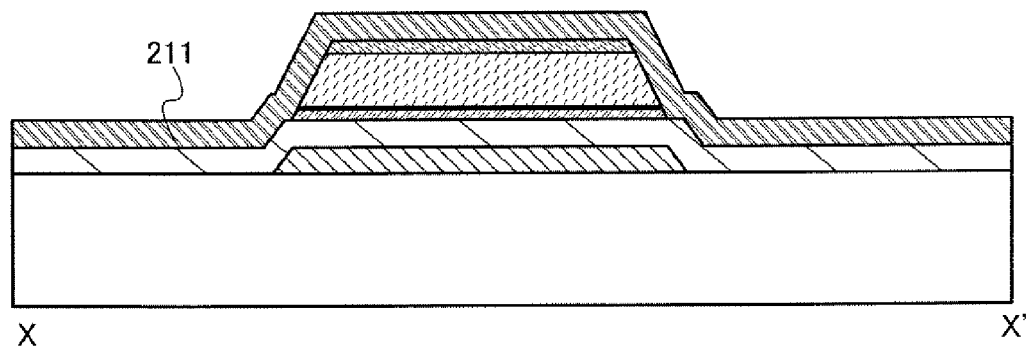

Then, a conductive film 211 is formed over the gate insulating layer 202 and the impurity semiconductor film 209. The conductive film 211 is formed to cover side faces of the impurity semiconductor film 209, the second semiconductor film 207, the insulating layer 206, and the first semiconductor layer 204 (see FIG. 15B). A material and a formation method of the conductive film 211 conform to those of the conductive film 111 in Embodiment Mode 1.

Figure 15C:
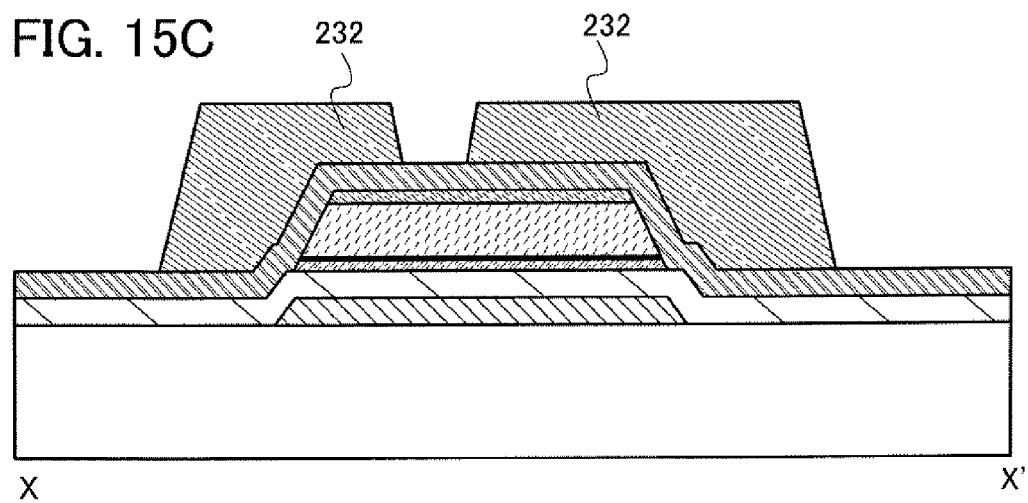

Subsequently, a second resist mask 232 is formed over the conductive film 211 (see FIG. 15C). In a similar manner to the first resist mask 231, the second resist mask 232 is formed using a photomask.

Figure 16A:
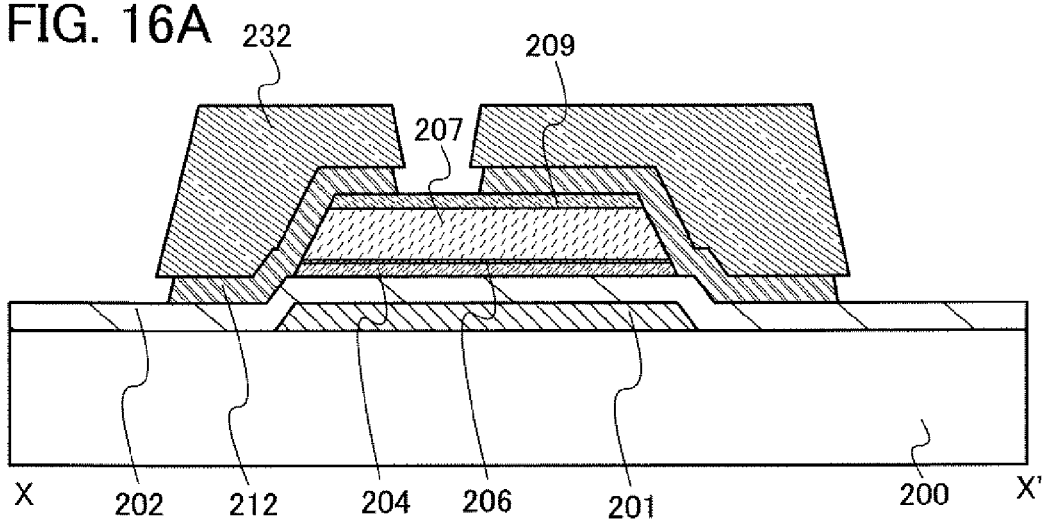
FIGS. 16A to 16C are cross-sectional views illustrating a method for manufacturing a thin film transistor of another mode.

Next, the conductive film 211 is etched using the second resist mask 232, whereby the pair of wiring layers 212 are formed (see FIG. 16A). The pair of wiring layers 212 form the source electrode and the drain electrode. For the etching of the conductive film 211, it is preferable to employ wet etching, as is similar to the etching of the conductive film 111. By wet etching, the conductive film 211 is etched selectively; thus, the conductive film 211 recedes inward compared to the second resist mask 232, so that the pair of separated wiring layers 212 are formed. As a result of wet etching, side faces of the pair of wiring layers 212, which face each other, are not aligned with those of the pair of impurity semiconductor layers, which are formed later and face each other, between the pair of separated wiring layers 212; the side faces of the pair of impurity semiconductor layers that form the source region and the drain region are present at outer sides compared to those of the wiring layers 212. The wiring layers 212 function not only as the source electrode and the drain electrode but also as signal lines. However, the present invention is not limited to this mode, and a wiring layer which forms a signal line may be formed separately from a wiring layer which forms a source electrode and a drain electrode.

Figure 16B:
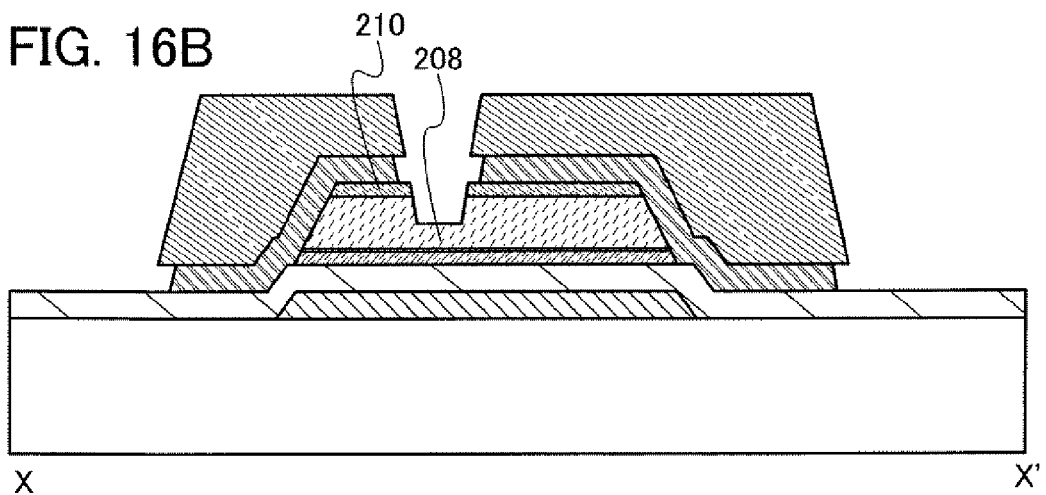

Subsequently, the impurity semiconductor film 209 is etched using the second resist mask 232 (see FIG. 16B). Through this etching, the pair of impurity semiconductor layers 210, which have desired patterns, can be obtained. The pair of impurity semiconductor layers 210 are separated from each other, and form the source region and the drain region.

In a similar manner to FIG. 4B in Embodiment Mode 1, in the etching for separating the impurity semiconductor film to form the pair of impurity semiconductor layers 210 that form the source region and the drain region, a part of the second semiconductor film 207 is etched to have a depressed portion, so that the second semiconductor layer 208 is formed. It is preferable to control the etching of the impurity semiconductor film 209 so that a part of the second semiconductor film 207 can remain in the depressed portion.

Figure 16C:
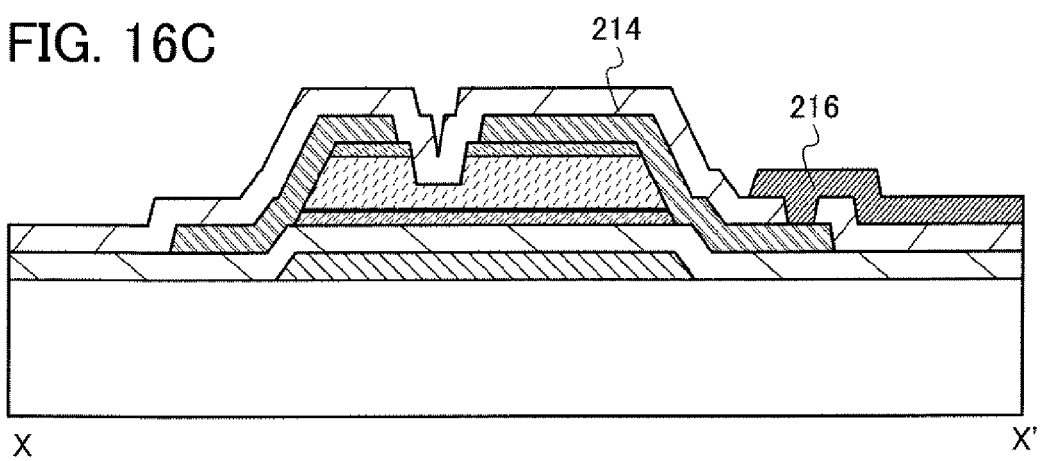

The second resist mask 232 is removed, so that the thin film transistor according to this embodiment mode can be manufactured. As in Embodiment Mode 1, the thin film transistor according to this embodiment mode can also be applied to a switching transistor in a pixel of a display device typified by a liquid crystal display device or a light-emitting display device. FIG. 16C shows an example of forming the protective insulating layer 214 that covers the thin film transistor. Through an opening portion formed in the protective insulating layer, a pixel electrode layer 216 is connected to either of the pair of wiring layers 212 that form the source electrode and the drain electrode. Description of the protective insulating layer 214 and the pixel electrode layer 216 conforms to that of the insulating layer 114 and the pixel electrode layer 116, respectively. In such a manner, a switching transistor in a pixel of a display device which is shown in FIG. 13 can be manufactured.

Thus, a thin film transistor can be obtained in which variation in electric characteristics is reduced and favorable off current and favorable on current are achieved, and which has favorable electric characteristics.

This embodiment mode can be combined with another embodiment mode as appropriate.

Embodiment Mode 4

In this embodiment mode, an example of a method for manufacturing a thin film transistor which is different from the methods in the preceding embodiment modes is described. Specifically, description is made on treatment which is performed after the impurity semiconductor film is etched to form the pair of impurity semiconductor layers that form the source region and the drain region and to etch a part of the semiconductor layer which is under the pair of impurity semiconductor layers.

Figure 17A:
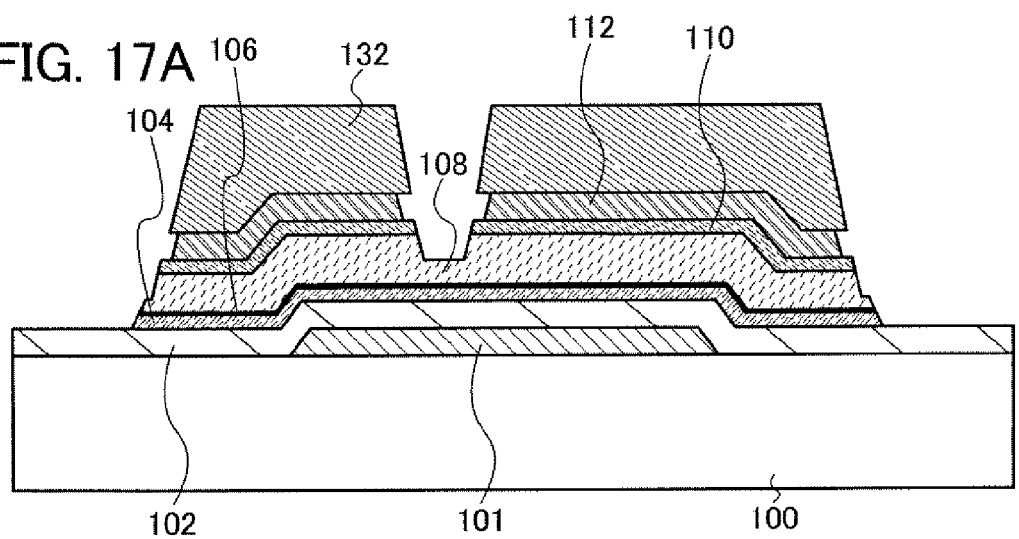
FIGS. 17A to 17C are cross-sectional views illustrating a method for manufacturing a thin film transistor of another mode.

In this embodiment mode, description is made with reference to the manufacturing process presented in Embodiment mode 1. As shown in FIG. 4B, the impurity semiconductor film 109 is etched using the second resist mask 132, so that the pair of impurity semiconductor layers 110, which have desired patterns, are obtained. At this time, a part of the second semiconductor film 107, which is under the pair of impurity semiconductor layers 110, is etched, whereby the second semiconductor layer 108 having a depressed portion is obtained (see FIG. 17A).

Next, dry etching is performed using the second resist mask 132. In the dry etching, conditions under which the exposed second semiconductor layer 108 is not damaged and the etching rate of the second semiconductor layer 108 is low are employed. In other words, conditions under which an exposed surface of the second semiconductor layer 108 is hardly damaged and the thickness of the exposed second semiconductor layer 108 is hardly reduced are employed. The exposed second semiconductor layer 108 corresponds to a surface of the depressed portion formed in the second semiconductor layer 108. As an etching gas, a chlorine-based gas is used; typically, a $Cl_2$ gas is used. Further, there are no particular limitations on an etching method, and an ICP method, a CCP method, an ECR method, a reactive ion etching (RIE) method, or the like can be employed.

For example, the above dry etching is performed for 30 seconds under the following conditions: the flow rate of a $Cl_2$ gas is 100 sccm; the pressure in a chamber is 0.67 Pa; the temperature of a lower electrode is −10° C.; RF power (13.56 MHz) of 2000 W is applied to a coiled upper electrode to produce plasma with no power (i.e. 0 W) applied to the substrate 100 (the substrate provided with the second semiconductor layer 108) side. Further, it is preferable that the temperature of an inner wall of the chamber be 80° C. approximately.

Alternatively, in the dry etching, a $CF_4$ gas may be used as the etching gas. For example, the above dry etching is performed for 30 seconds under the following conditions: the flow rate of a $CF_4$ gas is 100 sccm; the pressure in a chamber is 0.67 Pa; the temperature of a lower electrode is −10° C.; RF power (13.56 MHz) of 1000 W is applied to a coiled upper electrode to produce plasma with no power (i.e. 0 W) applied to the substrate 100 (the substrate provided with the second semiconductor layer 108) side.

Figure 17B:
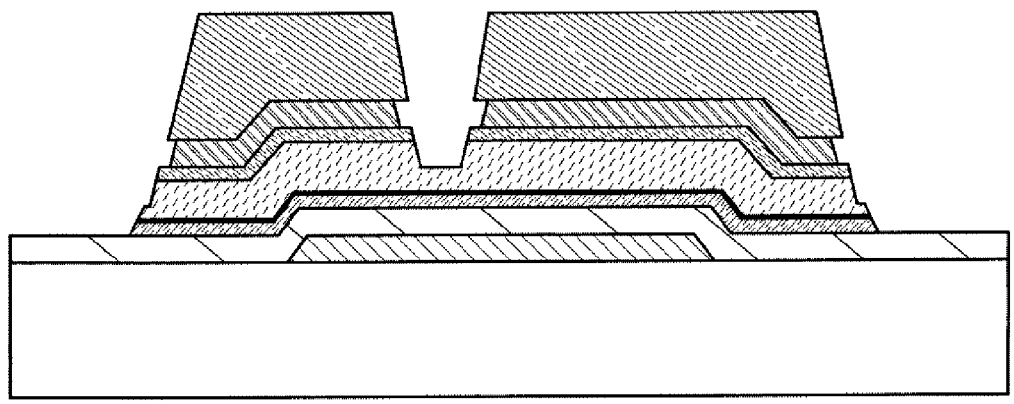
Figure 17C:
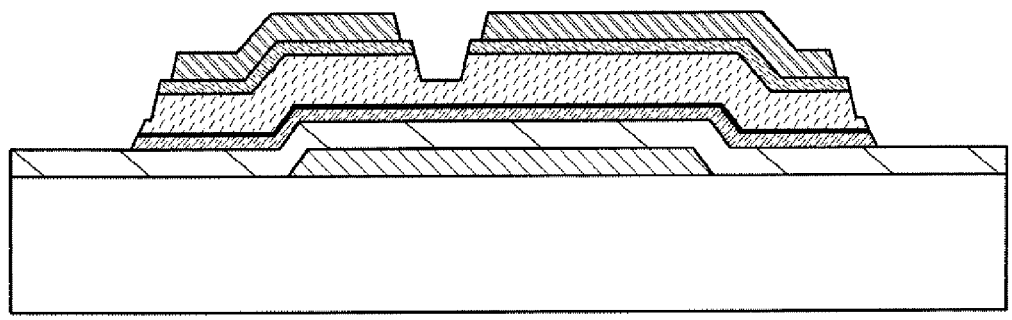

Subsequently, water plasma treatment is performed with the second resist mask 132 formed (see FIG. 17B), and the second resist mask 132 is removed (see FIG. 17C).

Water plasma treatment can be performed by introducing a gas which mainly contains water (typically, water vapor ($H_2O$ vapor)) into a reaction space and producing plasma. Water plasma can remove the second resist mask 132. By performing water plasma treatment or performing water plasma treatment after exposure to the atmosphere, an oxide film (including a monatomic layer) can be formed over the exposed semiconductor layer.

As described above, by forming the pair of impurity semiconductor layers 110 and further performing dry etching under conditions in which the second semiconductor layer 108 is not damaged, impurities such as a residue on the exposed second semiconductor layer 108 can be removed. Further, by performing water plasma treatment after the dry etching, the resist mask can be removed. The treatment presented in this mode can reliably insulate the source region and the drain region from each other, reduce off current of the thin film transistor completed, and reduce variation in electric characteristics.

After the above step, the protective insulating layer is formed, and the pixel electrode layer may be formed to fill the opening formed in the protective insulating layer as shown in FIG. 4C.

Although in this embodiment mode, description is made with reference to the manufacturing process presented in Embodiment Mode 1, this embodiment mode can be applied also to the manufacturing processes presented in Embodiment Modes 2 and 3, needless to say.

This embodiment mode can be combined with another embodiment mode as appropriate.

Embodiment Mode 5

In this embodiment mode, a liquid crystal display device including the thin film transistor presented in Embodiment Mode 3 as one mode of a display device is described below. Here, a vertical alignment (VA) mode liquid crystal display device is described with reference to FIGS. 18 to 20. A VA mode liquid crystal display device employs a method of controlling alignment of liquid crystal molecules of a liquid crystal panel. In a VA mode liquid crystal display device, liquid crystal molecules are aligned in a vertical direction with respect to a panel surface when a voltage is not applied. In this embodiment mode, in particular, a pixel is divided into some regions (subpixels), and molecules are aligned in different directions in their respective regions. This is referred to as "multi-domain" or "multi-domain design." Hereinafter, a liquid crystal display device of multi-domain design is described.

Figure 18:
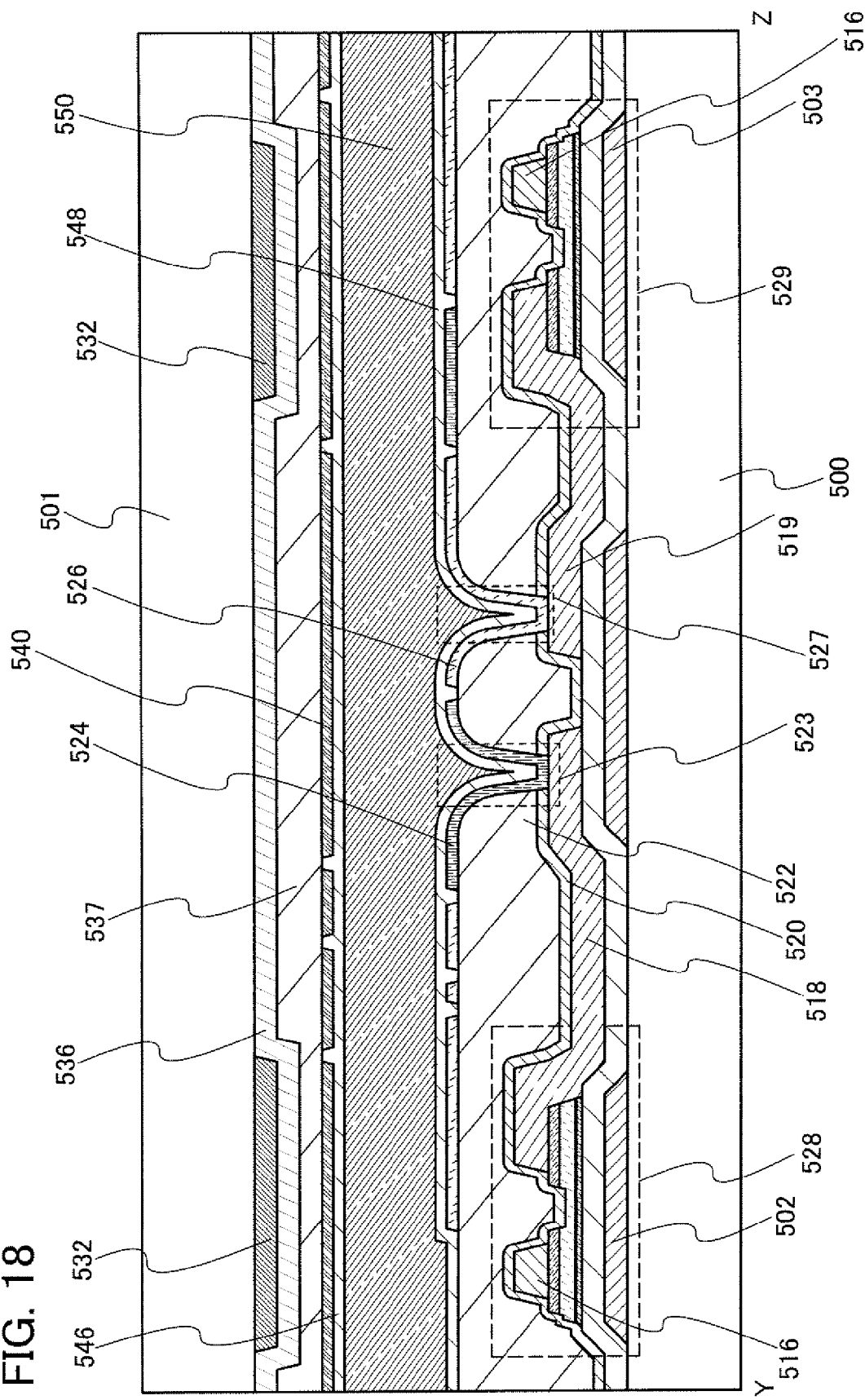
FIG. 18 is a cross-sectional view showing an example of a display device to which a thin film transistor according to a mode of the present invention can be applied.
Figure 19:
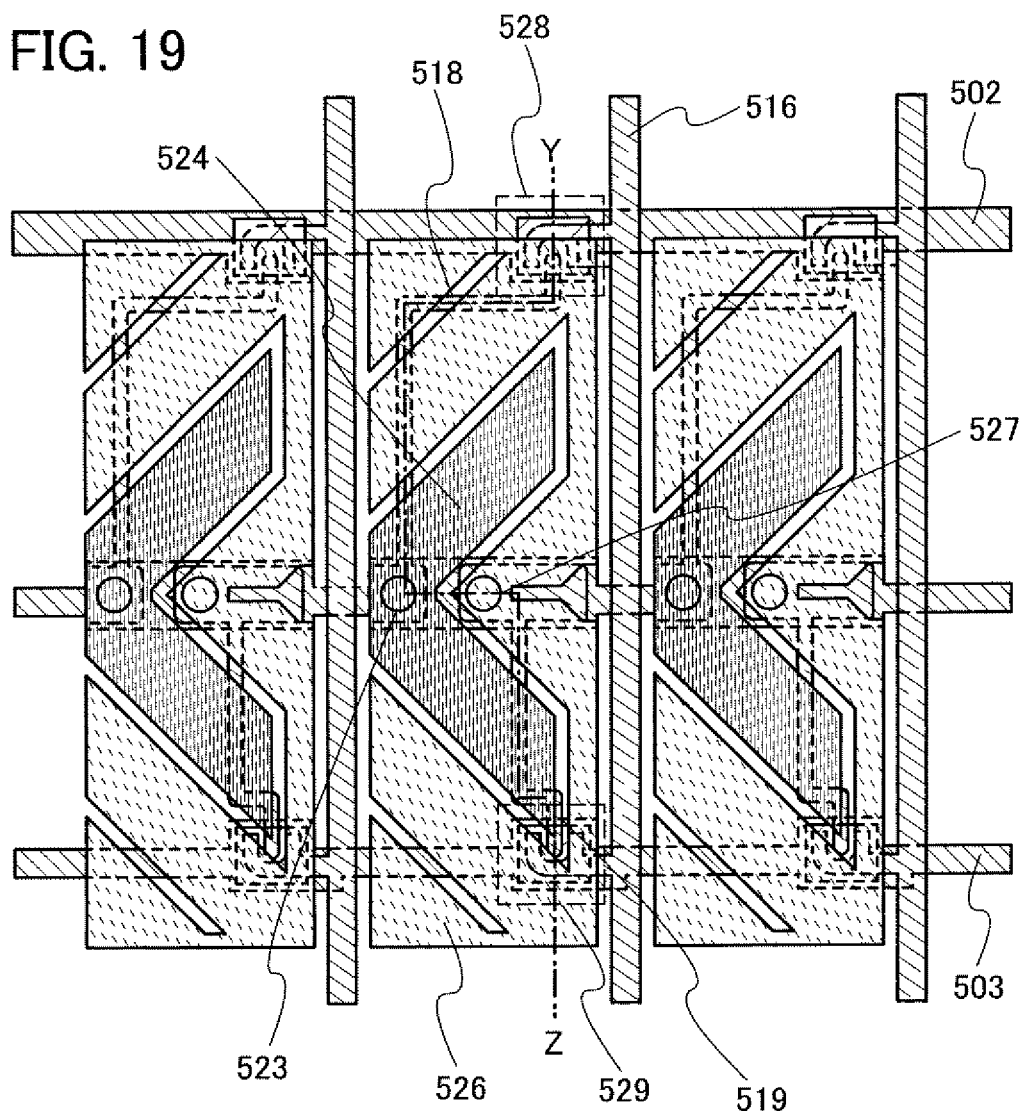
FIG. 19 is a drawing showing an example of a display device to which a thin film transistor according to a mode of the present invention can be applied.

FIGS. 18 and 19 show a pixel structure of a VA mode liquid crystal panel. FIG. 19 is a plan view of a pixel structure presented in this embodiment mode. FIG. 18 shows a cross-sectional structure taken along a line Y-Z in FIG. 19. The following description is made with reference to both the drawings.

In the pixel structure presented in this embodiment mode, a plurality of pixel electrodes are included in one pixel provided over a substrate 500, and thin film transistors are connected to the pixel electrodes with a planarizing film 522 and a passivation film 520 interposed therebetween. The thin film transistors are driven by different gate signals. That is, in the pixel of multi-domain design, signals applied to the pixel electrodes are controlled independently.

A pixel electrode 524 is connected to a thin film transistor 528 through a wiring 518 in a contact hole 523. In a contact hole 527, a pixel electrode 526 is connected to a thin film transistor 529 through a wiring 519. A gate wiring 502 of the thin film transistor 528 and a gate wiring 503 of the thin film transistor 529 are separated from each other so that different gate signals can be given thereto. In contrast, a wiring 516 functioning as a data line is connected in common to the thin film transistors 528 and 529. The thin film transistors 528 and 529 can be manufactured by the method presented in Embodiment Mode 3. Needless to say, the thin film transistors 528 and 529 can be formed by another method presented in another embodiment mode.

The pixel electrodes 524 and 526 have different shapes and are separated from each other by a slit 525. The pixel electrode 526 surrounds the pixel electrode 524, which has a V-shape. The thin film transistors 528 and 529 make the timing of applying voltages to the pixel electrodes 524 and 526 different from each other, thereby controlling alignment of liquid crystals. By supplying different gate signals to the gate wirings 502 and 503, operation timing of the thin film transistors 528 and 529 can be different. Further, an alignment film 548 is formed over the pixel electrodes 524 and 526.

Figure 20:
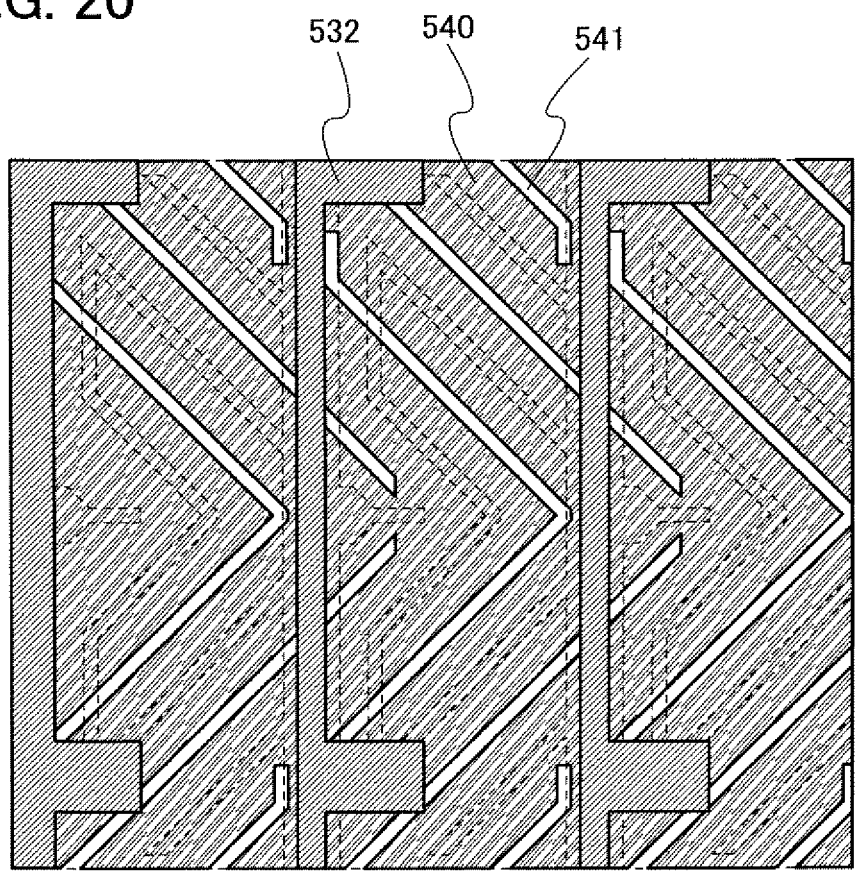
FIG. 20 is a drawing showing an example of a display device to which a thin film transistor according to a mode of the present invention can be applied.

A counter substrate 501 is provided with a light-blocking film 532, a coloring film 536, and a counter electrode 540. In addition, a planarizing film 537 is formed between the coloring film 536 and the counter electrode 540, thereby preventing alignment disorder of liquid crystals. Moreover, an alignment film 546 is formed on the counter electrode 540. FIG. 20 shows a pixel structure on the counter substrate 501 side. The counter electrode 540 is shared by a plurality of pixels, and a slit 541 is formed in the counter electrode 540. The slit 541, and the slit 525 on the pixel electrodes 524 and 526 side are disposed in an alternate form, thereby effectively generating an oblique electric field to control the alignment of the liquid crystals. Accordingly, the direction in which the liquid crystals are aligned can be different depending on the position, and thus a viewing angle can be increased.

The pixel electrode 524, a liquid crystal layer 550, and the counter electrode 540 overlap with one another, so that a first liquid crystal element is formed. Further, the pixel electrode 526, the liquid crystal layer 550, and the counter electrode 540 overlap with one another, so that a second liquid crystal element is formed. Furthermore, a multi-domain structure is made in which the first liquid crystal element and the second liquid crystal element are provided for one pixel.

Although a vertical alignment (VA) mode liquid crystal display device is presented here as an example of a liquid crystal display device, an element substrate formed using a thin film transistor according to the present invention can also be applied to an FFS mode liquid crystal display device, an IPS mode liquid crystal display device, a TN mode liquid crystal display device, and the like.

The liquid crystal display device can be manufactured through the above process. Since variation in electric characteristics is reduced among elements, variation in luminescence is reduced and image quality is improved in the liquid crystal display device in this embodiment mode.

This embodiment mode can be combined with another embodiment mode as appropriate.

Embodiment Mode 6

Figure 21A:
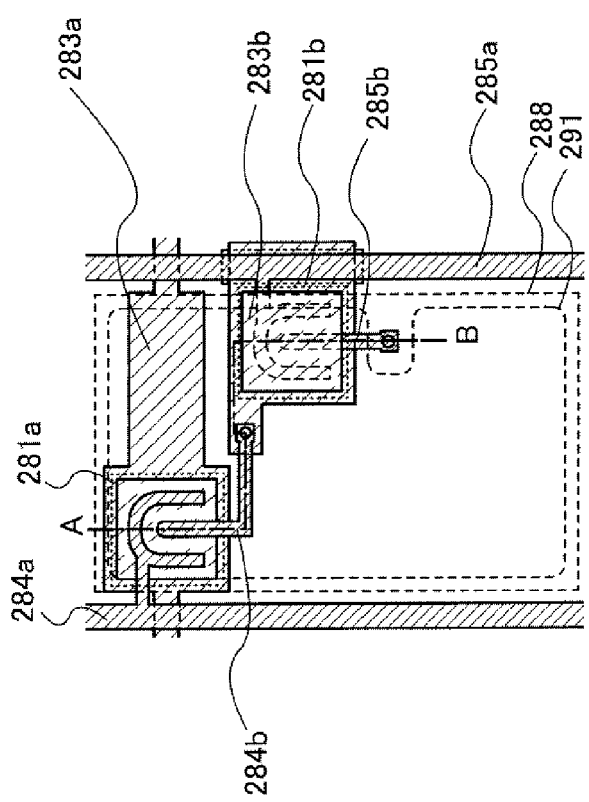
FIGS. 21A and 21B are a plan view and a cross-sectional view, respectively, showing an example of a display device to which a thin film transistor according to a mode of the present invention can be applied.
Figure 21B:
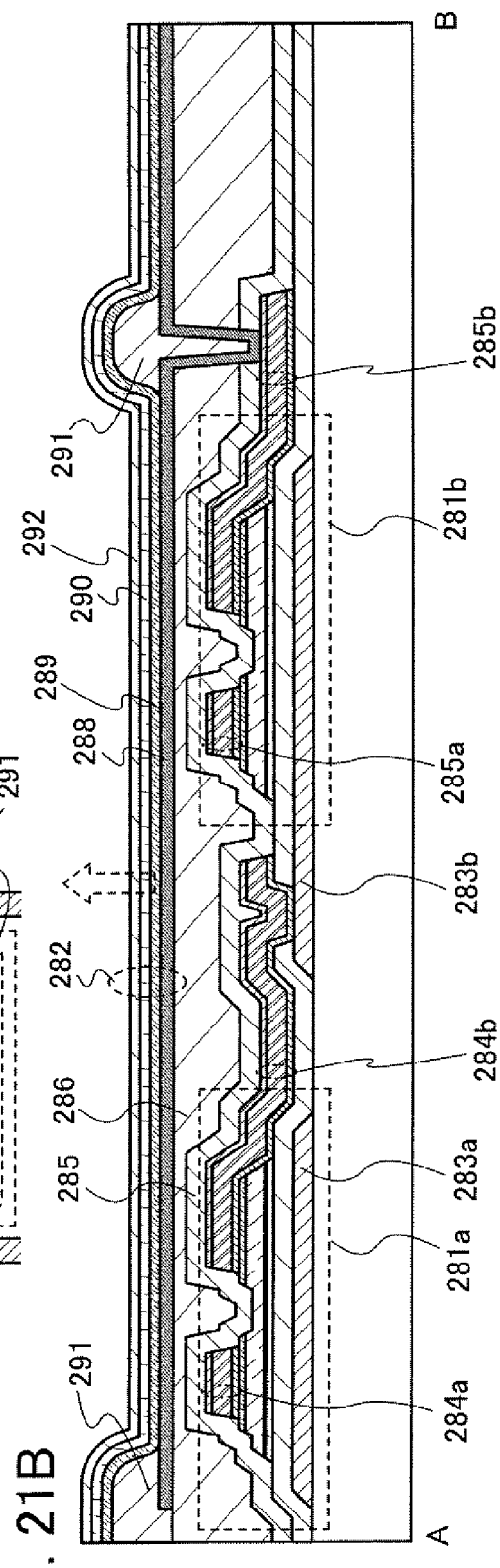

In this embodiment mode, a light-emitting display device including the thin film transistor presented in Embodiment Mode 3 is described below as one mode of a display device; a structure of a pixel included in the light-emitting display device is described here. FIG. 21A shows one mode of a plan view of the pixel. FIG. 21B shows one mode of a cross-sectional structure taken along a line A-B in FIG. 21A.

In this embodiment mode, a display device having a light-emitting element utilizing electroluminescence is presented as an example of a light-emitting device. Light-emitting elements utilizing electroluminescence are classified into two types according to whether the light-emitting material is an organic compound or an inorganic compound. In general, the former is referred to as an organic EL element and the latter is referred to as an inorganic EL element. In this embodiment mode, an example of employing Embodiment Mode 3 is presented as a process for manufacturing a thin film transistor. Needless to say, another thin film transistor presented in another embodiment mode can be used for the thin film transistor presented in this embodiment mode.

In an organic EL element, voltage is applied to the light-emitting element, whereby electrons and holes are injected from a pair of electrodes into a layer containing a light-emitting organic compound, and there flows electric current. These carriers (electrons and holes) are recombined, so that the light-emitting organic compound is placed in an excited state. The light-emitting organic compound emits light in returning to a ground state from the excited state. Because of such mechanism, such a light-emitting element is called a "light-emitting element of a current excitation type."

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film TO inorganic EL element, a light-emitting layer is sandwiched between dielectric layers, and the dielectric layers sandwiching the light-emitting layer are further sandwiched between electrodes. Light emission mechanism of the thin film inorganic EL element is local light emission, in which inner-shell electron transition of a metal atom is utilized. Here, an organic EL element is described as an example of a light-emitting element. Further, although a channel-etched thin film transistor is presented as an example of a switching thin film transistor for controlling input of a signal to a pixel electrode and as an example of a driving thin film transistor for controlling driving of a light-emitting element, a channel protective thin film transistor can also be used as appropriate.

In FIGS. 21A and 21B, a first thin film transistor 281a is a switching thin film transistor for controlling input of a signal to a pixel electrode, and a second thin film transistor 281b is a driving thin film transistor for controlling current or voltage supplied to a light-emitting element 282.

A gate electrode of the first thin film transistor 281a is connected to a scanning line 283a. One of a source electrode and a drain electrode of the first thin film transistor 281a is connected to a signal line 284a. The other of the source electrode and the drain electrode of the first thin film transistor 281a is connected to a gate electrode 283b of the second thin film transistor 281b through a wiring 284b. One of a source electrode and a drain electrode of the second thin film transistor 281b is connected to a power supply line 285a, and the other of the source electrode and the drain electrode of the second thin film transistor 281b is connected to a pixel electrode (a cathode 288) of the display device through a wiring 285b. A gate electrode and a gate insulating film of the second thin film transistor 281b and the power supply line 285a constitute a capacitor element, and the other of the source electrode and the drain electrode of the first thin film transistor 281a is connected to the capacitor element.

The capacitor element corresponds to a capacitor element for holding a gate-source voltage or a gate-drain voltage (hereinafter referred to as a "gate voltage") of the second thin film transistor 281b when the first thin film transistor 281a is off, and is not necessarily provided.

In this embodiment mode, the first thin film transistor 281a and the second thin film transistor 281b can each be formed using the thin film transistor of Embodiment Mode 3. Although each of the first thin film transistor 281a and the second thin film transistor 281b is an n-channel thin film transistor in this embodiment mode, the first thin film transistor 281a and the second thin film transistor 281b may also be formed using an n-channel thin film transistor and a p-channel thin film transistor, respectively. Furthermore, both the first thin film transistor 281a and the second thin film transistor 281b may be formed using p-channel thin film transistors.

An insulating film 286 is formed over the first thin film transistor 281a and the second thin film transistor 281b. A planarizing film 287 is formed over the insulating film 286. The cathode 288 is formed to be connected to the wiring 285*b* in a contact hole formed in the planarizing film 287 and the insulating film 286. It is preferable to form the planarizing film 287 using an organic resin such as acrylic, polyimide, or polyamide, or a siloxane polymer. Since the cathode 288 has a depressed portion in the contact hole, a partition 291 having an opening portion is provided to cover the depressed portion. In the opening portion of the partition 291, a light-emitting layer 289 is formed to be in contact with the cathode 288, and an anode 290 is formed to cover the light-emitting layer 289. Further, a protective insulating film 292 is formed to cover the anode 290 and the partition 291.

In this embodiment mode, a light-emitting element 282 having a top emission structure is presented as an example of a light-emitting element. The light-emitting element 282 with a top emission structure can emit light even over the first thin film transistor 281*a* or the second thin film transistor 281*b*; thus, a light emission area can be increased. However, if a film under the light-emitting layer 289 is uneven, the thickness is nonuniform due to unevenness, and the anode 290 and the cathode 288 are short-circuited, so that a display defect is caused. Therefore, it is preferable to provide the planarizing film 287.

The light-emitting element 282 corresponds to a region where the cathode 288 and the anode 290 sandwich the light-emitting layer 289. In the case of the pixel shown in FIG. 21A, light from the light-emitting element 282 is emitted to the anode 290 side, as designated with an outline arrow in FIG. 21B.

For the cathode 288, a known conductive film can be used as long as it has a low work function and reflects light. For example, Ca, Al, CaF, MgAg, AlLi, or the like is preferable. The light-emitting layer 289 may be formed using a single layer or by stacking a plurality of layers. When the light-emitting layer 289 is formed using a plurality of layers, an electron-injecting layer, an electron-transporting layer, a light-emitting layer, a hole-transporting layer, and a hole-injecting layer are stacked in this order over the cathode 288. It is not necessary to form all of these layers except a light-emitting layer (e.g. an electron-injecting layer, an electron-transporting layer, a hole-transporting layer, and a hole-injecting layer), and a practitioner can determine layers to form as appropriate. The anode 290 is formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added.

A light-emitting element having a top emission structure, in which light is emitted from a side opposite to a substrate, is presented here; however, a light-emitting element having a bottom emission structure, in which light is emitted from the substrate side, or a light-emitting element having a dual emission structure, in which light is emitted from both the substrate side and the side opposite to the substrate, can also be employed as appropriate.

Although an organic EL element is presented here as an example of a light-emitting element, an inorganic EL element can also be provided as a light-emitting element.

In this embodiment mode, an example is described in which a thin film transistor for controlling driving of a light-emitting element (a driving thin film transistor) is electrically connected to a light-emitting element; however, a thin film transistor for controlling current may be connected between the driving thin film transistor and the light-emitting element.

Through the above process, a light-emitting display device can be manufactured. Since variation in electric characteristics is reduced among elements, variation in luminescence is reduced and image quality is improved in the light-emitting display device in this embodiment mode.

This embodiment mode can be combined with another embodiment mode as appropriate.

Embodiment Mode 7

Next, a structure of a display panel of a display device which is one mode of the present invention is presented below.

Figure 22A:
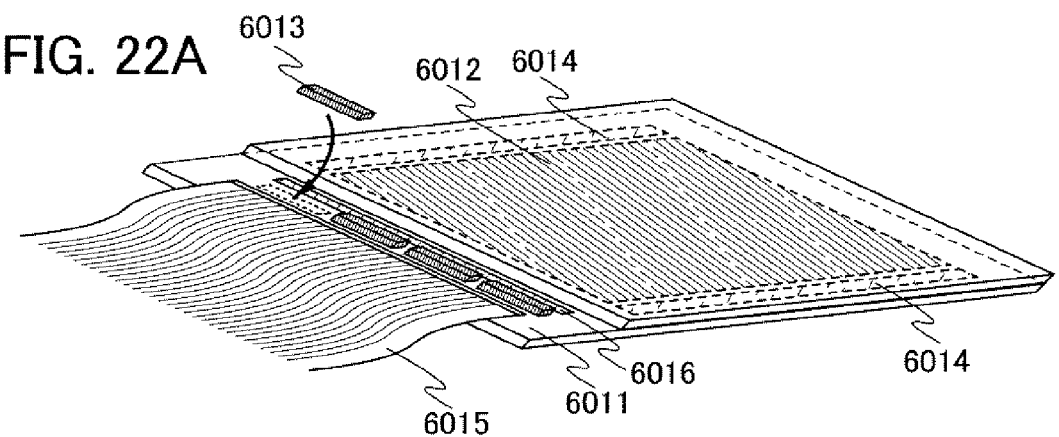
FIGS. 22A to 22C are drawings showing an example of a display device to which a thin film transistor according to a mode of the present invention can be applied.

FIG. 22A shows a mode of a display panel in which a pixel portion 6012 formed over a substrate 6011 is connected to a signal line driver circuit 6013 that is formed separately. An element substrate provided with the pixel portion 6012, a protection circuit 6016, and a scanning line driver circuit 6014 is formed using any of the thin film transistors presented in the preceding embodiment modes. Since variation in characteristics among elements is reduced, the display panel can safely operate without any variation. The signal line driver circuit 6013 may be formed using a thin film transistor including a single crystal semiconductor, a polycrystalline semiconductor, or an SOI. A transistor including an SOI includes a transistor including a single crystal semiconductor layer provided over a glass substrate in its category. The pixel portion 6012, the signal line driver circuit 6013, and the scanning line driver circuit 6014 are each supplied with potential of a power source, a variety of signals, and the like through an FPC 6015. Instead of the protection circuit formed using any of the thin film transistors presented in the preceding embodiment modes, the protection circuit 6016 may include one or more elements selected from a thin film transistor having another structure, a diode, a resistor element, a capacitor element, and the like.

Both the signal driver circuit and the scanning line driver circuit may be formed over the same substrate as that of the pixel portion.

Figure 22B:
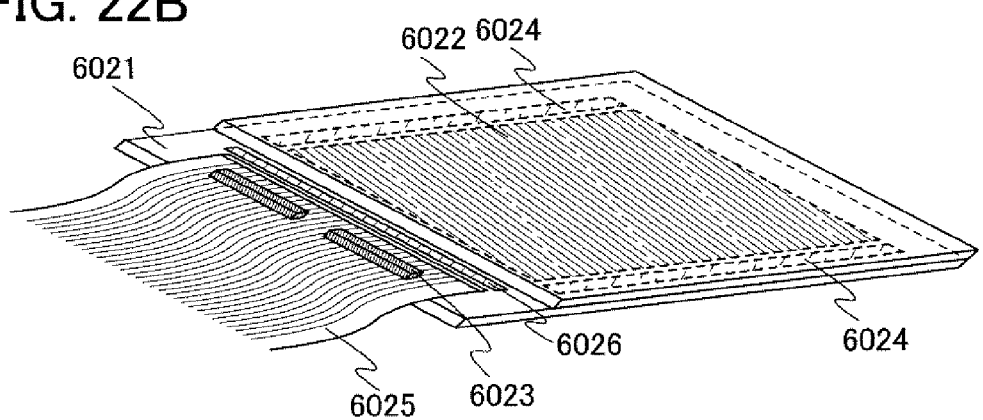

Further, if the driver circuit is formed separately, a substrate provided with the driver circuit is not always required to be attached to a substrate provided with the pixel portion, and may be attached to, for example, the FPC. FIG. 22B shows a mode of a display device panel in which a signal line driver circuit 6023 is formed separately and an FPC 6025 is connected to an element substrate in which a pixel portion 6022, a protection circuit 6026, and a scanning line driver circuit 6024 are formed over a substrate 6021. The pixel portion 6022, the protection circuit 6026, and the scanning line driver circuit 6024 are formed using any of the thin film transistors presented in the preceding embodiment modes. The signal line driver circuit 6023 is connected to the pixel portion 6022 through the FPC 6025 and the protection circuit 6026. The pixel portion 6022, the signal line driver circuit 6023, and the scanning line driver circuit 6024 are each supplied with potential of a power source, a variety of signals, and the like through the FPC 6025. Instead of the protection circuit formed using any of the thin film transistors presented in the preceding embodiment modes, the protection circuit 6026 may include one or more elements selected from a thin film transistor having another structure, a diode, a resistor element, a capacitor element, and the like.

Figure 22C:
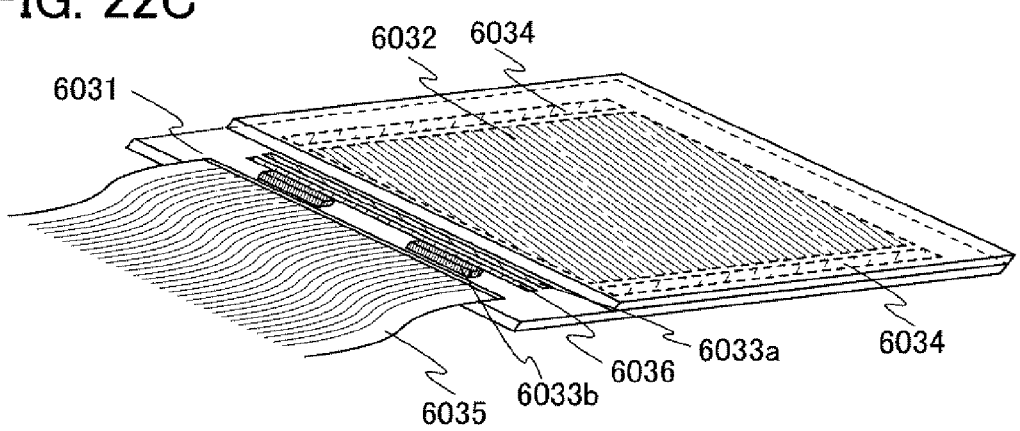

Furthermore, only a part of the signal line driver circuit or only a part of the scanning line driver circuit may be formed over the same substrate as that of the pixel portion, using any of the thin film transistors presented in the preceding embodiment modes, and the rest may be formed separately and electrically connected to the pixel portion. FIG. 22C shows a mode of a display device panel in which an analog switch 6033a included in a signal line driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032, a protection circuit 6036, and the scanning line driver circuit 6034 are formed using any of the thin film transistors presented in the preceding embodiment modes. The shift register 6033b included in the signal line driver circuit is connected to the pixel portion 6032 through an FPC 6035 and the protection circuit 6036. The pixel portion 6032, the signal line driver circuit, and the scanning line driver circuit 6034 are each supplied with potential of a power source, a variety of signals, and the like through the FPC 6035. Instead of the protection circuit formed using any of the thin film transistors presented in the preceding embodiment modes, the protection circuit 6036 may include one or more elements selected from a thin film transistor having another structure, a diode, a resistor element, a capacitor element, and the like.

As shown in FIGS. 22A to 22C, in the display device of this embodiment mode, an entire driver circuit or a part thereof can be formed over the same substrate as that of a pixel portion, using any of the thin film transistors presented in the preceding embodiment modes. Note that a structure of a display device is not limited to the structures described above. For example, a protection circuit may be omitted if it is not necessary.

Note that there are no particular limitations on a connection method of a substrate formed separately, and a known method such as a COG method, a wire bonding method, or a TAB method can be used. Further, a connection position is not limited to the positions shown in FIGS. 22A to 22C as long as electrical connection is possible. Further, a controller, a CPU, a memory, or the like may be formed separately and connected.

A signal line driver circuit used in a mode of the present invention has a shift register and an analog switch. Further, the signal line driver circuit may have another circuit such as a buffer, a level shifter, or a source follower in addition to the shift register and the analog switch. Furthermore, the shift register and the analog switch are not always required to be provided, and for example, another circuit such as a decoder circuit, by which selection of signal lines is possible, may be used instead of the shift register, or a latch or the like may be used instead of the analog switch.

This embodiment mode can be combined with another embodiment mode as appropriate.

Embodiment Mode 8

In this embodiment mode, element substrates including thin film transistors, display devices including the element substrates, and the like can be used for active matrix display device panels. That is to say, the present invention can be carried out in all the electronic appliances in which these modules are incorporated in display portions.

As such electronic appliances including thin film transistors, display devices, and the like according to a mode of the present invention, cameras such as video cameras and digital cameras, head mount displays (goggle type displays), car navigation systems, projectors, car audio component stereos, personal computers, portable information terminals (e.g. mobile computers, mobile phones, and electronic books), and the like can be given. Examples of these appliances are shown in FIGS. 23A to 23D.

Figure 23A:
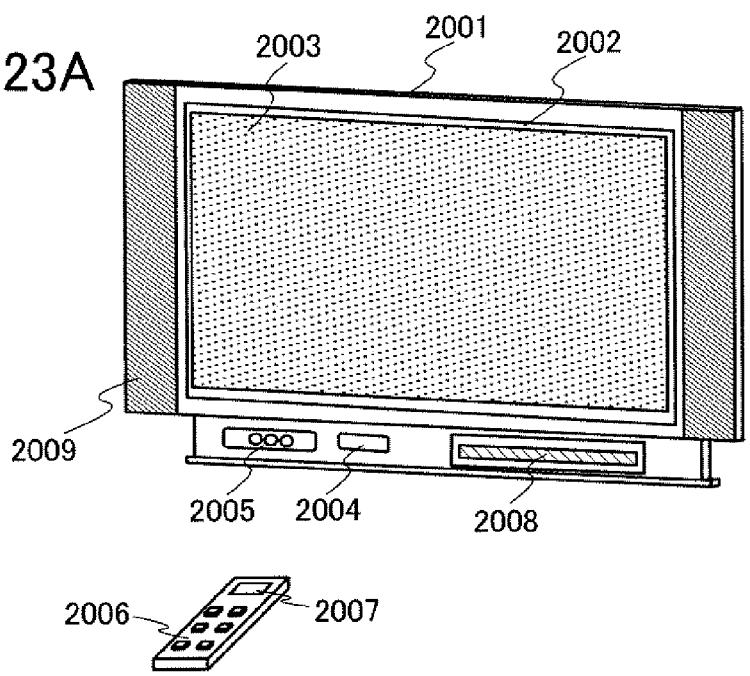
FIGS. 23A to 23D are perspective views showing examples of electronic devices and the like to which a thin film transistor according to a mode of the present invention can be applied.

FIG. 23A shows a television device. The television device can be completed by incorporating a display panel in a chassis, as shown in FIG. 23A. A main screen 2003 is formed with a display panel. In addition, a speaker unit 2009, operation switches, and the like are provided as accessory equipment. In this manner, the television device can be completed.

As shown in FIG. 23A, a display panel 2002 including display elements is incorporated in a chassis 2001. In addition to reception of general television broadcast by a receiver 2005, simplex (from a transmitter to a receiver) or duplex (between a transmitter and a receiver or between receivers) communication of information can be performed by connection to a wired or wireless communication network through a modem 2004. The television device can be operated using switches that are incorporated in the chassis or with a remote control device 2006 that is provided separately, and a display portion 2007 that displays output information may be provided for the remote control device 2006.

Further, in the television device, in addition to the main screen 2003, a subscreen 2008 may be formed using a second display panel and may be used to display channel number, volume, and the like. In this structure, the main screen 2003 may be formed with a liquid crystal display panel, which has excellent viewing angle, and the subscreen 2008 may be formed with a light-emitting display panel, which can perform display with low power consumption. Furthermore, in order to give priority to lower power consumption, the main screen 2003 may be formed with a light-emitting display panel, and the subscreen 2008 may be formed with a light-emitting display panel, and the subscreen 2008 may be configured to be turned on and off.

Figure 24:
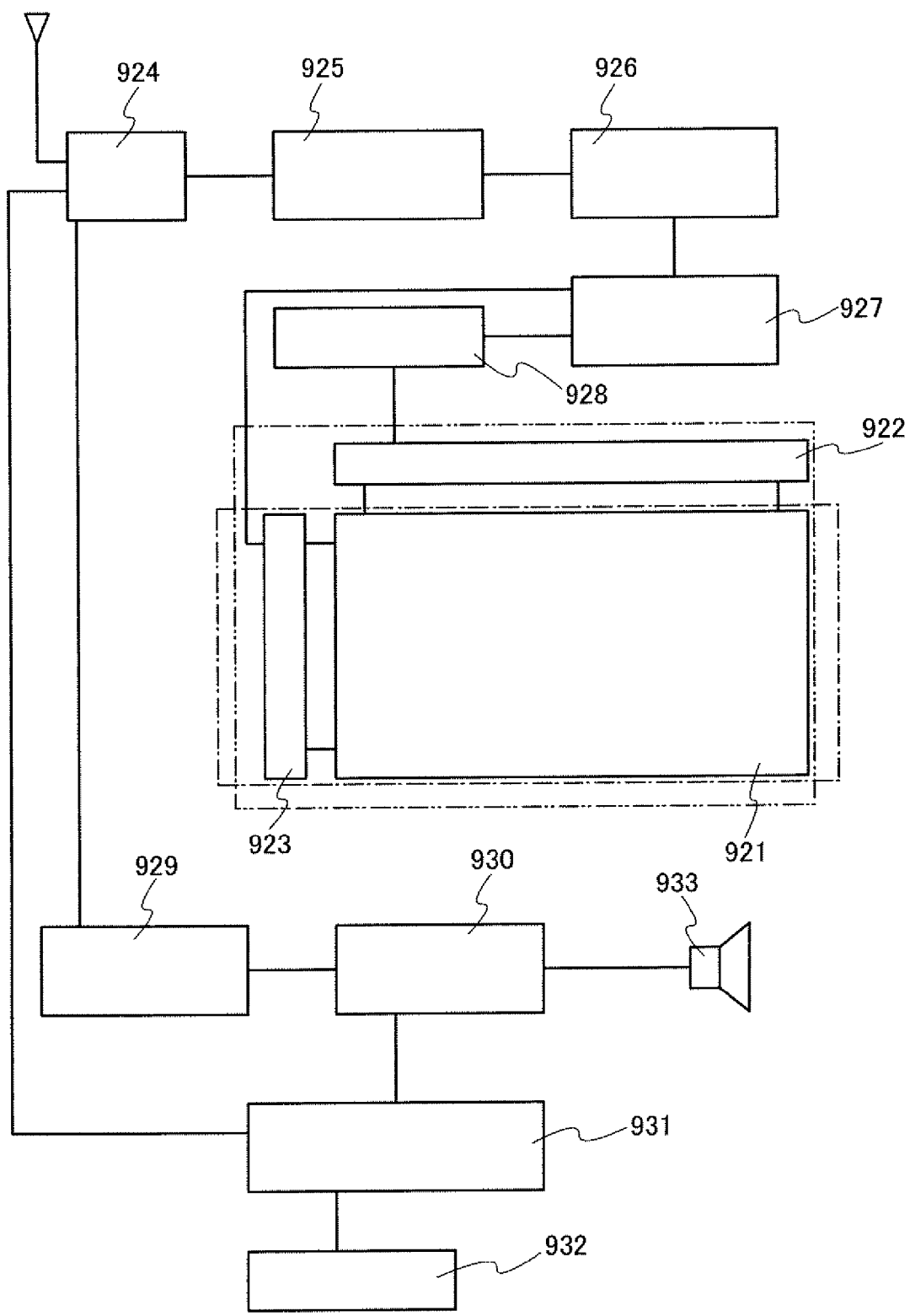
FIG. 24 is a block diagram showing an example of an electronic device or the like to which a thin film transistor according to a mode of the present invention can be applied.

FIG. 24 is a block diagram showing a main structure of a television device. A pixel portion 921 is formed in a display panel. A signal line driver circuit 922 and a scanning line driver circuit 923 may be mounted on the display panel by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can conform with input specification of a driver IC, and the like are provided on a video signal input side. The control circuit 927 outputs signals to both a scanning line side and a signal line side. In a case of digital driving, a signal divide circuit 928 may be provided on the signal line side and an input digital signal may be divided into in pieces and supplied.

An audio signal among signals received by the tuner 924 is sent to an audio signal amplifier circuit 929 and is output to a speaker 933 through an audio signal process circuit 930. A controlling circuit 931 receives control information such as a receiving station (reception frequency) or sound volume from an input portion 932, and transmits signals to the tuner 924 and the audio signal process circuit 930.

Needless to say, a mode of the present invention is not limited to a use for television devices, and can be applied to a variety of applications such as monitors of personal computers and display media having a large area (e.g. information display boards in railway stations, airports, and the like, and street-side advertisement display boards).

An element substrate including any of the thin film transistors presented in the preceding embodiment modes and a display device including the element substrate are applied to the main screen 2003 or the subscreen 2008, whereby a television device with improved image quality can be provided.

Figure 23B:
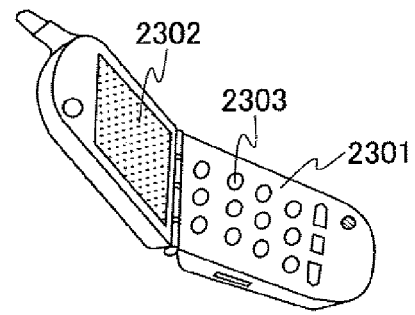

FIG. 23B shows an example of a mobile phone 2301. The mobile phone 2301 includes a display portion 2302, an operation portion 2303, and the like. An element substrate including any of the thin film transistors presented in the preceding embodiment modes and a display device including the element substrate are applied to the display portion 2302, whereby a mobile phone with improved image quality can be provided.

Figure 23C:
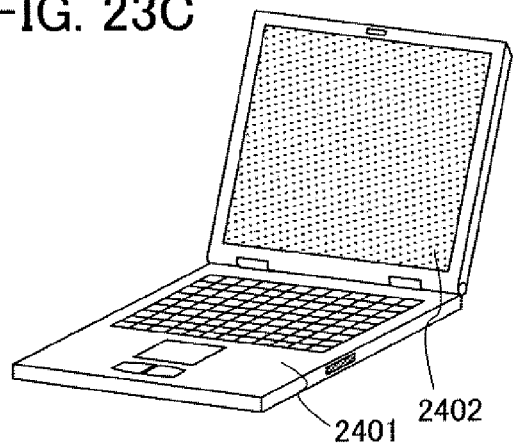

A portable computer shown in FIG. 23C includes a main body 2401, a display portion 2402, and the like. An element substrate including any of the thin film transistors presented in the preceding embodiment modes and a display device including the element substrate are applied to the display portion 2402, whereby a computer with improved image quality can be provided.

Figure 23D:
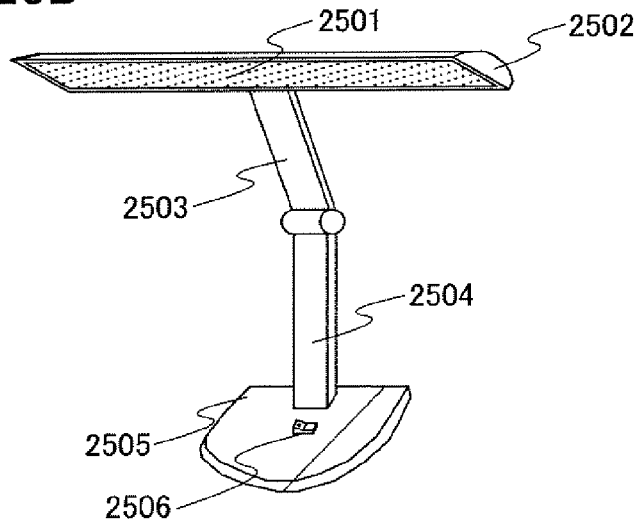

FIG. 23D shows a desk lamp including a lighting portion 2501, a lampshade 2502, an adjustable arm 2503, a support 2504, a base 2505, and a power supply 2506. The desk lamp is manufactured using the light-emitting device described in the preceding embodiment mode for the lighting portion 2501. The lighting equipment includes a ceiling light, a wall light, and the like in its category. An element substrate including any of the thin film transistors presented in the preceding embodiment modes and a display device including the element substrate are applied, whereby inexpensive lighting equipment can be provided with favorable productivity.

Figure 25A:
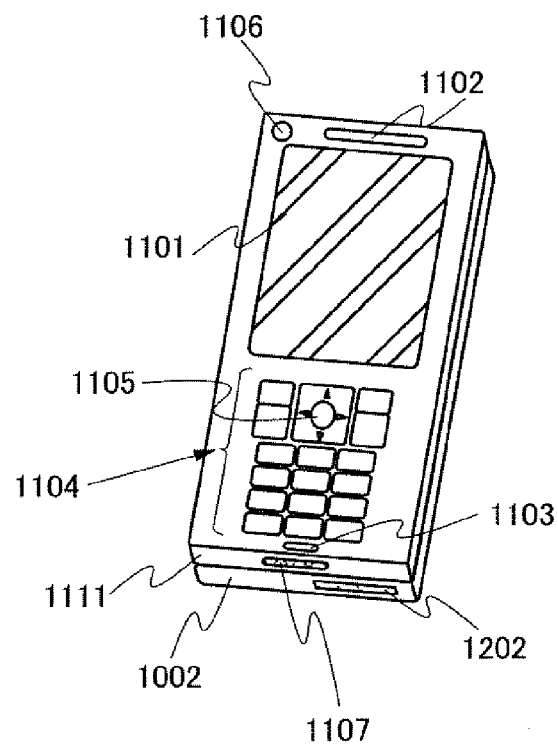
FIGS. 25A to 25C are drawings showing an example of an electronic device or the like to which a thin film transistor according to a mode of the present invention can be applied.
Figure 25B:
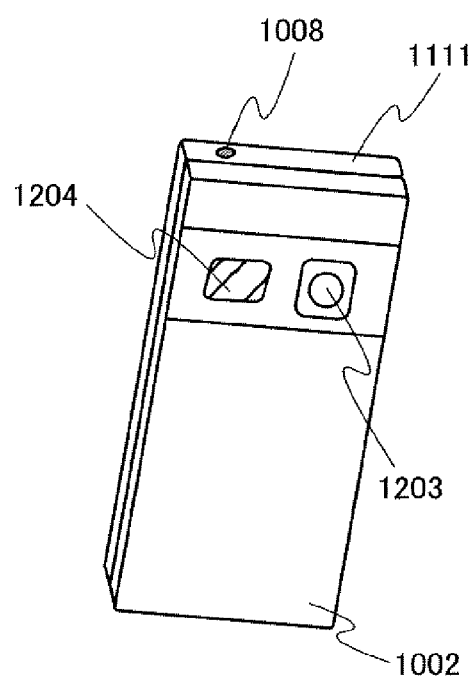
Figure 25C:
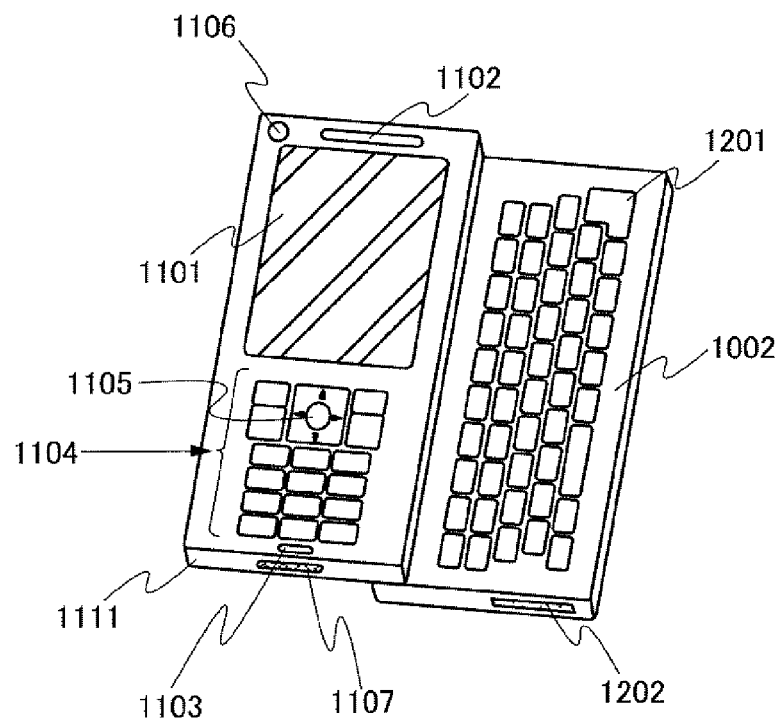

FIGS. 25A to 25C show an example of a structure of a mobile smartphone in which an element substrate including any of the thin film transistors presented in the preceding embodiment modes and a display device including the element substrate are applied to a display portion, for example. FIG. 25A is a front view, and FIG. 25B is a rear view, and FIG. 25C is a front view in which two chassis are slid out. The mobile smartphone has two chassis 1111 and 1002. The mobile smartphone has both functions of a mobile phone and of a portable information terminal, incorporates a computer, and enables various kinds of data processing in addition to telephone conversation; the mobile smartphone is also called a "smartphone."

The chassis 1111 is provided with a display portion 1101, a speaker 1102, a microphone 1103, operation keys 1104, a pointing device 1105, a front camera lens 1106, a jack 1107 for an external connection terminal, an earphone terminal 1108, and the like. The chassis 1002 is provided with a keyboard 1201, an external memory slot 1202, a rear camera 1203, a light 1204, and the like. In addition, an antenna is incorporated in the chassis 1111.

In addition to the above structure, the mobile smartphone may incorporate a non-contact IC chip, a small memory device, and the like.

The chassis 1111 and 1002 which overlap with each other (see FIG. 25A) are slid out as shown in FIG. 25C. A display device presented in any of the preceding embodiment modes can be incorporated in the display portion 1101, and a display direction changes depending on a use mode. Since the display portion 1101 and the front camera lens 1106 are provided on the same face, the mobile smartphone can be used as a videophone. Further, a still image and a moving image can be taken with the rear camera 1203 and the light 1204, with the display portion 1101 used as a viewfinder.

The speaker 1102 and the microphone 1103 can be used not only for telephone conversation, but also for videophone, recording, playback, and the like. With the use of the operation keys 1104, further, incoming and outgoing of calls, simple information input such as electronic mail, scrolling of a display screen, cursor movement, and the like is possible.

If much information is treated in documentation, a use as a portable information terminal, and the like, it is convenient to use the keyboard 1201. The chassis 1111 and 1002 which overlap with each other (see FIG. 25A) can be slid out as shown in FIG. 25C to use the mobile smartphone as a portable information terminal. A cursor can be moved smoothly with the use of the keyboard 1201 and the pointing device 1105. The jack 1107 for an external connection terminal can be connected to an AC adapter or a variety of cables such as a USB cable, and charging and data communication with a personal computer or the like is possible. Further, by inserting a recording medium in the external memory slot 1202, a larger amount of data can be stored and transferred.

The rear face of the chassis 1002 (see FIG. 25B) is provided with the rear camera 1203 and the light 1204, and a still image and a moving image can be taken with the display portion 1101 used as a viewfinder.

Further, the mobile smartphone may have an infrared communication function, a USB port, a function of receiving one segment television broadcast, a non-contact IC chip, an earphone jack, or the like, in addition to the above functions and structures.

By applying any of the display devices presented in the preceding embodiment modes, a smartphone with improved image quality can be provided.

This embodiment mode can be combined with another embodiment mode as appropriate.

Example 1

In this example, a process of forming a sample in which a gate insulating layer, a first semiconductor layer (first semiconductor film) including a plurality of crystalline regions, an insulating layer (insulating film), and a second semiconductor layer (second semiconductor film) having an amorphous structure are stacked, and measurement results of the formed sample are described below.

First, a method for forming a sample is described.

A gate insulating layer, a first semiconductor film, an insulating film, and a second semiconductor film were formed over a substrate in the same chamber (treatment chamber).

As the substrate, a glass substrate was used.

The substrate was taken into the treatment chamber of a plasma CVD apparatus, and a silicon oxynitride film with a thickness of 300 nm was formed as the gate insulating layer over the substrate. Here, the silicon oxynitride film was formed under the following conditions: the RF power source frequency was 13.56 MHz; the electric power of RF power source was 50 W; the temperature for film formation was 280° C.; the flow ratio of silane to dinitrogen monoxide was 1:40; the pressure was 40 Pa.

The substrate was taken out of the treatment chamber to a load lock chamber, and the inside of the treatment chamber was cleaned with fluorine radicals.

Subsequently, a protective film was formed on an inner wall of the treatment chamber. Here, an amorphous silicon film was formed as the protective film under the following conditions: the RF power source frequency was 13.56 MHz; the electric power of RF power source was 120 W; the temperature for film formation was 280° C.; the flow rate of silane was 300 sccm; the pressure was 160 Pa.

Then, the substrate was transferred from the load lock chamber into the treatment chamber.

Next, nitrogen introduction treatment was performed in the treatment chamber. As the nitrogen introduction treatment in the treatment chamber, NH$_3$ was supplied at a flow rate of 1000 sccm into the treatment chamber for 60 seconds, so that NH$_3$ was deposited on the inner wall of the treatment chamber. In this example, 100 vol. % NH$_3$ was used.

Next, as the first semiconductor film, a silicon film with a thickness of 50 nm was formed over the gate insulating layer. Here, a microcrystalline silicon film was formed under the following conditions: the RF power source frequency was 13.56 MHz; the electric power of RF power source was 60 W; the temperature for film formation was 280° C.; the flow ratio of silane to hydrogen was 1:150; the pressure was 280 Pa.

Subsequently, as the insulating film, a silicon oxide film was formed over the first semiconductor film. Here, the substrate was taken out of the plasma CVD apparatus to be exposed to the atmosphere, so that the silicon oxide film was formed as the insulating film.

After the inside of the treatment chamber was cleaned with fluorine radicals, the substrate was taken into the treatment chamber of the plasma CVD apparatus, and as the second semiconductor film, an amorphous silicon film with a thickness of 100 nm was formed over the insulating film formed over a surface of the first semiconductor film. Here, the amorphous silicon film was formed under the following conditions: the RF power source frequency was 13.56 MHz; the electric power of RF power source was 60 W; the temperature for film formation was 280° C.; the flow ratio of silane to hydrogen was 14:15; the pressure was 170 Pa.

After that, a conductive film was formed over the second semiconductor film in order to prevent the sample from being damaged in measurement with a scanning transmission electron microscope (STEM). Here, a carbon film was formed as the conductive film.

Figure 26:
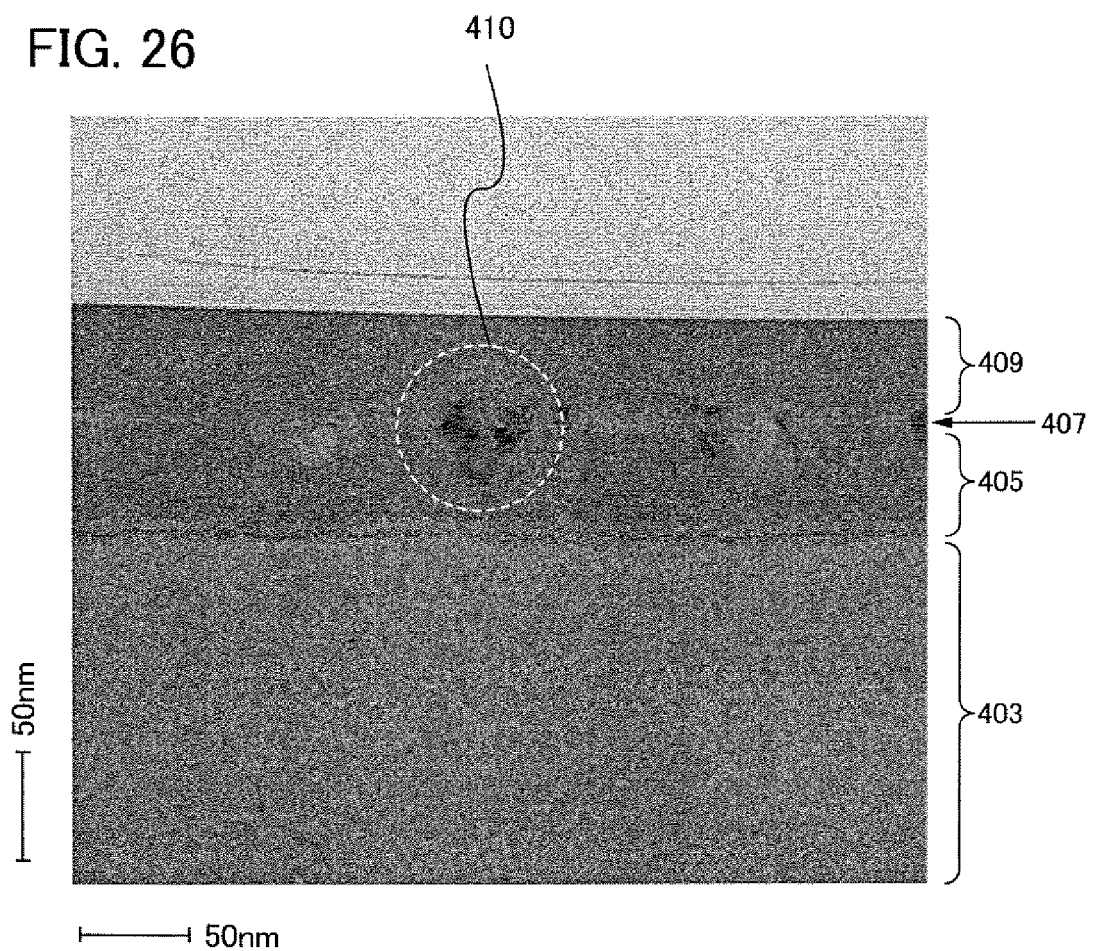
FIG. 26 is a STEM image showing a cross section of a sample obtained in Example 1.

A cross-section of the sample formed in the above manner was observed with the STEM. FIG. 26 is a STEM image of a cross section of the sample which was observed with the scanning transmission electron microscope.

A first semiconductor film 405 is formed over a gate insulating layer 403. As designated by a white line, an insulating film 407 is formed over a surface of the first semiconductor film 405. A second semiconductor film 409 is formed over the insulating film 407. Further, in the first semiconductor film 405, an inverted conical or inverted pyramidal silicon crystal grain having a vertex on the gate insulating layer 403 side has grown larger toward the second semiconductor film 409 in a region surrounded by a broken line 410.

Figure 27:
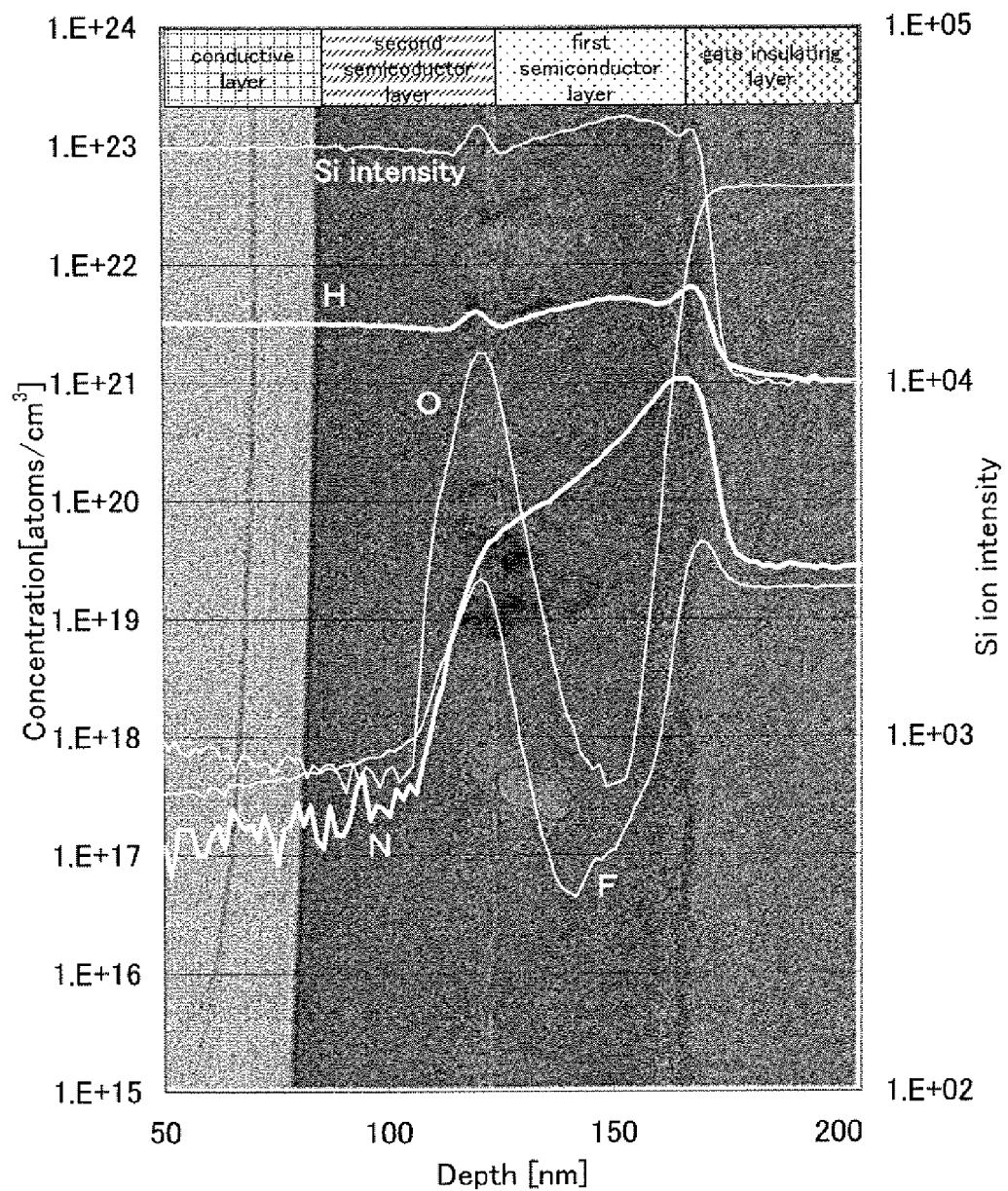
FIG. 27 includes a STEM image showing a cross section of a sample obtained in Example 1 and a graph showing concentrations of oxygen, nitrogen, silicon, hydrogen, and fluorine in the sample.

Further, the concentrations of oxygen, nitrogen, fluorine, silicon, and hydrogen in the above sample were measured with SIMS. FIG. 27 is a SIMS profile of the above sample which is superimposed on a STEM image of a cross-section of the above sample which was observed with the STEM. The conductive film is formed in a region of depths of 50 nm to 80 nm approximately. The second semiconductor film is formed in a region of depths of 80 nm to 120 nm approximately. The first semiconductor film is formed in a region of depths of 120 nm to 170 nm approximately. The gate insulating layer is formed in a region of depths of 170 nm to 200 nm approximately.

FIGS. 26 and 27 show a white line (a white film with an extremely small thickness) on the surface of the first semiconductor film 405 in the sample. Further, FIG. 27 shows that the oxygen concentration measured with the SIMS reaches a peak value at a region in which the white line is observed on the surface of the first semiconductor film and a portion around the region in the sample. The above result shows that the oxide film was formed as the insulating film on the surface of the first semiconductor film.

Furthermore, FIG. 27 shows that the semiconductor film which is present at 10 nm approximately in a growth direction from the gate insulating layer has a nitrogen concentration of $1 \times 10^{21}$/cm$^3$ or more. Still furthermore, an inverted conical or inverted pyramidal silicon crystal grain which has a vertex on the gate insulating layer side and has grown larger toward the second semiconductor film is observed from a region of the semiconductor layer which has nitrogen concentrations of $1 \times 10^{20}$/cm$^3$ to $1 \times 10^{21}$/cm$^3$ approximately. The above result demonstrates that a crystal nucleus can be generated by reducing the nitrogen concentration to a certain degree ($1 \times 10^{20}$/cm$^3$ to $1 \times 10^{21}$/cm$^3$ inclusive, preferably $2 \times 10^{20}$/cm$^3$ to $7 \times 10^{20}$/cm$^3$ inclusive).

Comparative Example 1

In this comparative example, a process of forming a sample in which a gate insulating layer, a first semiconductor film, and a second semiconductor film are stacked without forming an insulating film between the first semiconductor film and the second semiconductor film, which is a comparative example to Example 1, and measurement results of the formed sample are described below.

First, a method for forming the sample is described.

A gate insulating layer, a first semiconductor film (first semiconductor layer) including a plurality of crystalline regions, and a second semiconductor film (second semiconductor layer) having an amorphous structure are formed successively over a substrate in the same chamber.

As the substrate, a glass substrate was used.

As the gate insulating layer, a silicon nitride film and a silicon oxynitride film were formed. The substrate was taken into the chamber of the plasma CVD apparatus, and the silicon nitride film and the silicon oxynitride film with a total thickness of 110 nm was formed over the substrate. Here, the silicon nitride film was formed under the following conditions: the RF power source frequency was 27 MHz; the electric power of RF power source was 100 W; the temperature for film formation was 280° C.; the flow ratio of silane to ammonia and argon was 1:80:10; the pressure was 40 Pa. Then, the silicon oxynitride film was formed under the following conditions: the RF power source frequency was 27 MHz; the electric power of RF power source was 100 W; the temperature for film formation was 280° C.; the flow ratio of silane to dinitrogen monoxide was 1:125; the pressure was 40 Pa.

As the first semiconductor film, a silicon film with a thickness of 30 nm was formed. Here, a microcrystalline silicon film was formed under the following conditions: the RF power source frequency was 60 MHz; the electric power of RF power source was 15 W; the temperature for film formation was 280° C.; the flow ratio of silane to hydrogen was 1:50; the pressure was 100 Pa.

As the second semiconductor film, an amorphous silicon film was formed. Here, the amorphous silicon film was formed under the following conditions: the RF power source frequency was 13.56 MHz; the electric power of RF power source was 30 W; the temperature for film formation was 280° C.; the flow ratio of silane to hydrogen was 1:20; the pressure was 66.6 Pa.

Next, after a surface of the second semiconductor film was etched, a protective film was formed over the second semiconductor film.

Here, the surface of the second semiconductor film was dry-etched under the following conditions: the source power was 2000 W; the pressure was 0.67 Pa; chlorine was supplied at a flow rate of 100 sccm as an etching gas; the etching time was 30 seconds.

Next, a silicon nitride film with a thickness of 300 nm was formed as the protective film. Here, the silicon nitride film was formed under the following conditions: the RF power source frequency was 13.56 MHz; the electric power of RF power was 150 W; the temperature for film formation was 280° C.; the flow ratio of silane to ammonia, nitrogen, and hydrogen was 2:22:45:45; the pressure was 160 Pa.

Figure 28:
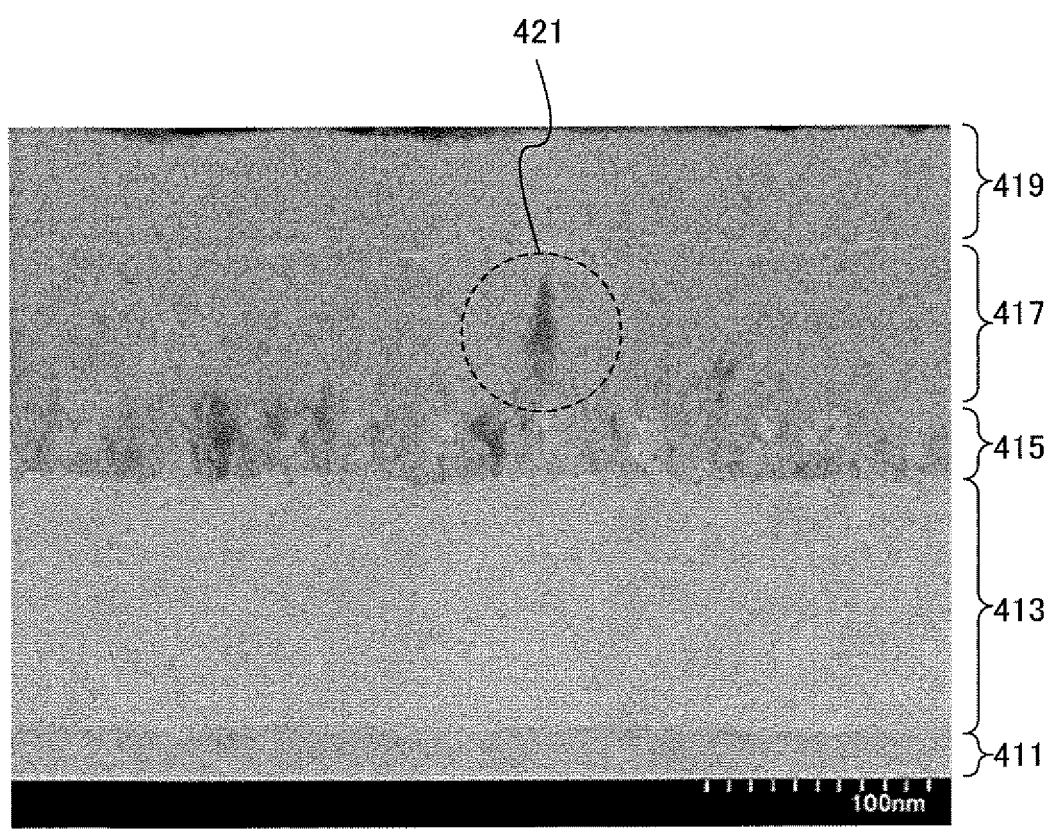
FIG. 28 is a STEM image showing a cross section of a sample obtained in Example 2.

FIG. 28 is a STEM image of a cross section of the sample which was formed in the above manner and observed with the STEM.

In FIG. 28, a silicon oxynitride film 413 of the gate insulating layer is formed over a silicon nitride film 411 of the gate insulating layer. Further, as a first semiconductor film 415, a silicon film is formed over the silicon oxynitride film 413. Furthermore, as a second semiconductor film 417, an amorphous silicon film is formed over the first semiconductor film 415. Still furthermore, as a protective film 419, a silicon nitride film is formed over the second semiconductor film 417.

Further, in the second semiconductor film 417, a crystal grain which has grown in a needle-like shape can be observed as designated by a broken line 421. Crystalline silicon grew in a needle-like shape with a crystalline region in the first semiconductor film 415 used as a crystal nucleus, to be the crystal grain in forming the amorphous silicon film.

The above result shows that a crystal grain can be formed in the second semiconductor layer formed with an amorphous silicon film unless an insulating layer is formed at the interface between the first semiconductor film 415 and the second semiconductor film 417.

Example 2

In this example, results of studying an effect of water plasma treatment are described below. In water plasma treatment, H atoms and OH groups are mainly generated. Therefore, we studied the action of an H atom and an OH group on dangling bonds (defect) of Si atoms (silicon atoms).

Figure 29A:
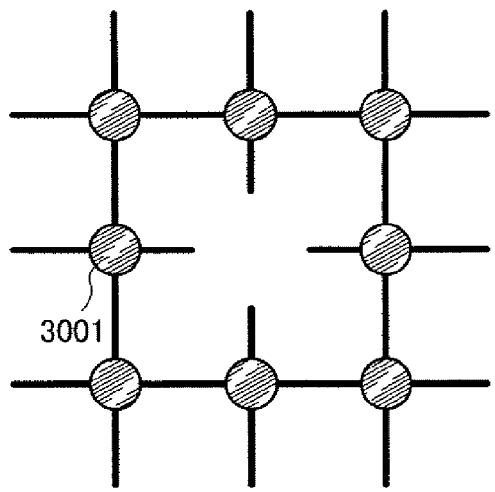
FIGS. 29A to 29C are model diagrams for studying an effect of water plasma.
Figure 29B:
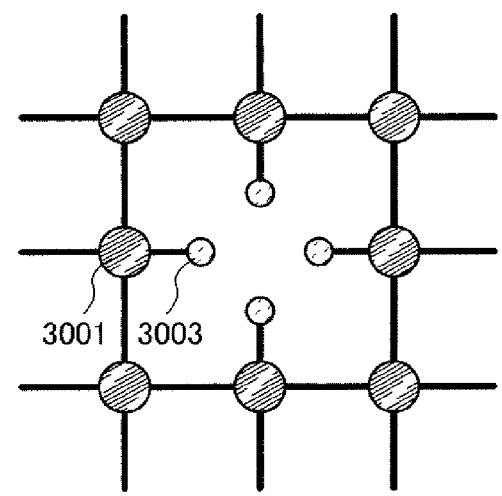
Figure 29C:
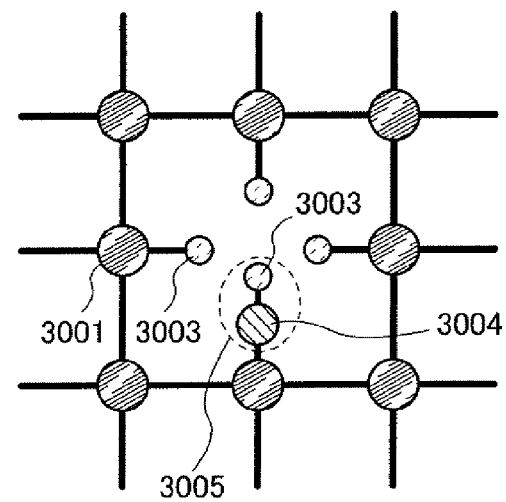

First, FIGS. 29A to 29C show models which were used for studying an effect of water plasma treatment. Model 1 shown in FIG. 29A, Model 2 shown in FIG. 29B, and Model 3 shown in FIG. 29C each schematically show a silicon lattice structure which includes 64 Si atoms as a repeating unit and lacks one Si atom.

Specifically, Model 1 of FIG. 29A has a silicon lattice structure which lacks one Si atom, thereby forming dangling bonds. Model 2 of FIG. 29B has a silicon lattice structure which lacks one Si atom, thereby forming dangling bonds, and in which the dangling bonds are terminated by four H atoms. Model 3 of FIG. 29C has a silicon lattice structure which lacks one Si atom, thereby forming dangling bonds, and in which the dangling bonds are terminated by one OH group and three H atoms. In FIGS. 29A to 29C, Si atoms 3001, H atoms 3003, and an OH group 3005 (including an O atom 3004 and an H atom 3003) are shown, and solid lines indicate bonds.

We studied an effect by the first principles calculation. In the calculation, we used CASTEP (first principles calculation software which employs the density functional theory) manufactured by Accelrys Software Inc.

Figure 30:
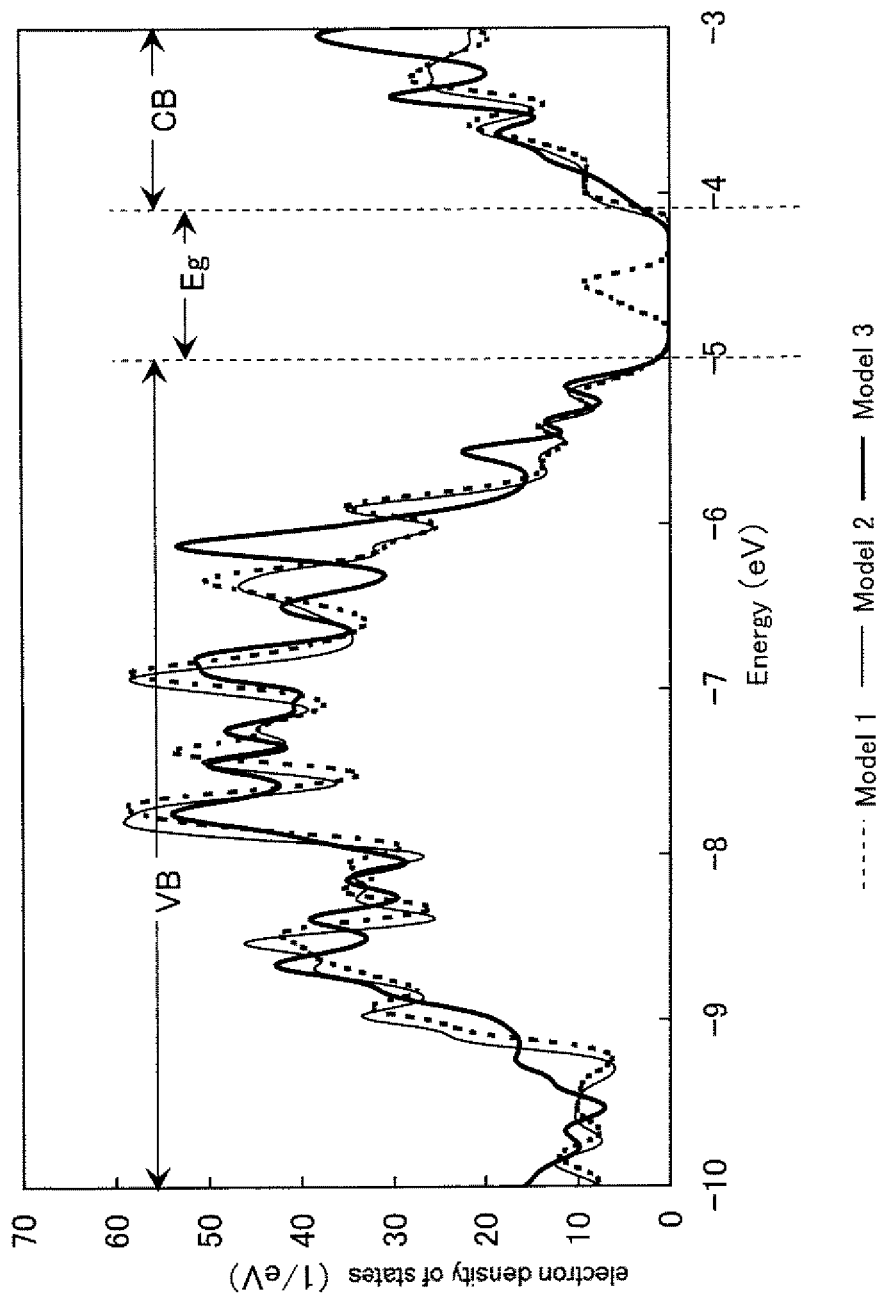
FIG. 30 is a graph showing results of calculation for studying an effect of water plasma.

FIG. 30 shows calculation results of Models 1 to Models 3 of FIGS. 29A to 29C by the first principles calculation. The horizontal axis in FIG. 30 indicates electron energy where the point of origin is set at a vacuum level, and the vertical axis indicates electron density of states. Further, a broken line, a thin solid line, and a heavy solid line show calculation results of Model 1, Model 2, and Model 3, respectively.

A range of −5.0 eV or less in electron energy shows a valence band (indicated by "VB" in FIG. 30), and that of −4.1 eV or more in electron energy shows a conduction band (indicated by "CB" in FIG. 30). Further, a range of more than −5.0 eV and less than −4.1 eV in electron energy shows a band gap (indicated by "Eg" in FIG. 30). In the calculation results shown in FIG. 30, the band gap is 0.9 eV, which is smaller than the experimental result, 1.2 eV. However, it is common that a band gap results in a smaller value than is actual in the density functional theory; therefore, these results do not mean inappropriateness in the calculation of this time.

The calculation results show that Model 1 (in which dangling bonds are not terminated) has electron density of states available to be occupied in the band gap. This is a defect level which is due to the dangling bonds.

On the other hand, in Model 2 (in which dangling bonds are terminated by H atoms) and Model 3 (in which dangling bonds are terminated by one OH group and three H atoms), electron densities of states are 0 in the band gap, which shows that there are not any defect levels. These results show that defect levels can be reduced in a silicon film by exposing the silicon film having defects to H atoms or OH groups to terminate dangling bonds by H atoms or OH groups. That is, water plasma treatment can compensate for defects in a silicon film. Therefore, for example, when the insulating film 105 is formed over the first semiconductor film 103 as shown in FIG. 2D, the first semiconductor film 103 undergoes water plasma treatment to form the insulating film 105, thereby compensating for defects in the first semiconductor film 103.

Figure 31A:
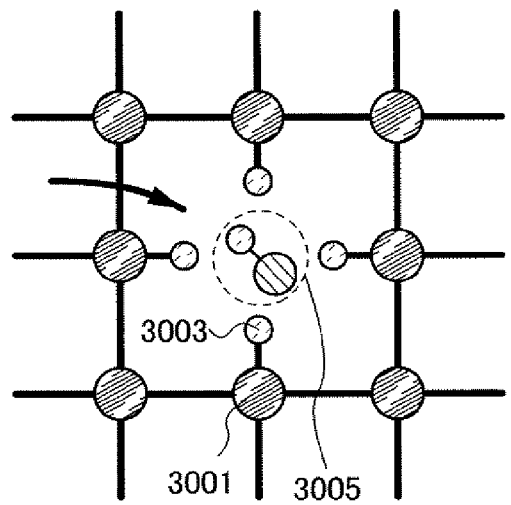
FIGS. 31A to 31D are model diagrams for studying an effect of water plasma.
Figure 31B:
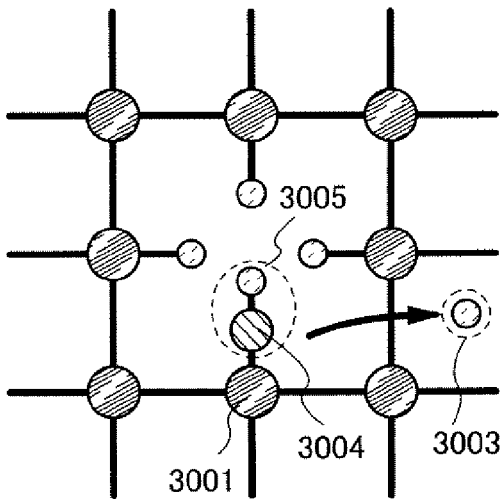

Next, we studied effects of water plasma treatment and hydrogen plasma treatment. FIGS. 31A and 31B are model diagrams which schematically show a lattice structure of a silicon film, and FIGS. 31C and 31D show model diagrams which schematically show bonding in the silicon film.

Figure 31C:
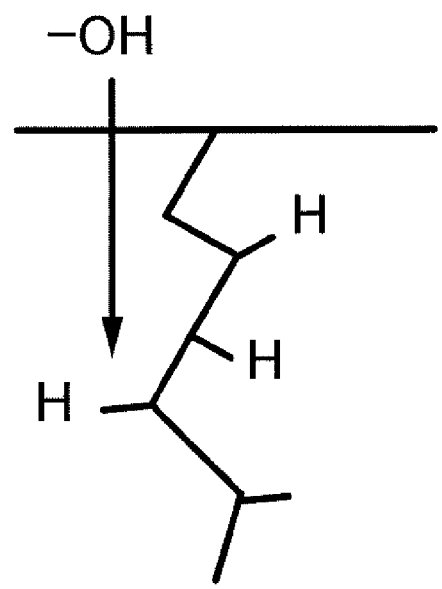
Figure 31D:
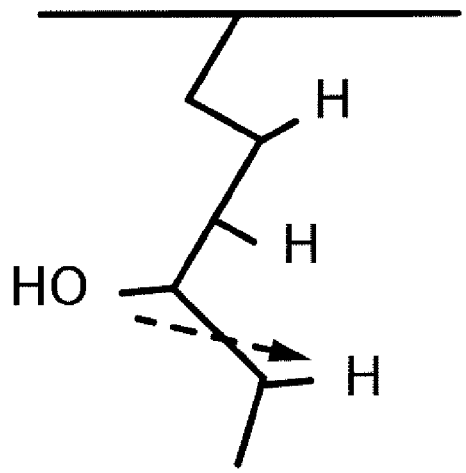

When the OH group 3005 comes near the H atom 3003 bonded with the Si atom 3001 as shown in FIGS. 31A and 31C, the OH group 3005 is bonded to the Si atom 3001, and the H atom 3003 is dissociated from the Si atom 3001. On the other hand, the dissociated H atom 3003 moves in the silicon film as shown in FIGS. 31B and 31D. Here, the bond energy of an Si atom and an OH group is 3.03 eV, and that of an Si atom and an H atom is 1.94 eV. Therefore, a bond of an Si atom and an OH group is more stable than that of an Si atom and an H atom. This study shows that an OH group is more likely to terminate a dangling bond in a silicon film than an H atom.

Further, as described with reference to FIGS. 29A to 29C and FIG. 30, both an H atom and an OH group reduce defect levels in a silicon film. However, since a bond of an Si atom and an H atom has lower bond energy than that of an Si atom and an OH group, an Si atom and an H atom are dissociated easily; thus, defect levels are easily generated again. On the other hand, since a bond of an Si atom and an OH group has higher bond energy than that of an Si atom and an H atom, an Si atom and an OH group are less apt to be dissociated; thus, defect levels are less apt to be generated.

The above study enables us to suppose that exposure of a silicon film having defects to OH groups can reduce (compensate for) the defects in the silicon film, and that water plasma treatment, in which OH groups are generated, can effectively compensate for the defects in the silicon film.

This application is based on Japanese Patent Application serial No. 2008-109629 filed with Japan Patent Office on Apr. 18, 2008, the entire contents of which are hereby incorporated by reference.

What is claimed is:

1. A thin film transistor comprising:
   a gate electrode over a substrate having an insulating surface;
   a gate insulating layer over the gate electrode;
   a first semiconductor layer comprising a plurality of crystalline regions on and in contact with the gate insulating film;
   an insulating film covering the first semiconductor layer;
   a second semiconductor layer comprising an amorphous structure on the insulating film; and
   impurity semiconductor layers of one conductivity type, the impurity semiconductor layers forming a source region and a drain region.

2. The thin film transistor according to claim 1, wherein in a region which does not reach the impurity semiconductor layers of one conductivity type, the first semiconductor layer includes an inverted conical or inverted pyramidal crystal having grown from a position apart from an interface between the gate insulating layer and the first semiconductor layer in a direction in which the first semiconductor layer is deposited.

3. The thin film transistor according to claim 1, wherein an oxygen concentration and a nitrogen concentration in the first semiconductor layer which are measured by secondary ion mass spectrometry are $5\times10^{18}/cm^3$ or less, and $1\times10^{20}/cm^3$ to $1\times10^{21}/cm^3$ inclusive, respectively.

4. The thin film transistor according to claim 3, wherein a peak of the nitrogen concentration which is measured by secondary ion mass spectrometry is $3\times10^{20}/cm^3$ to $1\times10^{21}/cm^3$ inclusive at the interface between the gate insulating layer and the first semiconductor layer or a portion near the interface, and the nitrogen concentration decreases from the interface or the portion near the interface in a thickness direction of the first semiconductor layer.

5. The thin film transistor according to claim 2, wherein in the first semiconductor layer, a point from which the inverted conical or inverted pyramidal crystal starts to grow is located in a region in which the nitrogen concentration measured by secondary ion mass spectrometry is higher than or equal to $1\times10^{20}/cm^3$ and less than $3\times10^{20}/cm^3$.

6. The thin film transistor according to claim 1, wherein the crystalline regions comprise single crystals.

7. The thin film transistor according to claim 6, wherein the single crystals comprise twin crystals.

8. A thin film transistor comprising:
   a gate electrode over a substrate having an insulating surface;
   a gate insulating layer over the gate electrode;
   a first semiconductor layer comprising a plurality of crystalline regions on and in contact with the gate insulating film;
   an insulating film covering the first semiconductor layer;
   a second semiconductor layer comprising an amorphous structure on the insulating film; and
   impurity semiconductor layers of one conductivity type, the impurity semiconductor layers forming a source region and a drain region,
   wherein the insulating layer is a monatomic layer.

9. The thin film transistor according to claim 8, wherein in a region which does not reach the impurity semiconductor layers of one conductivity type, the first semiconductor layer includes an inverted conical or inverted pyramidal crystal having grown from a position apart from an interface between the gate insulating layer and the first semiconductor layer in a direction in which the first semiconductor layer is deposited.

10. The thin film transistor according to claim 8, wherein an oxygen concentration and a nitrogen concentration in the first semiconductor layer which are measured by secondary ion mass spectrometry are $5\times10^{18}/cm^3$ or less, and $1\times10^{20}/cm^3$ to $1\times10^{21}/cm^3$ inclusive, respectively.

11. The thin film transistor according to claim 10, wherein a peak of the nitrogen concentration which is measured by secondary ion mass spectrometry is $3\times10^{20}/cm^3$ to $1\times10^{21}/cm^3$ inclusive at the interface between the gate insulating layer and the first semiconductor layer or a portion near the interface, and the nitrogen concentration decreases from the interface or the portion near the interface in a thickness direction of the first semiconductor layer.

12. The thin film transistor according to claim 9, wherein in the first semiconductor layer, a point from which the inverted conical or inverted pyramidal crystal starts to grow is located in a region in which the nitrogen concentration measured by secondary ion mass spectrometry is higher than or equal to $1\times10^{20}/cm^3$ and less than $3\times10^{20}/cm^3$.

13. The thin film transistor according to claim 8, wherein the crystalline regions comprise single crystals.

14. The thin film transistor according to claim 13, wherein the single crystals comprise twin crystals.

* * * * *